(12) United States Patent
Ina et al.

(10) Patent No.: US 11,762,110 B2
(45) Date of Patent: Sep. 19, 2023

(54) RADIATION DETECTOR AND METHOD FOR MANUFACTURING RADIATION DETECTOR

(71) Applicant: HAMAMATSU PHOTONICS K.K., Hamamatsu (JP)

(72) Inventors: Masami Ina, Hamamatsu (JP); Syouji Kurebayashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/787,673

(22) PCT Filed: Oct. 12, 2020

(86) PCT No.: PCT/JP2020/038533
§ 371 (c)(1),
(2) Date: Jun. 21, 2022

(87) PCT Pub. No.: WO2021/131239
PCT Pub. Date: Jul. 1, 2021

(65) Prior Publication Data
US 2023/0011816 A1   Jan. 12, 2023

(30) Foreign Application Priority Data
Dec. 25, 2019   (JP) ................. 2019-234435

(51) Int. Cl.
*G01T 1/20* (2006.01)
*H01L 27/146* (2006.01)

(52) U.S. Cl.
CPC .... *G01T 1/20188* (2020.05); *H01L 27/14636* (2013.01); *H01L 27/14663* (2013.01); *H01L 27/14683* (2013.01)

(58) Field of Classification Search
CPC ... G01T 1/20188; G01T 1/2018; G01T 1/202; G01T 1/20181; G01T 1/2002;
(Continued)

(56) References Cited

U.S. PATENT DOCUMENTS

2007/0257198 A1* 11/2007 Ogawa ............... G01T 1/202
250/370.11
2012/0288688 A1   11/2012 Kug et al.
(Continued)

FOREIGN PATENT DOCUMENTS

JP          3077941 B2     8/2000
JP       2015-096823 A     5/2015
(Continued)

OTHER PUBLICATIONS

International Preliminary Report on Patentability dated Jul. 7, 2022 for PCT/JP2020/038533.

*Primary Examiner* — Kiho Kim
(74) *Attorney, Agent, or Firm* — Faegre Drinker Biddle & Reath LLP

(57) ABSTRACT

A radiation detector includes a photoelectric conversion element array, a scintillator layer converting radiation into light, a resin frame formed on the photoelectric conversion element array, and a protective film covering the scintillator layer. The resin frame has a groove continuous with an outer edge of the protective film. The groove has an overlapping region including a first groove end portion and a second groove end portion partially overlapping in a direction intersecting with an extension direction of the groove.

15 Claims, 33 Drawing Sheets

(58) Field of Classification Search
CPC ......... H01L 27/14636; H01L 27/14663; H01L 27/14683
See application file for complete search history.

(56) References Cited

U.S. PATENT DOCUMENTS

| | | |
|---|---|---|
| 2016/0245931 A1 | 8/2016 | Kurebayashi |
| 2018/0267178 A1 | 9/2018 | Kurebayashi |
| 2018/0267179 A1 | 9/2018 | Kurebayashi |
| 2020/0142082 A1 | 5/2020 | Kurebayashi |

FOREIGN PATENT DOCUMENTS

| | | |
|---|---|---|
| JP | 2016-205916 A | 12/2016 |
| JP | 2018-084589 A | 5/2018 |
| KR | 10-2011-0113482 A | 10/2011 |
| WO | WO-98/036291 A1 | 8/1998 |

\* cited by examiner

Fig.7
(a)
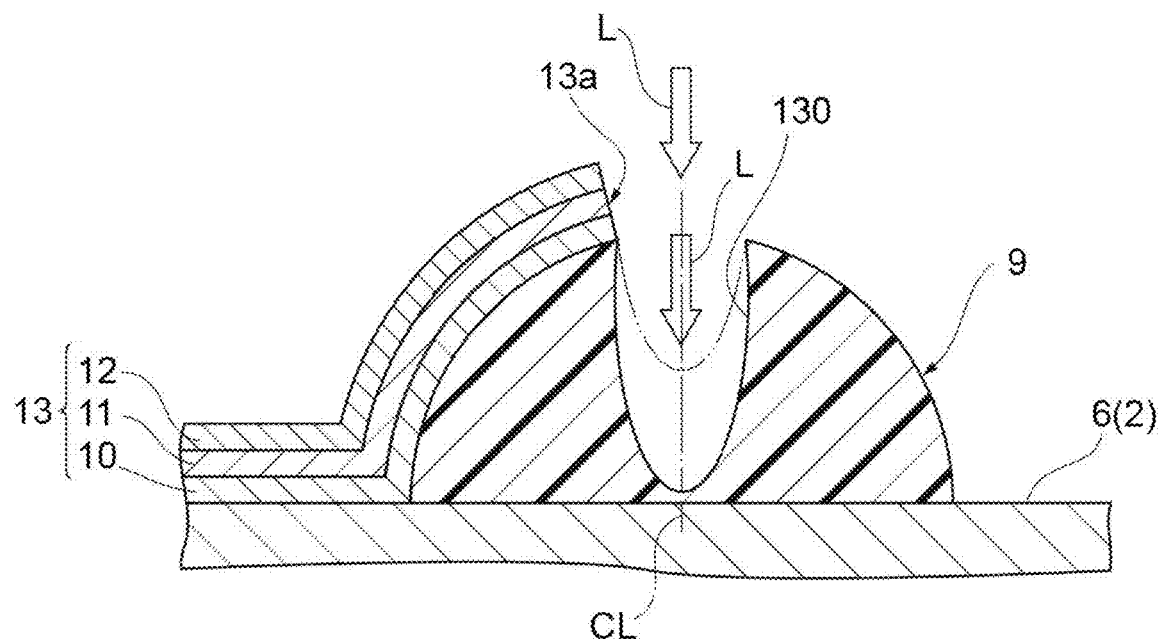
(b)
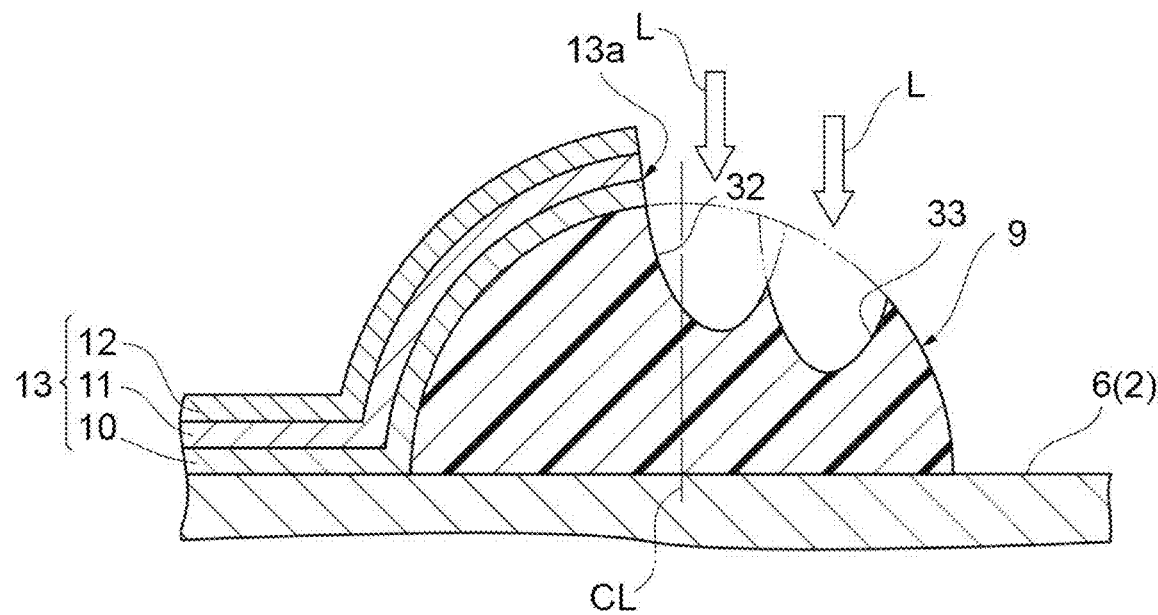

Fig. 13
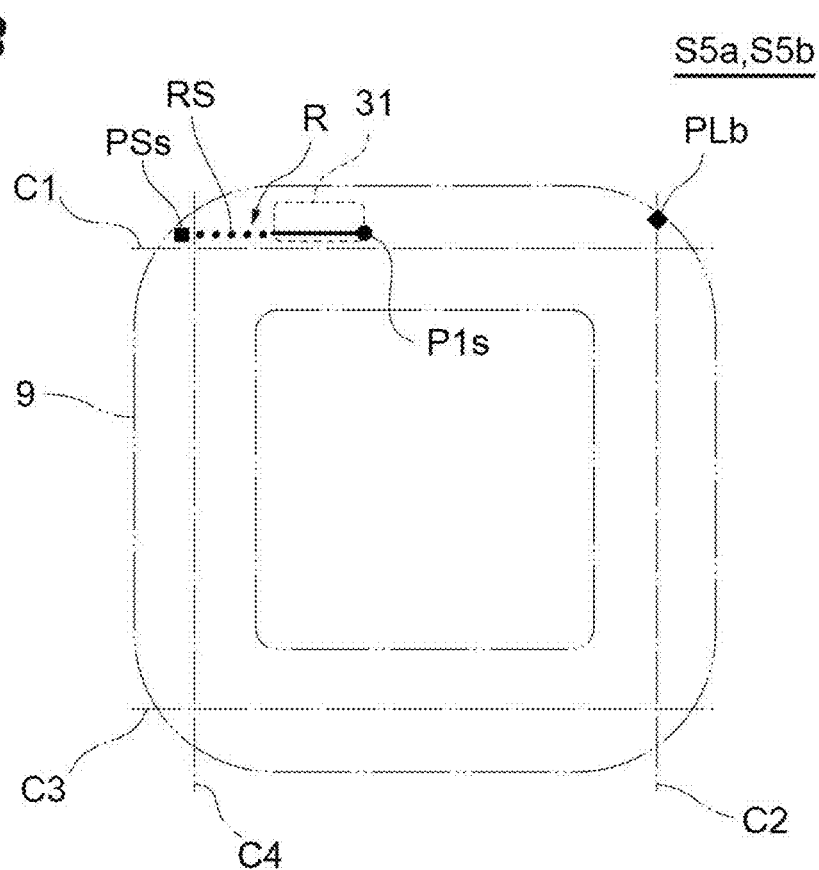
(a)
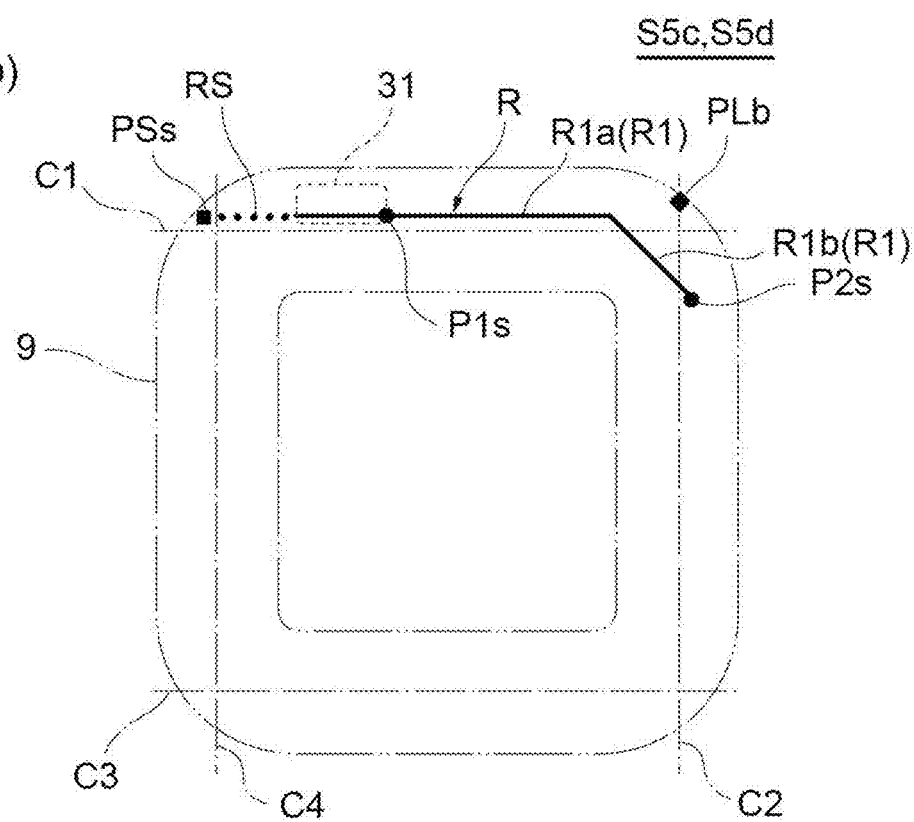
(b)

Fig.14
(a)
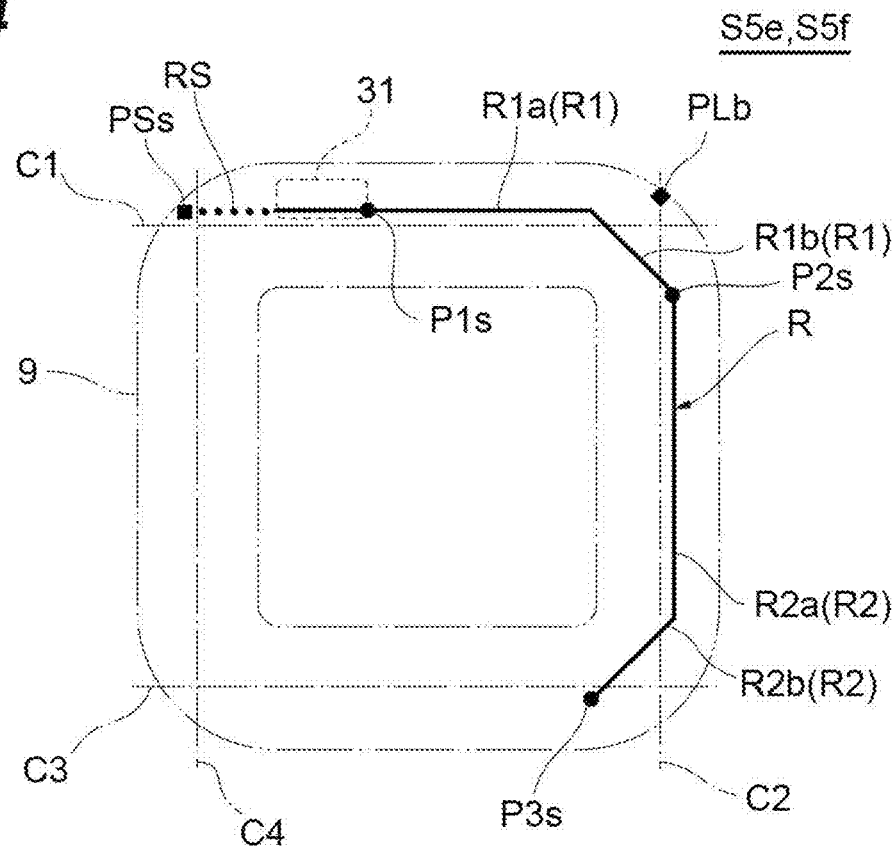
(b)
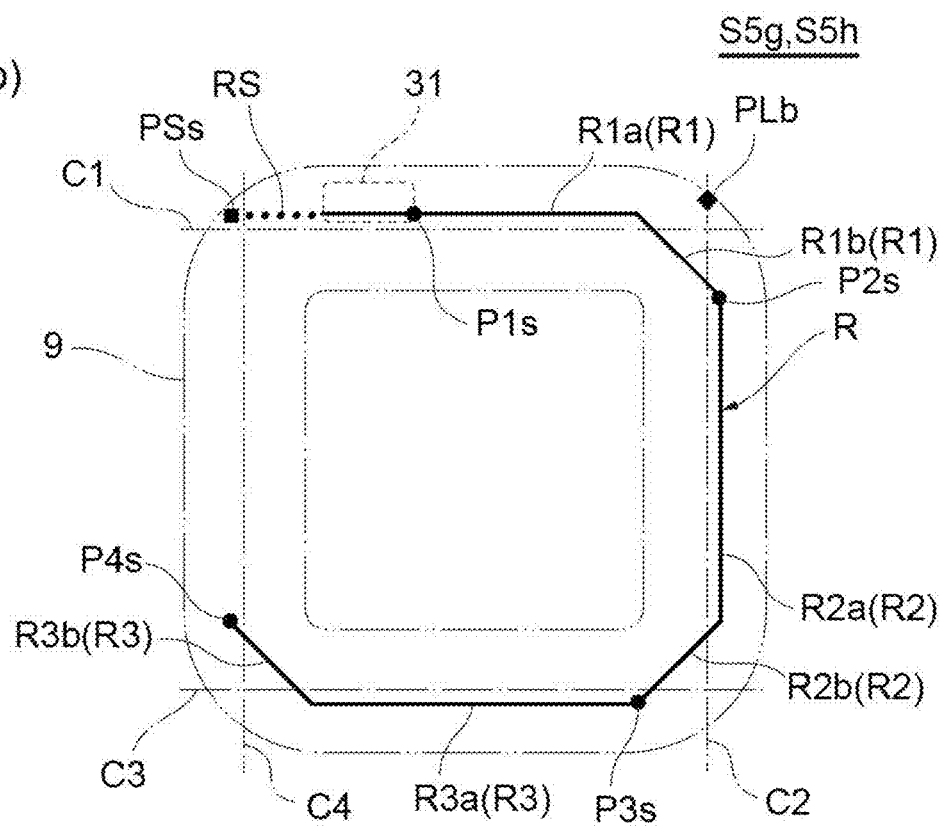

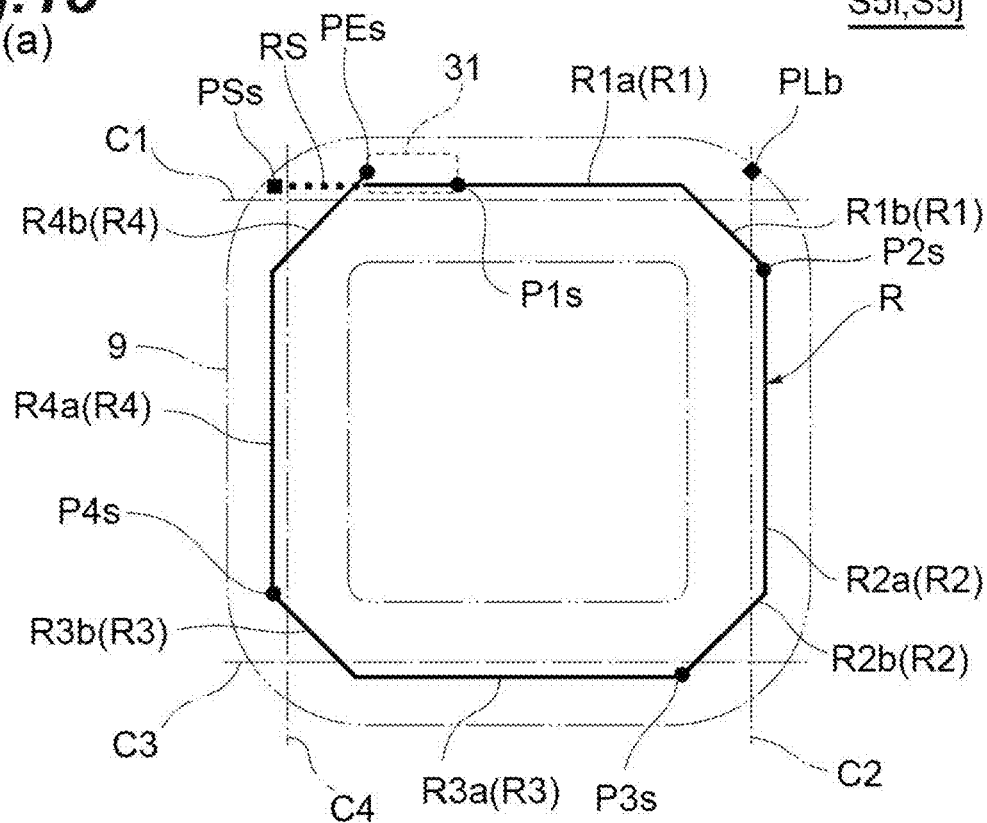
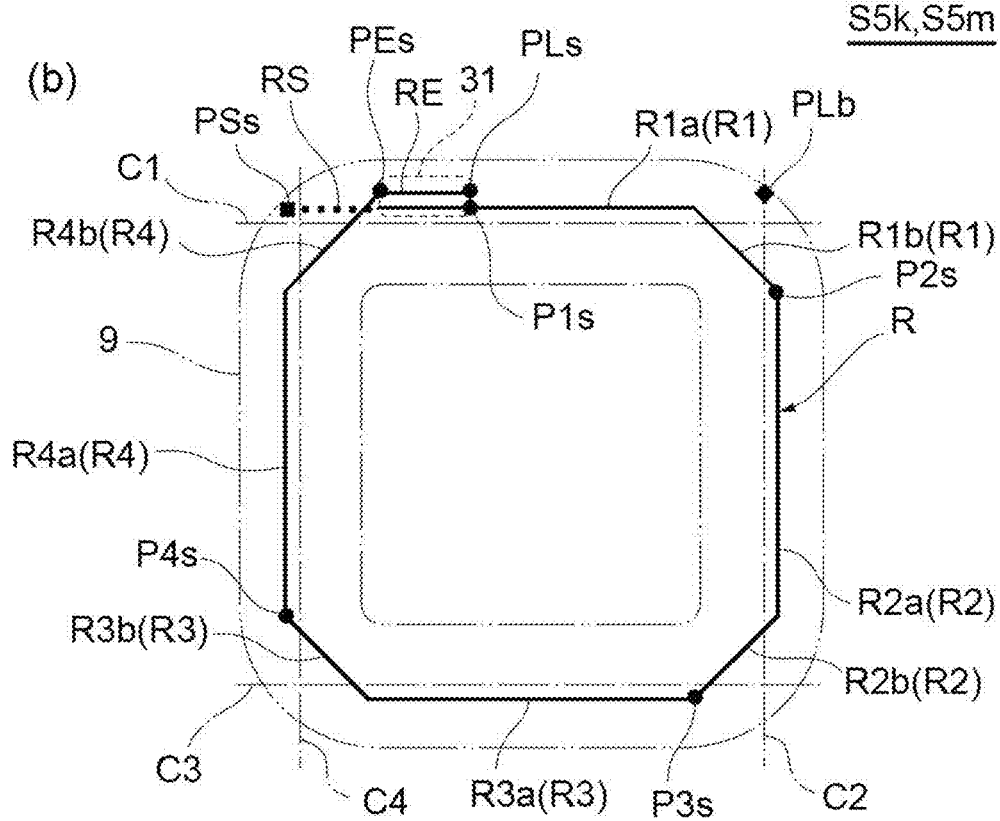
Fig.15

Fig.18
(a)
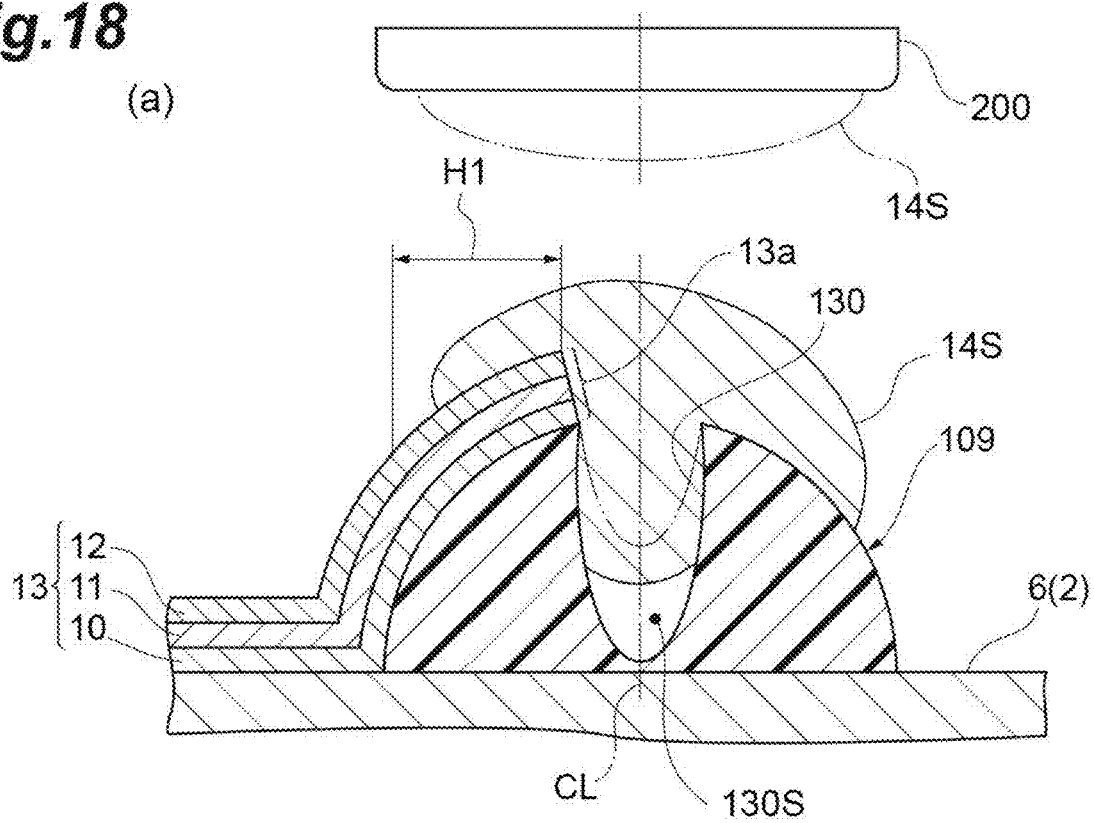
(b)
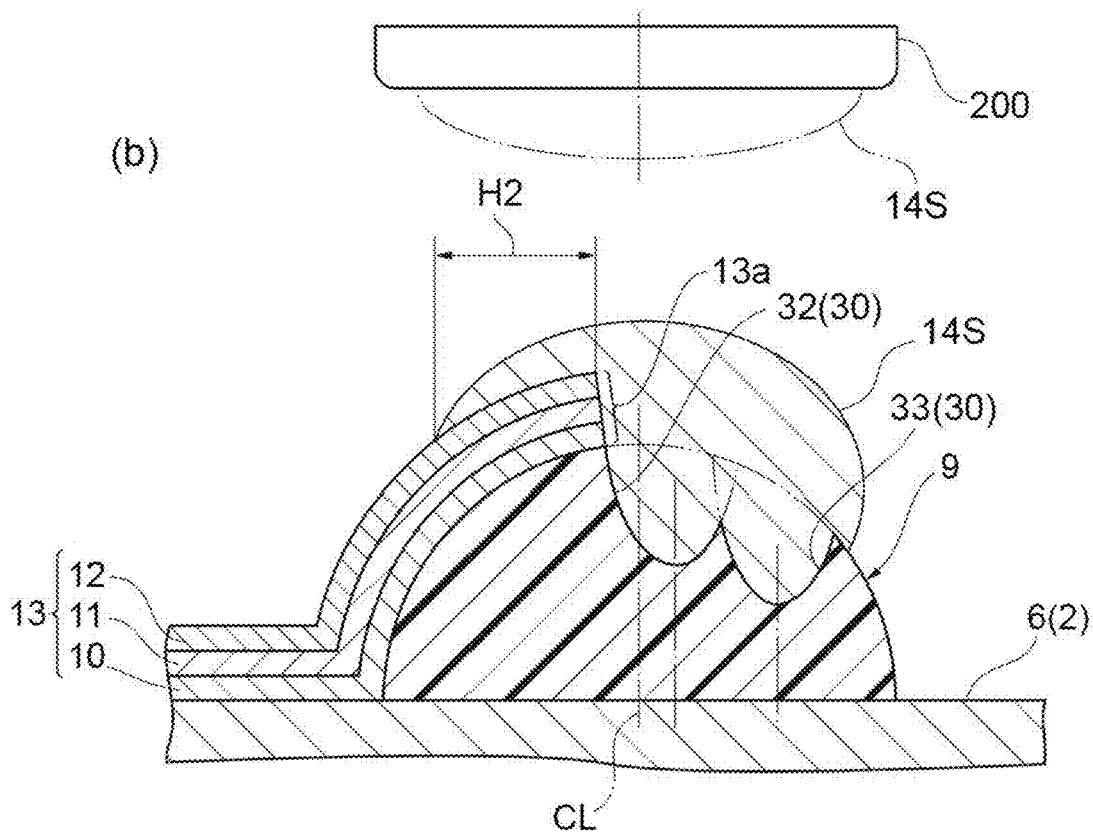

*Fig.30*
(a)
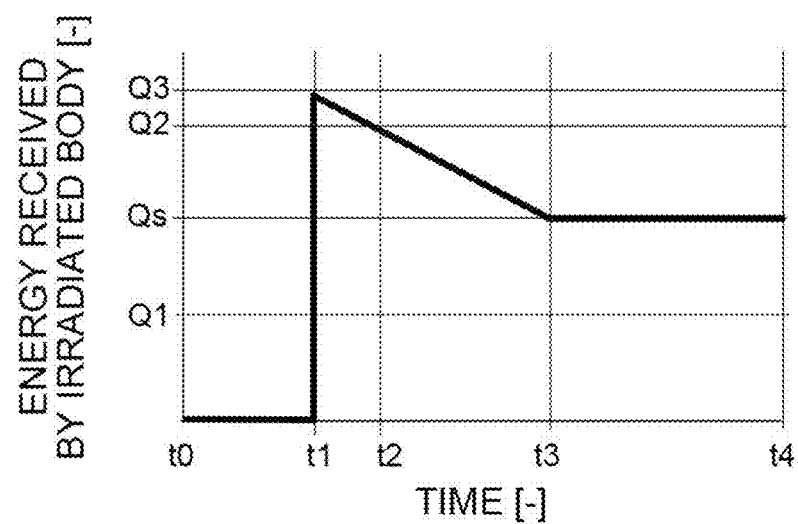
(b)
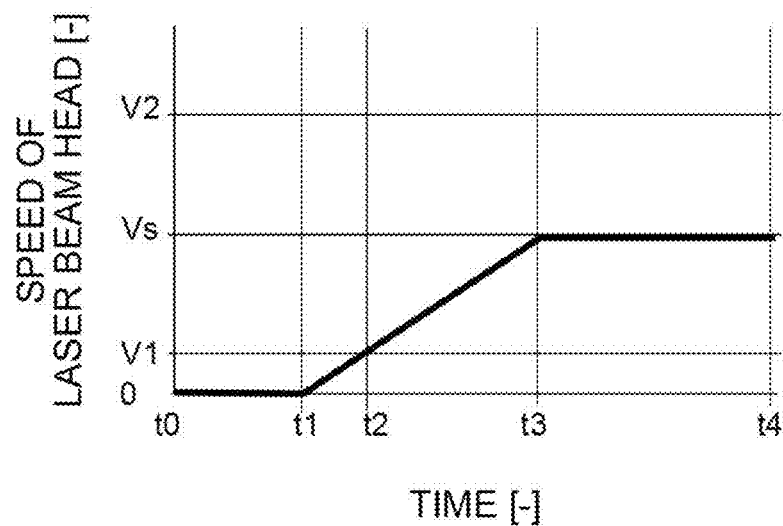

Fig.32
(a)
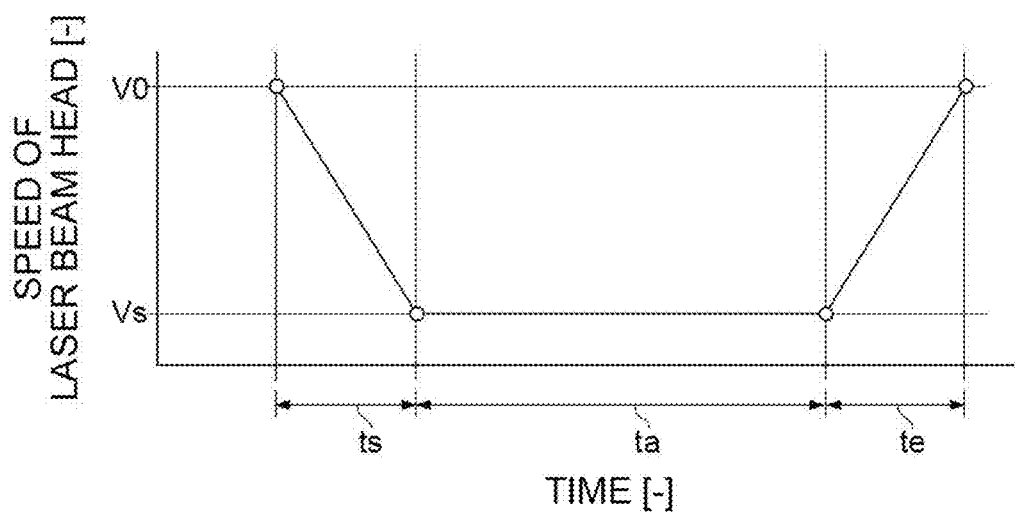
(b)
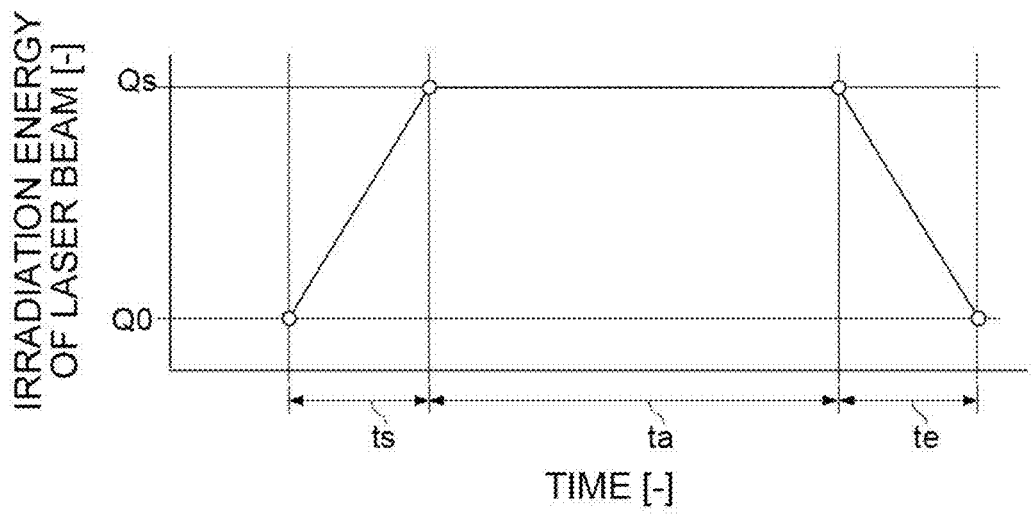
(c)
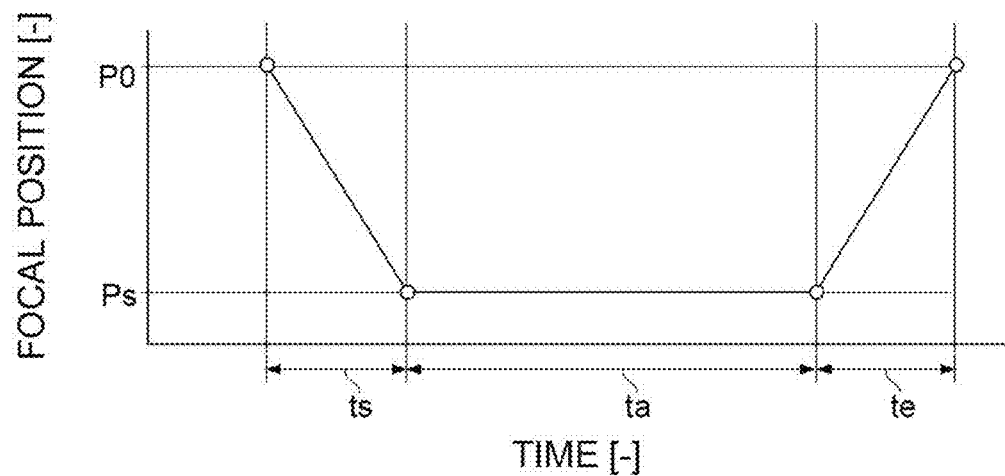

RADIATION DETECTOR AND METHOD FOR MANUFACTURING RADIATION DETECTOR

TECHNICAL FIELD

The present invention relates to a radiation detector and a method for manufacturing a radiation detector.

BACKGROUND ART

Radiation detectors are disclosed in Patent Literature 1, Patent Literature 2, and Patent Literature 3. Each of the radiation detectors disclosed in Patent Literature 1, Patent Literature 2, and Patent Literature 3 has a scintillator layer converting radiation into light and a photodetection panel detecting light. The photodetector panel has a light receiving portion where a plurality of light receiving elements are disposed and a plurality of bonding pads provided around the light receiving portion and electrically connected to the light receiving portion. A resin frame surrounding the light receiving portion is formed between the light receiving portion and the bonding pad. The scintillator layer is covered with a moisture-resistant protective film.

CITATION LIST

Patent Literature

Patent Literature 1: Japanese Unexamined Patent Publication No. 2015-96823
Patent Literature 2: Japanese Unexamined Patent Publication No. 2016-205916
Patent Literature 3: U.S. Patent No. 2012/0288688

SUMMARY OF INVENTION

Technical Problem

In the method for manufacturing the radiation detectors disclosed in Patent Literature 1 and Patent Literature 2, the resin frame is formed after the scintillator layer is formed on the photodetection panel. The protective film is formed next. The protective film is formed on the scintillator layer and the bonding pad. The protective film may cover the scintillator layer. In this regard, the protective film covering the bonding pad is removed in part. Specifically, the protective film on the resin frame is cut by irradiation with a laser beam so that the protective film is cut.

When the protective film is irradiated with the laser beam, the energy of the laser beam needs to be equal to or higher than a threshold so that the protective film is cut in a reliable manner. If the energy of the laser beam is too strong, the laser beam may cut the protective film and the resin frame and this cutting may result in damage to the photodetection panel. Further, even when the laser beam does not reach the photodetection panel, an unintended problem may arise when a deep groove is formed in the resin frame. In addition, the heights of the protective film and the resin frame are not always constant. Accordingly, the above problem may arise even assuming that the energy of the laser beam is kept constant.

In other words, a radiation detector incapable of satisfying a predetermined performance may be manufactured even when laser beam irradiation conditions are kept constant. Accordingly, in the technical field of radiation detectors, a technique has been desired with which productivity can be improved by a decrease in defective product occurrence during radiation detector manufacturing.

In this regard, an object of the present invention is to provide a radiation detector and a radiation detector manufacturing method enabling productivity improvement.

Solution to Problem

A radiation detector according to one embodiment of the present invention includes: a photodetection panel having a light receiving portion including a plurality of photoelectric conversion elements arranged one-dimensionally or two-dimensionally and a plurality of bonding pads electrically connected to the photoelectric conversion elements and disposed outside the light receiving portion; a scintillator layer laminated on the photodetection panel so as to cover the light receiving portion and converting radiation into light; a resin frame formed on the photodetection panel so as to pass between the scintillator layer and the bonding pad and surround the scintillator layer apart from the scintillator layer and the bonding pad when viewed in a lamination direction of the scintillator layer; and a scintillator protective film covering the scintillator layer and having an outer edge positioned on the resin frame. A groove continuous with the outer edge of the scintillator protective film is formed in the resin frame. The groove has an overlapping region including a first groove end portion and a second groove end portion partially overlapping in a direction intersecting with an extension direction of the groove.

The groove of the resin frame of the radiation detector is continuous with the outer edge of the scintillator protective film. In addition, the outer edge of the scintillator protective film is formed by laser beam irradiation. The groove of the resin frame is formed as this outer edge is formed. When the groove is formed in the resin frame, the scintillator protective film formed on the resin frame is cut in a reliable manner. The groove includes the overlapping region including the first groove end portion and the second groove end portion. By the first groove end portion and the second groove end portion overlapping in part, the depth of the groove does not excessively increase in the overlapping region. As a result, it is possible to prevent a laser beam from reaching not only the scintillator protective film but also the resin frame. In other words, the scintillator protective film can be cut in a reliable manner. Further, the surface of the photodetection panel provided with the resin frame does not undergo damage attributable to laser beam irradiation. Accordingly, the occurrence of a defective product is suppressed. As a result, productivity can be improved.

The radiation detector according to one embodiment may further include a coating resin covering the outer edge of the scintillator protective film. According to this configuration, the occurrence of peeling of the scintillator protective film can be suppressed.

In the radiation detector according to one embodiment, the coating resin may further cover the resin frame. The coating resin may have a material property allowing the coating resin to stay on the resin frame such that an edge portion of a contact surface between the coating resin and the resin frame is formed on the resin frame. According to this configuration, the coating resin reaches neither the surface of the photodetection panel positioned outside the resin frame nor the bonding pad. Accordingly, each of the surface of the photodetection panel and the bonding pad can be kept clean.

In the radiation detector according to one embodiment, a middle portion of the resin frame may be higher than both edge portions of the resin frame. A position of the groove may be biased to the bonding pad side on the resin frame. According to this configuration, the coating resin is capable of covering the outer edge of the scintillator protective film in a reliable manner.

In the radiation detector according to one embodiment, a width of the resin frame may be 700 μm or more and 1000 μm or less. According to this configuration, the radiation detector can be reduced in size.

In the radiation detector according to one embodiment, a height of the resin frame may be 100 μm or more and 300 μm or less. According to this configuration, the radiation detector can be reduced in size.

In the radiation detector according to one embodiment, the photodetection panel may have a rectangular shape. The resin frame may have four side portions surrounding the scintillator layer. The overlapping region may be provided in any of the four side portions. According to this configuration, the occurrence of peeling of the scintillator protective film can be further suppressed.

A radiation detector manufacturing method according to another embodiment of the present invention includes: a step of preparing a photodetection panel having a light receiving portion including a plurality of photoelectric conversion elements arranged one-dimensionally or two-dimensionally and a plurality of bonding pads electrically connected to the photoelectric conversion elements and disposed outside the light receiving portion and laminating a scintillator layer converting radiation into light on the photodetection panel so as to cover the light receiving portion; a step of disposing a panel protection portion on the photodetection panel so as to surround the scintillator layer when viewed in a lamination direction of the scintillator layer; a step of forming a scintillator protective film so as to cover an entire surface of the photodetection panel on a side where the scintillator layer is laminated and a surface of the panel protection portion; a step of cutting the scintillator protective film by performing irradiation with a laser beam along the panel protection portion; and a step of removing an outside part of the scintillator protective film. In the step of cutting the scintillator protective film, an outer edge of the scintillator protective film is formed by the scintillator protective film being cut, a groove continuous with the outer edge of the scintillator protective film is formed in the panel protection portion, and the laser beam irradiation is performed such that the groove has an overlapping region including a first groove end portion and a second groove end portion partially overlapping in a direction intersecting with an extension direction of the groove.

In the radiation detector manufacturing method, the outer edge of the scintillator protective film and the groove of the panel protection portion are formed in the step of cutting the scintillator protective film. When the groove is formed in the panel protection portion, the scintillator protective film formed on the panel protection portion is cut in a reliable manner. The groove includes the overlapping region including the first groove end portion and the second groove end portion. By the first groove end portion and the second groove end portion overlapping in part, the depth of the groove does not excessively increase in the overlapping region. As a result, it is possible to prevent a laser beam from reaching not only the scintillator protective film but also the panel protection portion. In other words, the scintillator protective film can be cut in a reliable manner. In addition, the surface of the photodetection panel provided with the panel protection portion does not undergo damage attributable to laser beam irradiation. Accordingly, the occurrence of a defective product is suppressed. As a result, productivity can be improved.

In the radiation detector manufacturing method according to another embodiment, the photodetection panel may have a rectangular shape. The panel protection portion may have four side portions surrounding the scintillator layer. The overlapping region may be provided in any of the four side portions in the step of cutting the scintillator protective film. According to this step, the occurrence of peeling of the scintillator protective film can be further suppressed.

In the radiation detector manufacturing method according to another embodiment, the step of cutting the scintillator protective film may include: a step of setting at least one of positions of four corner portions configured by the four side portions as a reference position; and a step of irradiating each of the four side portions with the laser beam based on the reference position. According to this step, the position where the laser beam irradiation is performed can be controlled with high accuracy.

In the radiation detector manufacturing method according to another embodiment, the panel protection portion may be a resin frame and, in the step of disposing the panel protection portion, the resin frame may be disposed on the photodetection panel so as to pass between the scintillator layer and the bonding pad and surround the scintillator layer apart from the scintillator layer and the bonding pad. According to this step, a radiation detector having the resin frame can be manufactured.

In the radiation detector manufacturing method according to another embodiment, in the step of disposing the panel protection portion, the resin frame may be formed such that a middle portion of the resin frame is higher than both edge portions of the resin frame. In the step of cutting the scintillator protective film, the laser beam irradiation may be performed at a position biased to the bonding pad side on the resin frame. According to this step, the coating resin is capable of covering the outer edge of the scintillator protective film in a reliable manner.

In the radiation detector manufacturing method according to another embodiment, the panel protection portion may be a masking member. In the step of disposing the panel protection portion, the masking member may be disposed on the photodetection panel so as to cover a region between the scintillator layer and the bonding pad and the bonding pad. In the step of forming the scintillator protective film, the scintillator protective film may be formed on the entire surface of the photodetection panel on the side where the scintillator layer is laminated and a surface of the masking member. According to this step, a radiation detector without the resin frame can be manufactured. In other words, the distance between the scintillator layer and the bonding pad can be reduced. As a result, the radiation detector can be further reduced in size.

The radiation detector manufacturing method according to another embodiment may further include a step of removing the masking member after the step of removing the outside part of the scintillator protective film. According to this step, the radiation detector without the resin frame can be manufactured in a suitable manner.

The radiation detector manufacturing method according to another embodiment may further include a step of forming a coating resin covering the outer edge of the scintillator protective film after the step of removing the outside part of the scintillator protective film. According to this step, the occurrence of peeling of the outer edge of the scintillator protective film can be further suppressed.

Advantageous Effects of Invention

According to the present invention, a radiation detector and a radiation detector manufacturing method enabling productivity improvement are provided.

BRIEF DESCRIPTION OF DRAWINGS

FIG. 7($a$) is a cross-sectional view illustrating a resin frame of a comparative example, and FIG. 7($b$) is a cross-sectional view illustrating the resin frame of the embodiment.

FIG. 13($a$) is a diagram for describing processing along a pre-irradiation line, and FIG. 13($b$) is a diagram for describing processing along a first irradiation line.

FIG. 14($a$) is a diagram for describing processing along a second irradiation line, and FIG. 14($b$) is a diagram for describing processing along a third irradiation line.

FIG. 15($a$) is a diagram for describing processing along a fourth irradiation line, and FIG. 15($b$) is a diagram for describing processing along a post-irradiation line.

FIG. 18($a$) is a cross-sectional view illustrating a resin frame of a comparative example, and FIG. 18($b$) is a cross-sectional view illustrating the resin frame of the embodiment.

FIG. 30($a$) is a graph schematically showing a time history of energy received by an irradiated body, and FIG. 30($b$) is a graph schematically showing a time history of the speed of a laser beam head.

FIG. 32($a$) is a graph showing an example of the time history of the speed of the laser beam head, FIG. 32($b$) is a graph showing an example of the time history of the energy of a laser beam emitted from the laser beam head, and FIG. 32($c$) is a graph showing an example of a time history of the focal position of the laser beam emitted from the laser beam head.

DESCRIPTION OF EMBODIMENTS

Figure 1:
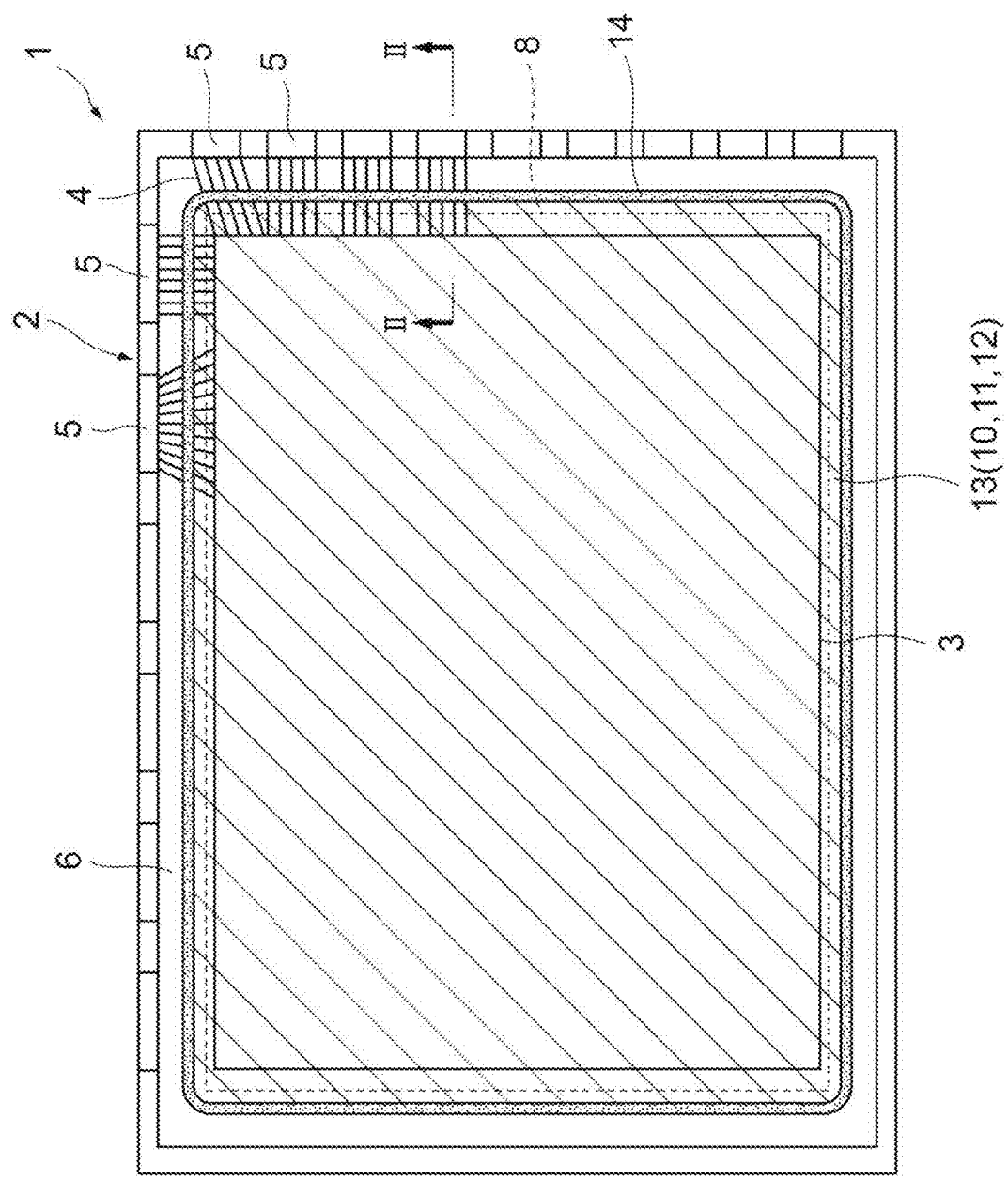
FIG. 1 is a plan view of a radiation detector of a first embodiment.

Hereinafter, embodiments for carrying out the present invention will be described in detail with reference to the accompanying drawings. In the description of the drawings, the same elements are denoted by the same reference numerals with redundant description omitted.

Figure 2:
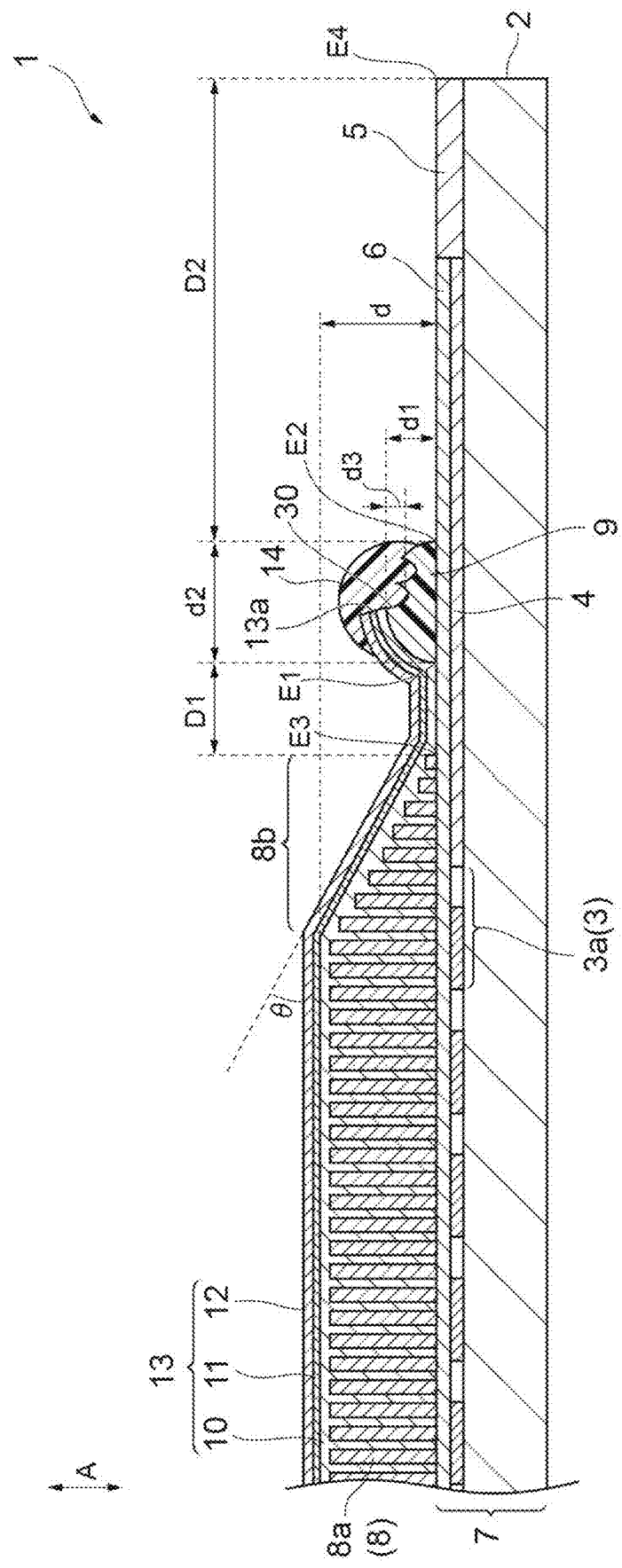
FIG. 2 is a cross-sectional view taken along line II-II of FIG. 1.

The configuration of a radiation detector 1 according to the present embodiment will be described with reference to FIGS. 1 and 2. As illustrated in FIGS. 1 and 2, the radiation detector 1 includes a photoelectric conversion element array 7 (photodetection panel), a scintillator layer 8, a resin frame 9, a protective film 13 (scintillator protective film), and a coating resin 14 (coating resin). The photoelectric conversion element array 7 has a substrate 2, a light receiving portion 3, a signal line 4, a bonding pad 5, and a passivation film 6. The protective film 13 has a first organic film 10, an inorganic film 11 (metal film), and a second organic film 12.

The light receiving portion 3 includes a plurality of photoelectric conversion elements 3*a*. The plurality of photoelectric conversion elements 3*a* are two-dimensionally arranged in the rectangular region in the middle portion of the insulating substrate 2. The substrate 2 is, for example, a glass substrate. The photoelectric conversion element 3*a* is configured by, for example, a photodiode (PD) or a thin film transistor (TFT) made of amorphous silicon. The photoelectric conversion element 3a in each row or the photoelectric conversion element 3a in each column included in the light receiving portion 3 is electrically connected to the bonding pad 5 for extracting a signal to an external circuit (not illustrated) by the signal line 4 for reading a signal.

A plurality of the bonding pads 5 are disposed at predetermined intervals along two adjacent sides of the outer edge of the substrate 2. The two adjacent sides are, for example, the upper side and the right side in FIG. 1. The bonding pad 5 is electrically connected to the corresponding photoelectric conversion element 3a via the signal line 4. The insulating passivation film 6 is formed on the photoelectric conversion element 3a and the signal line 4. Silicon nitride, silicon oxide, or the like can be used for the passivation film 6. The bonding pad 5 is exposed for connection to the external circuit.

A scintillator 8a has a columnar structure and converts X-rays, which are radiation, into light. The scintillator 8a is laminated on the photoelectric conversion element array 7 so as to cover the light receiving portion 3. The scintillator layer 8 is formed by the scintillator 8a. A plurality of the scintillators 8a are laminated in the substantially rectangular region that includes the light receiving portion 3 in the photoelectric conversion element array 7. The substantially rectangular region is surrounded by the dashed line illustrated in FIG. 1. Various materials can be used for the scintillator 8a. For example, cesium iodide (CsI) doped with thallium (Tl) with satisfactory luminous efficiency can be used for the scintillator 8a.

A peripheral edge portion 8b of the scintillator layer 8 has a gradient shape. In other words, the height of the peripheral edge portion 8b gradually decreases toward the outside of the scintillator layer 8. In other words, as for the peripheral edge portion 8b, the scintillator 8a formed on the outside of the scintillator layer 8 is lower in height. The peripheral edge portion 8b is a region where the light receiving portion 3 is not formed below. The region where the light receiving portion 3 is not formed is a region outside an effective screen. The peripheral edge portion 8b is a region that has little effect on X-ray image generation. Accordingly, with the gradient-shaped peripheral edge portion 8b, it is possible to limit the region on the scintillator layer 8 that is adversely affected by a laser beam during manufacturing. The gradient angle of the peripheral edge portion 8b (angle θ) is defined. Defined first is a straight line connecting the height positions of the scintillators 8a formed in the peripheral edge portion 8b from the inside toward the outside of the scintillator layer 8. This straight line forms the angle θ with respect to the upper surface of the substrate 2. The angle θ is in the range of 20 degrees or more and 80 degrees or less.

The resin frame 9 is formed on the photoelectric conversion element array 7. The resin frame 9 passes between the scintillator layer 8 and the bonding pad 5 and surrounds the scintillator layer 8 when viewed in a lamination direction A of the scintillator layer 8. The corner portion of the resin frame 9 has an arc shape that is convex to the outside. The resin frame 9 is, for example, a silicone resin. It can be said that the shape of the corner portion of the resin frame 9 is a so-called R shape.

The middle portion of the resin frame 9 is higher than both edge portions of the resin frame 9. A height d1 of the resin frame 9 is lower than a height d of the scintillator layer 8. As a result, the resin frame 9 can be reduced in size. Further, the adverse effect of a laser beam on the scintillator layer 8 can be suppressed during manufacturing. The height d1 of the resin frame 9 is the distance from the position of the upper surface of the photoelectric conversion element array 7 to the position of the apex of the resin frame 9. The height d of the scintillator layer 8 is the maximum height of the scintillator 8a included in the scintillator layer 8.

From the viewpoint of reducing the size of the radiation detector 1, it is preferable that the resin frame 9 is as small as possible. More specifically, the height d1 of the resin frame 9 is 100 μm or more. In addition, the height d1 of the resin frame 9 is 300 μm or less. Further, a width d2 of the resin frame 9 is 700 μm or more. The width d2 of the resin frame 9 is 1000 μm or less. The width d2 of the resin frame 9 is the width between an inner edge E1 of the resin frame 9 and an outer edge E2 of the resin frame 9. The inner edge E1 is an edge portion on the scintillator layer 8 side. The outer edge E2 is an edge portion on the bonding pad 5 side.

The distance from the inner edge E1 of the resin frame 9 to an outer edge E3 of the scintillator layer 8 is a first distance D1. The distance from the outer edge E2 of the resin frame 9 to an outer edge E4 of the photoelectric conversion element array 7 is a second distance D2. The first distance D1 is shorter than the second distance D2. The ratio of the second distance D2 to the first distance D1 is preferably 5 or more from the viewpoint of suppressing the adverse effect of a laser beam on the bonding pad 5 during manufacturing and ensuring the effective area of the scintillator layer 8. More specifically, the first distance D1 is preferably 1 mm or less. The second distance D2 is preferably 5 mm or more. This is because of the following reasons.

The effective area of the scintillator layer 8 can be maximized when no gap is provided between the outer edge E3 of the scintillator layer 8 and the inner edge E1 of the resin frame 9. However, it is conceivable that the scintillator layer 8 is adversely affected by a laser beam during manufacturing. In addition, a slight failure may arise in the process of forming the resin frame 9. The slight failure can be exemplified by, for example, forming the resin frame 9 on the scintillator layer 8. Considering these, it is preferable to set the first distance D1 in the range of 1 mm or less. The second distance D2 is set in the range of 5 mm or more. As a result, the adverse effect of a laser beam on the bonding pad 5 during manufacturing is taken into consideration, and thus a sufficient distance can be ensured between the resin frame 9 and the bonding pad 5.

The scintillator layer 8 is covered with the protective film 13. The protective film 13 has the first organic film 10, the inorganic film 11, and the second organic film 12. These films are laminated from the scintillator layer 8 side in this order. Each of the first organic film 10, the inorganic film 11, and the second organic film 12 transmits X-rays, which are radiation. In addition, the first organic film 10, the inorganic film 11, and the second organic film 12 block water vapor. Specifically, a polyparaxylylene resin, polyparachloroxylylene, or the like can be used for the first organic film 10 and the second organic film 12. The inorganic film 11 may be transparent, opaque, or reflective with respect to light. An oxide film such as silicon (Si), titanium (Ti), and chromium (Cr), a metal film such as gold, silver, and aluminum (Al), or the like can be used for the inorganic film 11. For example, the inorganic film 11 that uses a metal film reflecting light is capable of preventing leakage of fluorescence generated by the scintillator 8a. As a result, the detection sensitivity of the radiation detector 1 is improved. Described in the present embodiment is an example in which aluminum (Al), which is easy to mold, is used as the inorganic film 11. Aluminum (Al) is easy to corrode in the air. However, the inorganic film 11 is sandwiched between the first organic film 10 and the second organic film 12. Accordingly, the inorganic film 11 that uses aluminum (Al) is protected from corrosion.

The protective film 13 is formed by, for example, a CVD method. Accordingly, immediately after the protective film 13 is formed, the protective film 13 covers the entire surface of the photoelectric conversion element array 7. Accordingly, in order to expose the bonding pad 5, the protective film 13 is cut at a position inside the bonding pad 5 of the photoelectric conversion element array 7. In the protective film 13, the part outside the cutting position is removed. As will be described later, the protective film 13 is cut by a laser beam in the vicinity of the outside of the middle portion of the resin frame 9 and an outer edge 13a of the protective film 13 is fixed by the resin frame 9. As a result, it is possible to prevent the protective film 13 from peeling off from the outer edge 13a. The carbon dioxide laser ($CO_2$ laser) or the like may be used in cutting the protective film 13. The protective film 13 can be cut with a single scan by means of the carbon dioxide laser. In other words, the protective film 13 can be cut in a short time. As a result, productivity is improved. In addition, an ultrashort pulse semiconductor laser on the order of nanoseconds or picoseconds or the like may be used in cutting the protective film 13. It should be noted that the adverse effects on the photoelectric conversion element array 7, the bonding pad 5, the scintillator layer 8, and so on can be exemplified by thermal damage when, for example, the carbon dioxide laser or an ultrashort pulse laser is used.

The outer edge 13a of the protective film 13 is positioned on the resin frame 9. The outer edge 13a is coated with the coating resin 14 together with the resin frame 9. The coating resin 14 is disposed along the resin frame 9. A resin that is satisfactorily adhesive with respect to the protective film 13 and the resin frame 9 may be used for the coating resin 14. For example, an acrylic adhesive or the like can be used for the coating resin 14. The same silicone resin as the resin frame 9 may be used for the coating resin 14. The same acrylic resin as the coating resin 14 may be used for the resin frame 9.

Figure 3:
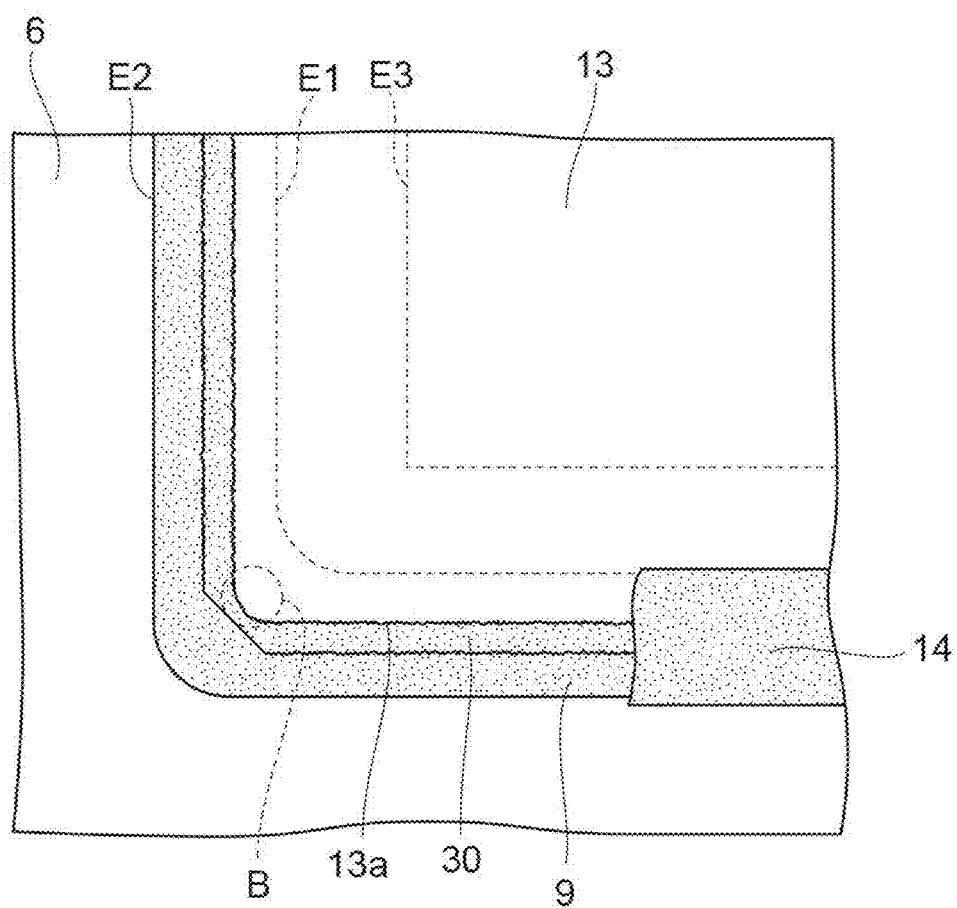
FIG. 3 is an enlarged plan view illustrating the vicinity of a corner portion of the radiation detector of FIG. 1.

Next, the corner portions (corner parts) of the resin frame 9 and the protective film 13 will be described with reference to FIG. 3. In FIG. 3, the coating resin 14 is partially illustrated such that the states of the corner portions of the resin frame 9 and the protective film 13 are understood with ease.

As will be described in detail later, the protective film 13 on the resin frame 9 is irradiated with a laser beam in the process of manufacturing the radiation detector 1. As a result, the part of the protective film 13 irradiated with the laser beam is cut. The protective film 13 is very thin. Accordingly, a part of the resin frame 9 is also cut by the laser beam of the carbon dioxide laser. As a result, a groove 30 as a corresponding region is formed near the middle of the resin frame 9. The outer edge 13a of the protective film 13 in the resin frame 9 is in a state of being processed by the laser beam. In addition, the groove 30 is also in a state of being processed by the laser beam. Here, a depth (height) d3 of the groove 30 is one-third or less of the height d1 of the resin frame 9. Suppressed as a result is the adverse effect of the laser beam on the photoelectric conversion element array 7 positioned below the resin frame 9.

As illustrated in FIG. 3, the outer edge 13a of the protective film 13 and the groove 30 processed by the laser beam have a substantially rectangular ring shape having an arcuate corner portion convex to the outside when viewed in the lamination direction A of the scintillator layer 8. The arcuate corner portion is illustrated in a region B illustrated in FIG. 3. The outer edge 13a of the protective film 13 and the surface of the groove 30 have a fine wave shape when viewed in the lamination direction A. The outer edge 13a of the protective film 13 and the surface of the groove 30 are different in shape from a flat cut surface formed by an edged tool such as a cutter. The outer edge 13a of the protective film 13 and the surface of the groove 30 have minute irregularities. As a result, the area of mutual contact between the outer edge 13a of the protective film 13 and the coating resin 14 increases. Accordingly, the coating resin 14 is capable of adhering more firmly to the outer edge 13a of the protective film 13. In addition, the area of mutual contact between the groove 30 and the coating resin 14 also increases. Accordingly, the coating resin 14 is also capable of adhering more firmly to the groove 30.

Figure 4:
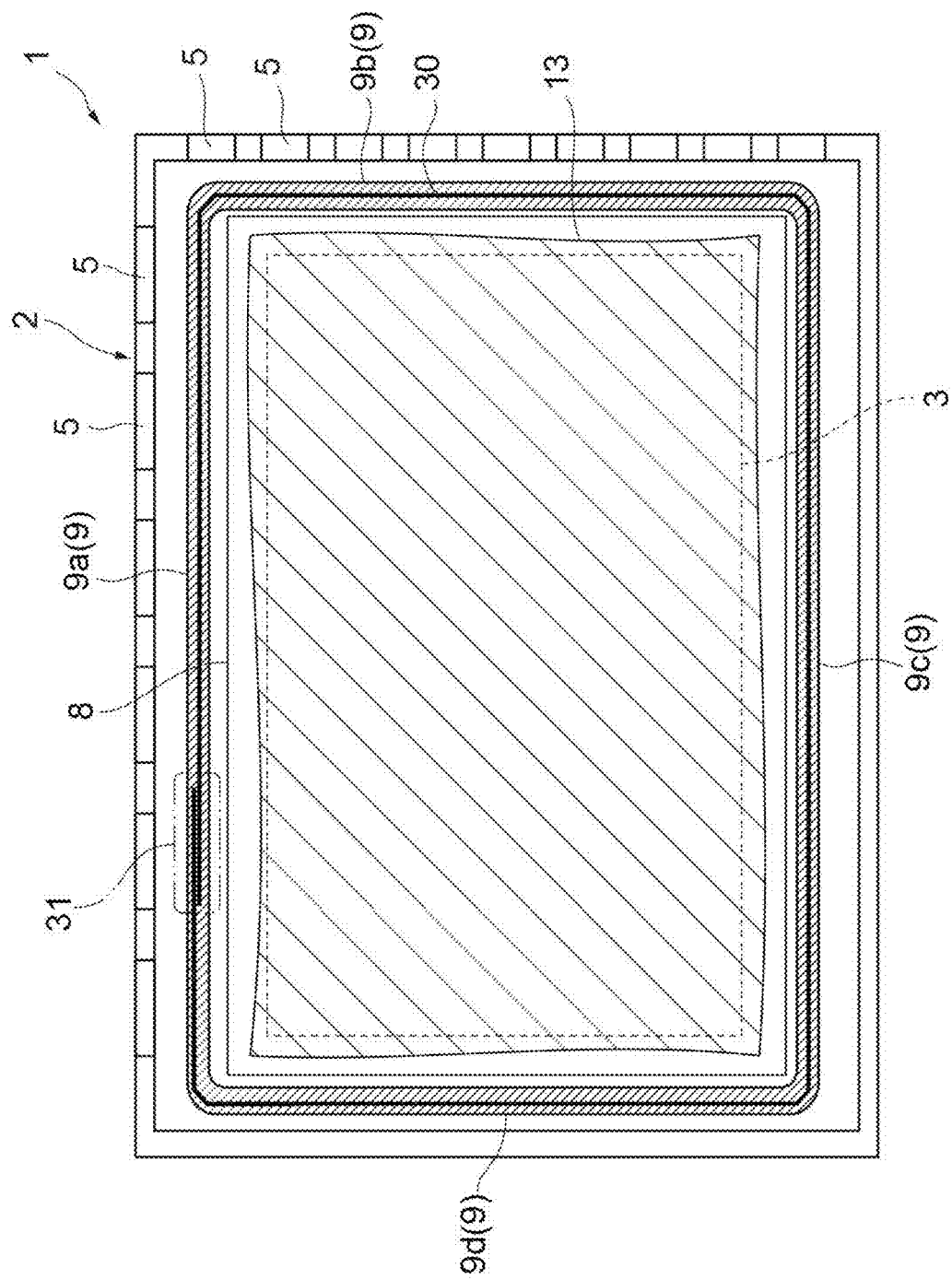
FIG. 4 is a plan view illustrating the resin frame of FIG. 1 and a groove provided in the resin frame.

Next, the groove 30 will be described in more detail with reference to FIGS. 4, 5, 6, and 7. As illustrated in FIG. 4, the resin frame 9 surrounds the light receiving portion 3. The resin frame 9 has a rectangular shape in a plan view. Accordingly, the resin frame 9 includes a first side portion 9a, a second side portion 9b, a third side portion 9c, and a fourth side portion 9d. The groove 30 is formed in the resin frame 9. In other words, the groove 30 extends along the extension direction of the resin frame 9. The groove 30 also has a rectangular shape in a plan view. The groove 30 includes an overlapping region 31. In the present embodiment, the overlapping region 31 is formed in the first side portion 9a. It should be noted that the overlapping region 31 may be formed in any of the second side portion 9b, the third side portion 9c, and the fourth side portion 9d instead. In other words, the overlapping region 31 is not formed in the corner portions.

Figure 5:
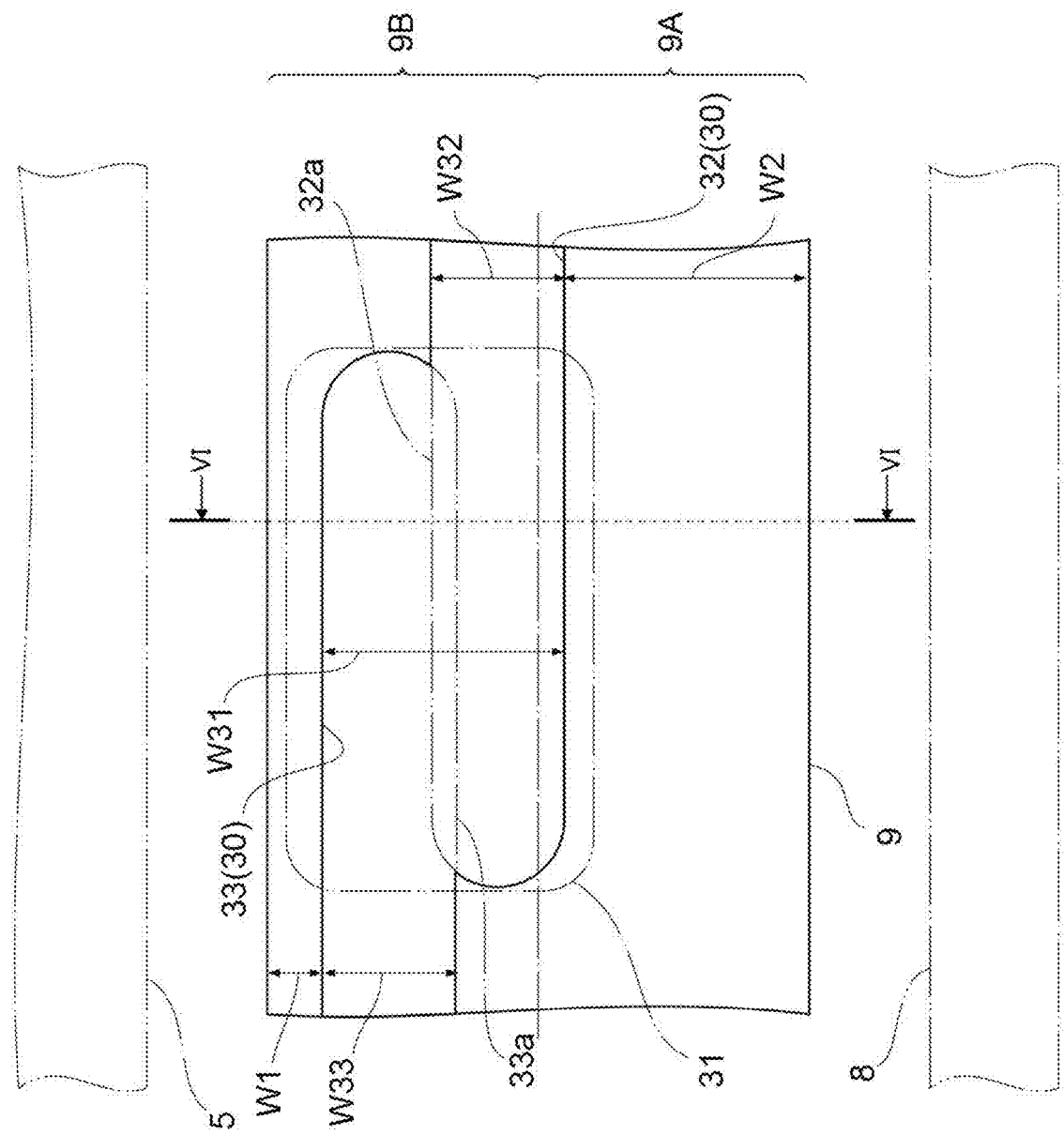
FIG. 5 is an enlarged plan view illustrating an overlapping region of FIG. 4.
Figure 6:
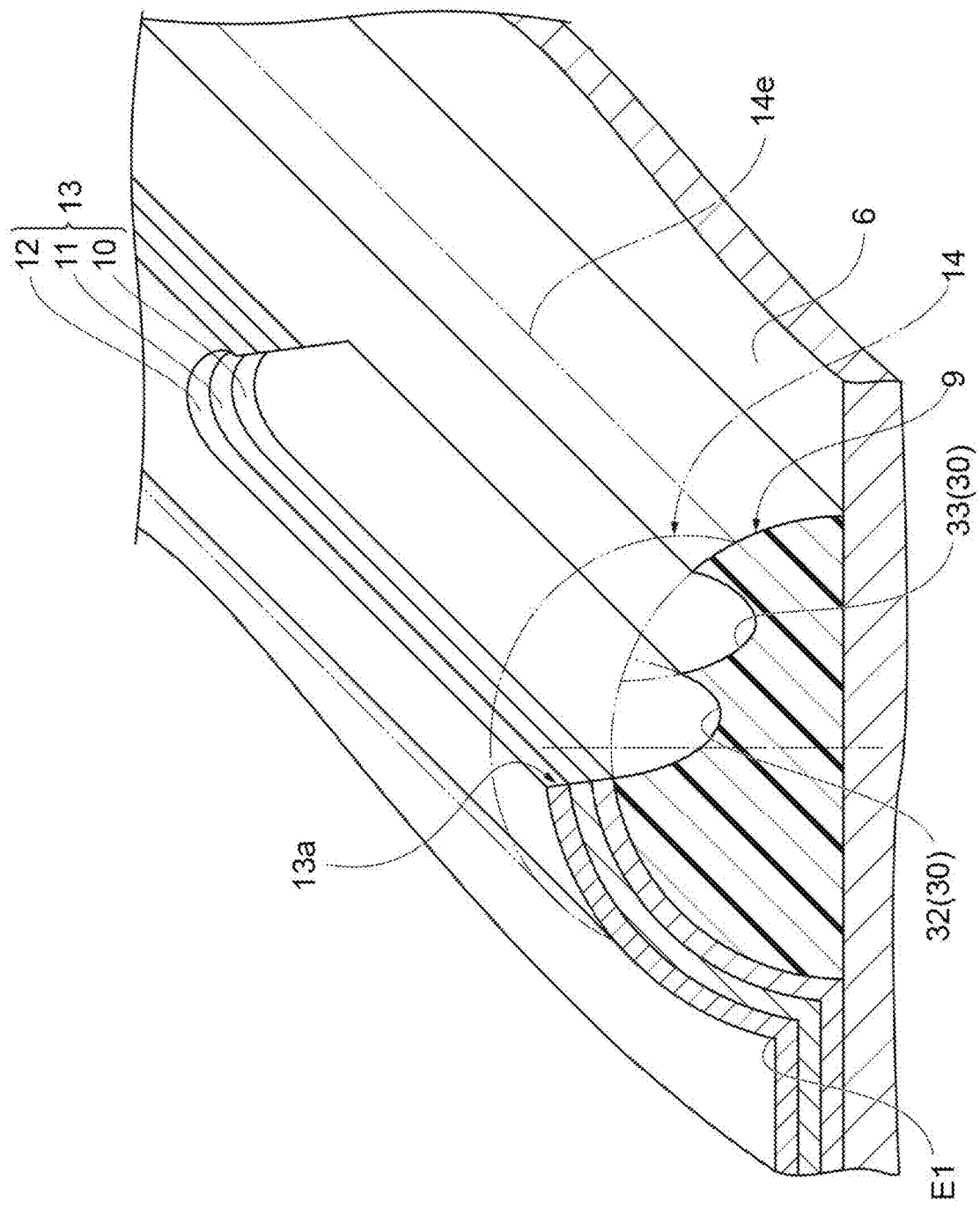
FIG. 6 is a perspective view illustrating a cross section taken along line VI-VI of FIG. 5.

FIG. 5 is an enlarged view of the vicinity of the overlapping region 31 of FIG. 4. FIG. 6 is a perspective view illustrating the cross section in the arrow view VI-VI line of FIG. 5. In FIG. 6, the coating resin 14 is virtually illustrated by a two-dot chain line. The overlapping region 31 includes one first groove end portion 32 and one second groove end portion 33. The first groove end portion 32 is formed at a timing close to the initiation of the irradiation with the laser beam. The second groove end portion 33 is formed at a timing close to when the irradiation with the laser beam is stopped.

The first groove end portion 32 is formed inside the second groove end portion 33. "Inside" and "outside" mean the scintillator layer 8 side and the bonding pad 5 side in relation to the resin frame 9 as a reference, respectively. The second groove end portion 33 is formed outside the first groove end portion 32. The first groove end portion 32 partially overlaps the second groove end portion 33 in the width direction of the groove 30. Specifically, an outside part 32a of the first groove end portion 32 overlaps an inside part 33a of the second groove end portion 33. Then, a width W31 of the overlapping part is larger than a width W32 of the first groove end portion 32. Likewise, the width W31 of the overlapping part is larger than a width W33 of the second groove end portion 33. The width W31 of the overlapping part is smaller by the overlapping length than the width obtained by adding the width W32 of the first groove end portion 32 to the width W33 of the second groove end portion 33. At this overlapping part, the first groove end portion 32 is connected to the second groove end portion 33.

The position of the overlapping region 31 is biased to the bonding pad 5 side on the resin frame 9. For example, a distance W1 from the side portion on the outside of the second groove end portion 33 to the edge portion of the resin frame 9 on the bonding pad 5 side is shorter than a distance W2 from the side portion on the inside of the first groove end portion 32 to the edge portion of the resin frame 9 on the scintillator layer 8 side. In addition, an inside region 9A and an outside region 9B, which are configured by bisecting the resin frame 9 in the width direction of the resin frame 9, are defined in the resin frame 9. In this definition, the entire second groove end portion 33 is formed in the outside region 9B. The first groove end portion 32 has a first part formed in the outside region 9B. The first groove end portion 32 has a part formed in the inside region 9A.

As illustrated in FIG. 7, in the overlapping region 31, the first groove end portion 32 and the second groove end portion 33 are arranged in the width direction of the resin frame 9. In the overlapping region 31, a part of the first groove end portion 32 overlaps a part of the second groove end portion 33 in the width direction. More specifically, the inner peripheral side of the first groove end portion 32 positioned in the overlapping region 31 overlaps the outer peripheral side of the second groove end portion 33 positioned in the overlapping region 31. In the overlapping region 31, the first groove end portion 32 is connected to the second groove end portion 33. The depth of the first groove end portion 32 is the distance from the point where a center line CL and the surface of the resin frame 9 intersect to the deepest portion of the first groove end portion 32. The same applies to the depth of the second groove end portion 33. Then, the depth of the first groove end portion 32 is approximately equal to the depth of the second groove end portion 33.

The deepest portion of the first groove end portion 32 is irradiated with the laser beam that forms the second groove end portion 33 when, for example, the second groove end portion 33 completely overlaps the first groove end portion 32 (see FIG. 7(a)). Then, the depth of the groove in the overlapping region 31 is twice the depth in the first groove end portion 32 insofar as the conditions of the irradiation with the laser beam are the same.

However, in the present embodiment, the first groove end portion 32 and the second groove end portion 33 are out of alignment so as to run in parallel. Accordingly, as illustrated in FIG. 7(b), the outside of the first groove end portion 32, that is, the surface of the resin frame 9 that is yet to be processed is irradiated with the laser beam forming the second groove end portion 33. Then, the depth of the groove in the overlapping region 31 is not twice the depth of the groove formed by performing irradiation once unlike in a case where the second groove end portion 33 completely overlaps the first groove end portion 32.

The operation of the radiation detector 1 according to the present embodiment will be described. X-rays (radiation) incident from an incident surface reach the scintillator 8a after transmission through the protective film 13. The X-rays are absorbed by the scintillator 8a. The scintillator 8a emits light proportional to the dose of the absorbed X-rays. The light that has been emitted and travels in the direction opposite to the incident direction of the X-rays is reflected by the inorganic film 11. As a result, almost all the light generated by the scintillator 8a is incident on the photoelectric conversion element 3a via the passivation film 6. The photoelectric conversion element 3a generates an electric signal corresponding to the amount of the incident light by photoelectric conversion. The electric signal is accumulated over a certain period of time. The amount of the light corresponds to the dose of the incident X-rays. In other words, the electric signal accumulated in the photoelectric conversion element 3a corresponds to the dose of the incident X-rays. Accordingly, an image signal corresponding to an X-ray image is obtained by means of this electric signal. The image signals accumulated in the photoelectric conversion element 3a are sequentially read from the bonding pad 5 via the signal line 4. The read image signal is transferred to the outside. The transferred image signal is processed by a predetermined processing circuit. As a result, the X-ray image is displayed.

<Method for Manufacturing Radiation Detector>

Figure 8:
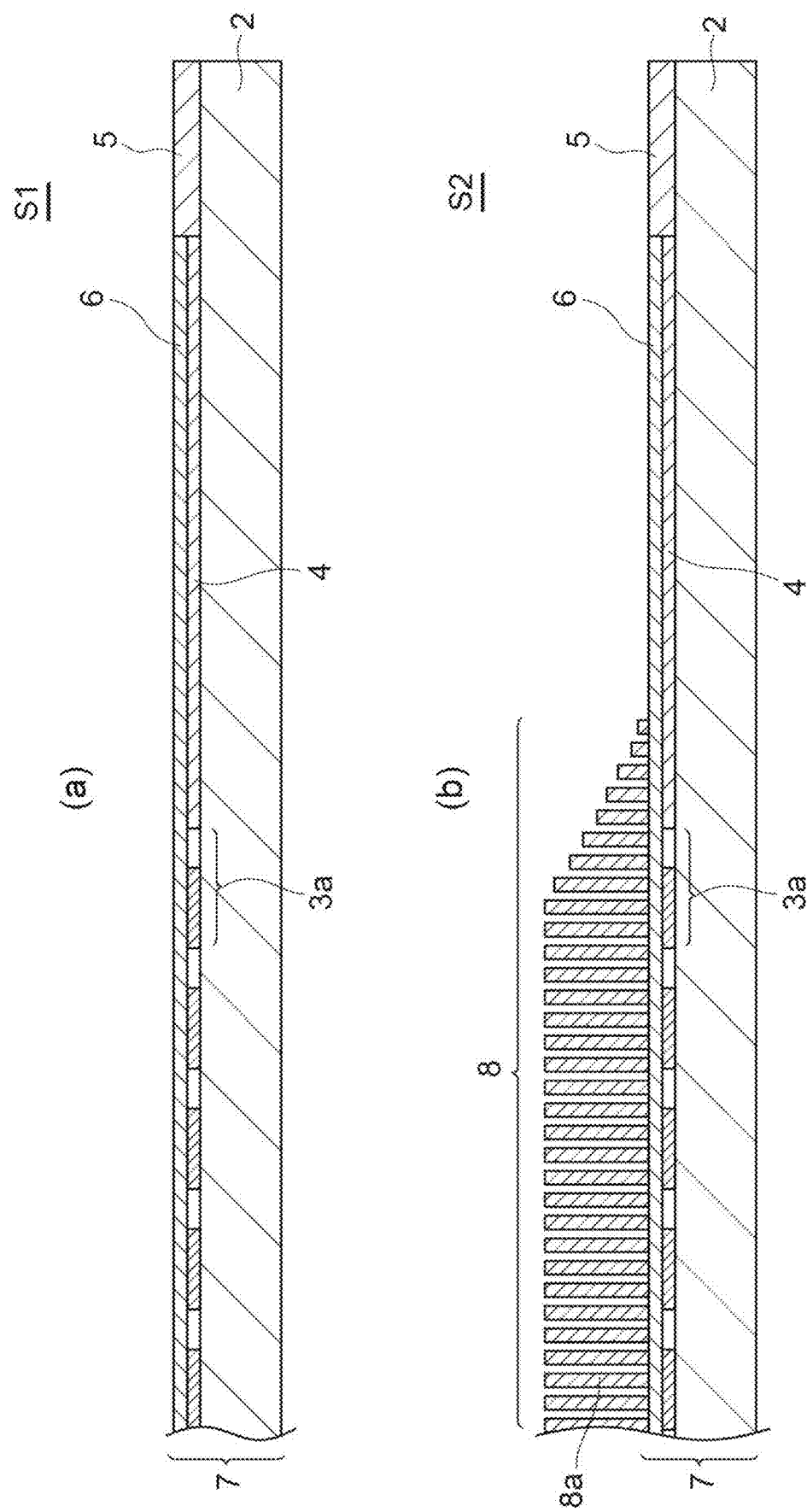
FIG. 8($a$) is a cross-sectional view illustrating a state where a scintillator layer is yet to be formed, and FIG. 8($b$) is a cross-sectional view illustrating a state where the scintillator layer is formed.
Figure 9:
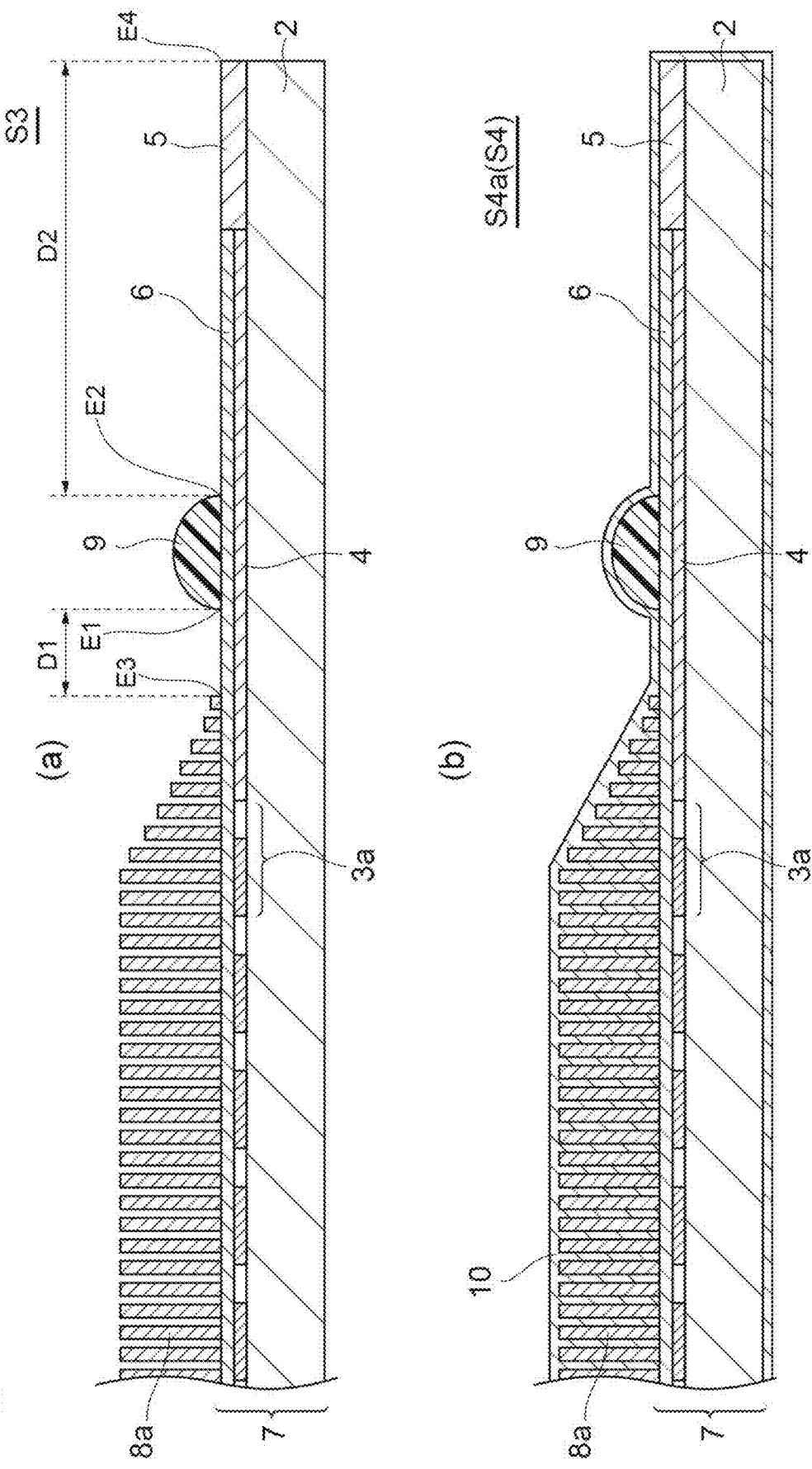
FIG. 9($a$) is a cross-sectional view illustrating a state where the resin frame is formed, and FIG. 9($b$) is a cross-sectional view illustrating a state where a first organic film is formed.
Figure 10:
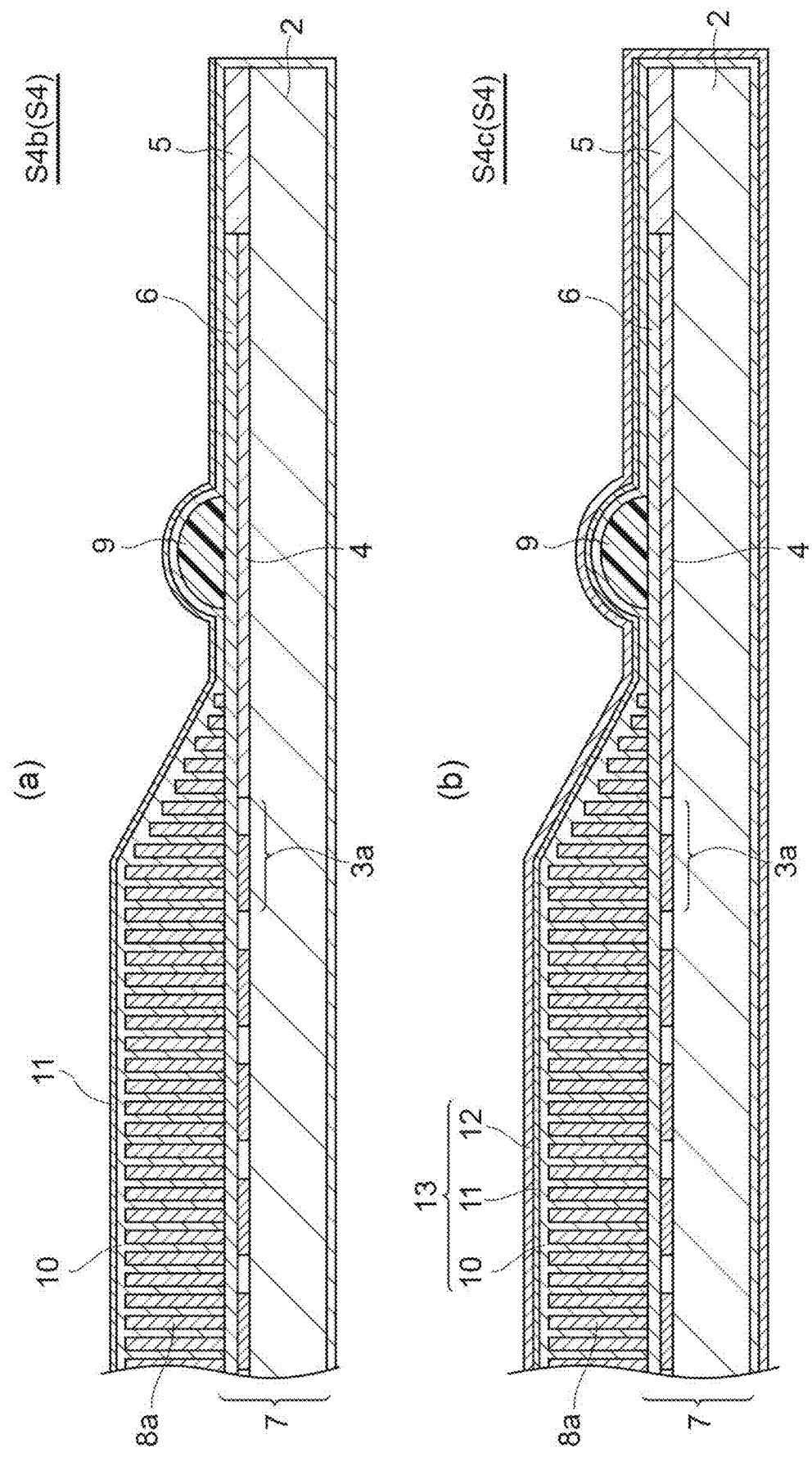
FIG. 10($a$) is a cross-sectional view illustrating a state where an inorganic film is formed, and FIG. 10($b$) is a cross-sectional view illustrating a state where a second organic film is formed.

Next, a method for manufacturing the radiation detector 1 according to the present embodiment will be described with reference to FIGS. 8 to 18. First, the photoelectric conversion element array 7 is prepared as illustrated in FIG. 8(a) (Step S1). Subsequently, the scintillator layer 8 is formed (laminated) as illustrated in FIG. 8(b) (Step S2). Specifically, columnar crystals of cesium iodide (CsI) doped with thallium (Tl) are grown in the region that covers the light receiving portion 3 on the photoelectric conversion element array 7. An evaporation method or the like may be used for the growth of the columnar crystals. The thickness of the columnar crystals of cesium iodide (CsI) is, for example, approximately 600 μm.

Next, the resin frame 9 is formed on the photoelectric conversion element array 7 as illustrated in FIG. 9(a) (Step S3). Specifically, the resin frame 9 is formed so as to pass between the scintillator layer 8 and the bonding pad 5 and surround the scintillator layer 8 when viewed in the lamination direction A of the scintillator layer 8. More specifically, the resin frame 9 is formed at a position where the first distance D1 is 1 mm or less and the second distance D2 is 5 mm or more. An automatic X-Y coating device or the like can be used to form the resin frame 9. Hereinafter, what is obtained by forming the scintillator layer 8 and the resin frame 9 on the photoelectric conversion element array 7 will be simply referred to as "substrate" for convenience of description.

Figure 24:
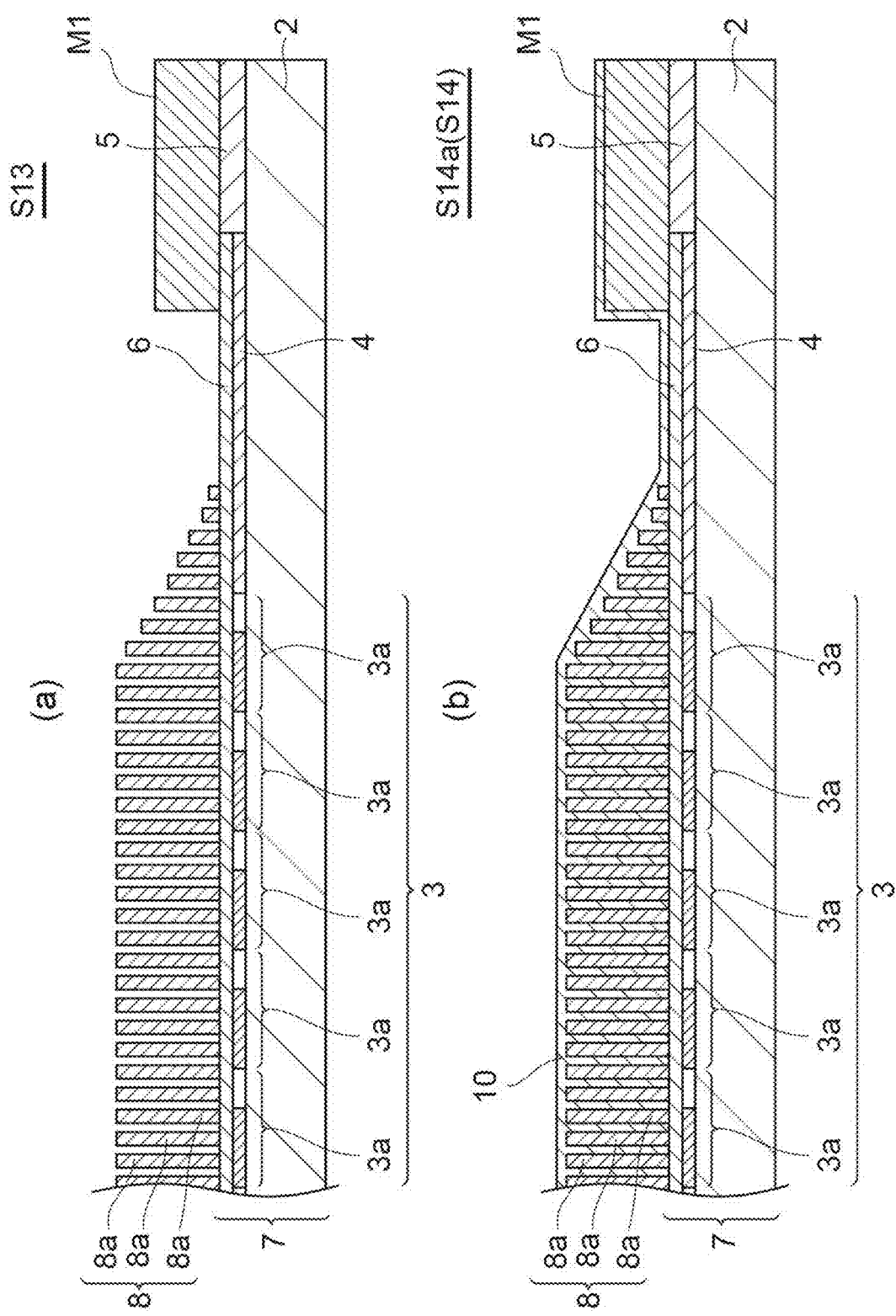
FIG. 24($a$) is a cross-sectional view illustrating a state where a masking member is disposed, and FIG. 24($b$) is a cross-sectional view illustrating a state where the first organic film is formed.

It should be noted that a masking member (see FIG. 24(a)) as illustrated in a second embodiment may be further disposed in addition to the resin frame 9 in Step S3. The masking member is a region outside the resin frame 9 and is disposed so as to cover the bonding pad 5. The masking member protects the surface of the bonding pad 5. When the masking member is disposed, the masking member is removed together with the protective film 13 in Step S6 of removing the outside part of the protective film 13, which will be described later.

Next, the first organic film 10 is formed as illustrated in FIG. 9(b) (Step S4a). The cesium iodide (CsI) that forms the scintillator layer 8 is highly hygroscopic. Accordingly, with the scintillator layer 8 exposed, the scintillator layer 8 absorbs water vapor in the air. As a result, the scintillator layer 8 is dissolved. In this regard, the surface of the entire substrate is coated with polyparaxylylene by, for example, a CVD method. The thickness of the polyparaxylylene may be 5 μm or more and 25 μm or less.

Subsequently, the inorganic film 11 (metal film) is formed as illustrated in FIG. 10(a) (Step S4b). Specifically, an aluminum film having a thickness of 0.2 μm is laminated by an evaporation method on the surface of the first organic film 10 on the incident surface side where radiation is incident. The incident surface where radiation is incident is the surface of the radiation detector 1 on the side where the scintillator layer 8 is formed. Subsequently, the second organic film 12 is formed as illustrated in FIG. 10(b) (Step S4c). Specifically the surface of the entire substrate where the inorganic film 11 is formed is recoated with polyparaxylylene by a CVD method. The thickness of the polyparaxylylene may be 5 μm or more and 25 μm. The second organic film 12 prevents deterioration of the inorganic film 11 attributable to corrosion. The protective film 13 is formed as a result of Steps S4a, S4b, and S4c. The part of the protective film 13 outside the substantially middle part of the resin frame 9 is removed through the subsequent treatment. The part of the protective film 13 outside the substantially middle part of the resin frame 9 covers the bonding pad 5. Accordingly, it is not necessary to form the first organic film 10 and the second organic film 12 on the side surface of the photoelectric conversion element array 7. In addition, it is not necessary to form the first organic film 10 and the second organic film 12 on the surface of the photoelectric conversion element array 7 on the side opposite to the surface where the scintillator layer 8 is laminated.

Figure 11:
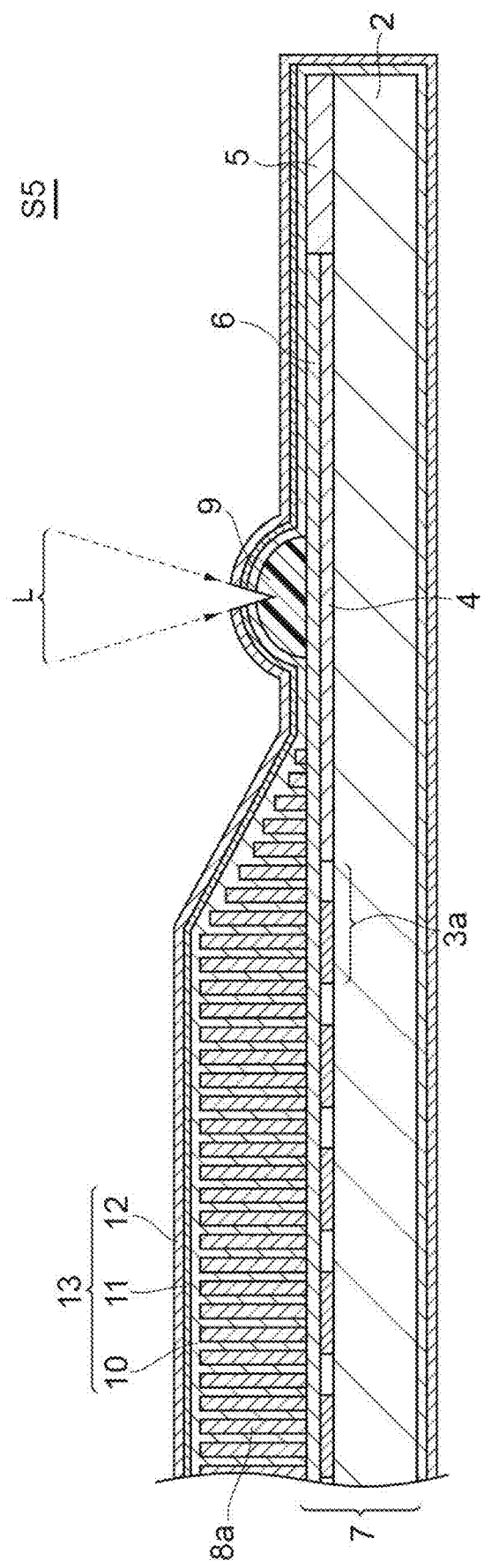
FIG. 11 is a cross-sectional view illustrating laser beam processing.

Subsequently, irradiation with a laser beam L is performed along the resin frame 9 as illustrated in FIG. 11. As a result, the protective film 13 is cut (Step S5). Specifically, a laser beam head (not illustrated) performing irradiation with the laser beam L is moved with respect to a stage (not illustrated) where the entire substrate is placed with the protective film 13 formed on the surface of the entire substrate. As a result, scanning with the laser beam L is performed along the resin frame 9 in a one-stroke manner.

Hereinafter, Step S5 of cutting the protective film 13 will be described in more detail with reference to FIGS. 12, 13, 14, 15, and 16.

Figure 12:
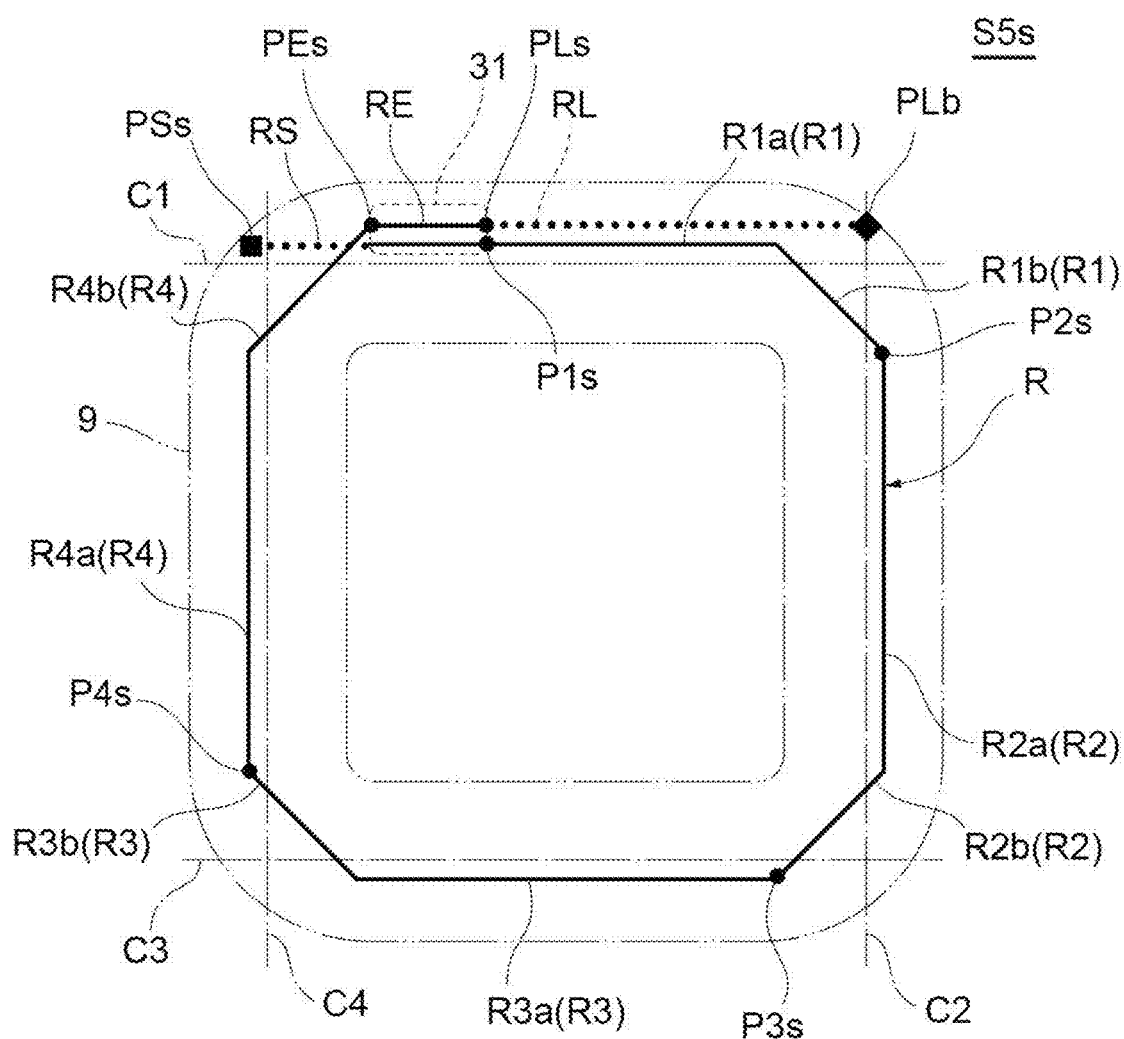
FIG. 12 is a diagram for specifically describing the laser beam processing.

A first reference line C1, a second reference line C2, a third reference line C3, and a fourth reference line C4 are defined as illustrated in FIG. 12. Several reference points are defined for the definition of the first reference line C1, the second reference line C2, the third reference line C3, and the fourth reference line C4 (Step S5s). For example, an image is obtained by taking an image of the resin frame 9 with a camera. Seven reference points as an example are specified based on the image. These reference points may overlap the center line of the resin frame 9. In addition, the reference point may be set in a corner portion.

Next, irradiation with a laser beam is performed (Step S5r). Step S5r includes a step of defining a scanning line and a step of performing an operation along the scanning line. The scanning line includes several elements. Specifically, the scanning line includes a pre-irradiation line RS, a first irradiation line R1, a second irradiation line R2, a third irradiation line R3, a fourth irradiation line R4, a post-irradiation line RE, and a release line RL. The step of performing the operation along the scanning line also includes a plurality of elements corresponding to these elements. Exemplified in the following description is an operation in which the definition of the scanning line elements and the operation along the elements are repeated. In other words, the operation along the pre-irradiation line RS is performed immediately after the pre-irradiation line RS is defined. Next, the operation along the first irradiation line R1 is performed immediately after the first irradiation line R1 is defined. The second irradiation line R2, the third irradiation line R3, the fourth irradiation line R4, the post-irradiation line RE, and the release line RL are defined in the same manner and the operations along the lines are performed in the same manner.

It should be noted that the operation along the scanning line may be collectively performed after the definition of the scanning line is performed collectively. In addition, the definition of the scanning line and the operation along the scanning line may be performed in parallel. For example, a first scanning line may be defined during the operation along the pre-irradiation line.

First, the pre-irradiation line RS is defined (Step S5a: see FIG. 13(a)). The pre-irradiation line RS is a section from a start point PSs to a start point P1s of the first irradiation line R1. The start point PSs is separated by a predetermined distance from the first reference line C1 and is separated by a predetermined distance from the fourth reference line C4. Each of the predetermined distances is, for example, 70 μm. The pre-irradiation line RS is parallel to the first reference line C1. The pre-irradiation line RS is separated by a predetermined distance from the first reference line C1. The predetermined distance is, for example, 70 μm.

Next, the operation along the pre-irradiation line RS is performed (Step S5b). First, a laser beam head is moved to the start point PSs. Next, a movement of the laser beam head is initiated along the pre-irradiation line RS. The speed of the laser beam head is, for example, 6000 mm/min. At this time, the laser beam head does not perform laser beam irradiation. The laser beam head initiates laser beam irradiation at least behind the start point PSs of the pre-irradiation line RS and up to the start point P1s of the first irradiation line R1. For example, the laser beam head may initiate the laser beam irradiation at the start point P1s of the first irradiation line R1.

Subsequently, the first irradiation line R1 is defined (Step S5c: see FIG. 13(b)). The first irradiation line R1 includes a first irradiation side portion R1a and a first irradiation corner portion R1b. The first irradiation side portion R1a is continuous with the pre-irradiation line RS. In other words, the first irradiation side portion R1a is parallel to the first reference line C1. Further, the first irradiation side portion R1a is separated by a predetermined distance from the first reference line C1. The predetermined distance is, for example, 70 μm. The first irradiation corner portion R1b connects the first irradiation side portion R1a and a second irradiation side portion R2a (described later). The first irradiation corner portion R1b corresponds to the hypotenuse of a right-angled isosceles triangle having a side length of 0.4 mm in the corner portion of the first irradiation side portion R1a and the second irradiation side portion R2a.

Next, the operation along the first irradiation line R1 is performed (Step S5d). The speed of the laser beam head is, for example, 6000 mm/min.

Subsequently, the second irradiation line R2 is defined (Step S5e: see FIG. 14(a)). The second irradiation line R2 includes the second irradiation side portion R2a and a second irradiation corner portion R2b. The second irradiation side portion R2a is continuous with the first irradiation corner portion R1b. The second irradiation side portion R2a is parallel to the second reference line C2. Further, the second irradiation side portion R2a is separated by a predetermined distance from the second reference line C2. The predetermined distance is, for example, 70 μm. The second irradiation corner portion R2b connects the second irradiation side portion R2a and a third irradiation side portion R3a (described later). The second irradiation corner portion R2b corresponds to the hypotenuse of a right-angled isosceles triangle having a side length of 0.4 mm in the corner portion of the second irradiation side portion R2a and the third irradiation side portion R3a.

Next, the operation along the second irradiation line R2 is performed (Step S5f). The speed of the laser beam head is, for example, 6000 mm/min.

Subsequently, the third irradiation line R3 is defined (Step S5g: see FIG. 14(b)). The third irradiation line R3 includes the third irradiation side portion R3a and a third irradiation corner portion R3b. The third irradiation side portion R3a is continuous with the second irradiation corner portion R2b.

The third irradiation side portion R3a is parallel to the third reference line C3. Further, the third irradiation side portion R3a is separated by a predetermined distance from the third reference line C3. The predetermined distance is, for example, 70 μm. The third irradiation corner portion R3b connects the third irradiation side portion R3a and a fourth irradiation side portion R4a (described later). The third irradiation corner portion R3b corresponds to the hypotenuse of a right-angled isosceles triangle having a side length of 0.4 mm in the corner portion of the third irradiation side portion R3a and the fourth irradiation side portion R4a.

Next, the operation along the third irradiation line R3 is performed (Step S5h). The speed of the laser beam head is, for example, 6000 mm/mm.

Subsequently, the fourth irradiation line R4 is defined (Step S5i: see FIG. 15(a)). The fourth irradiation line R4 includes the fourth irradiation side portion R4a and a fourth irradiation corner portion R4b. The fourth irradiation side portion R4a is continuous with the third irradiation corner portion R3b. The fourth irradiation side portion R4a is parallel to the fourth reference line C4. Further, the fourth irradiation side portion R4a is separated by a predetermined distance from the fourth reference line C4. The predetermined distance is, for example, 70 μm. The fourth irradiation corner portion R4b connects the fourth irradiation side portion R4a and the post-irradiation line RE (described later). The fourth irradiation corner portion R4b corresponds to the hypotenuse of a right-angled isosceles triangle having a side length of 0.4 mm in the corner portion of the fourth irradiation side portion R4a and the post-irradiation line RE. Here, the fourth irradiation corner portion R4b and the pre-irradiation line RS intersect. The end point of the fourth irradiation corner portion R4b is set at a position separated by a predetermined distance from the pre-irradiation line RS to the outside. The predetermined distance is, for example, 100 μm.

Next, the operation along the fourth irradiation line R4 is performed (Step S5j). The speed of the laser beam head is, for example, 6000 mm/min.

Subsequently, the post-irradiation line RE is defined (Step S5k: see FIG. 15(b)). The post-irradiation line RE is parallel to the pre-irradiation line RS and the first irradiation side portion R1a. The post-irradiation line RE overlaps the pre-irradiation line RS in the direction parallel to the first reference line C1. Accordingly, the post-irradiation line RE extends parallel to the pre-irradiation line RS along the first reference line C1.

Next, the operation along the post-irradiation line RE is performed (Step S5m). The speed of the laser beam head is, for example, 6000 mm/min.

Figure 16:
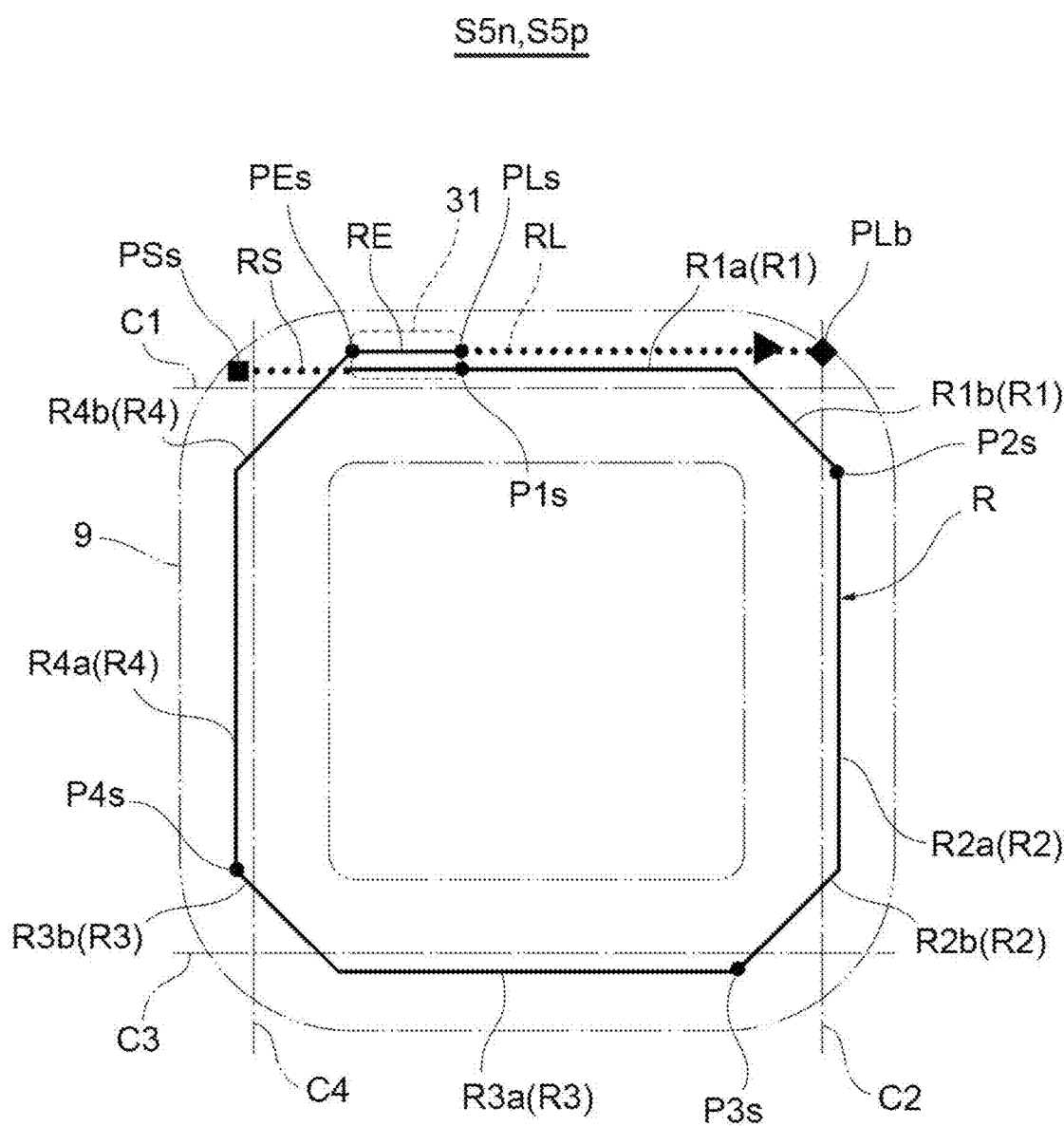
FIG. 16 is a diagram for describing processing along a release line.
Figure 17:
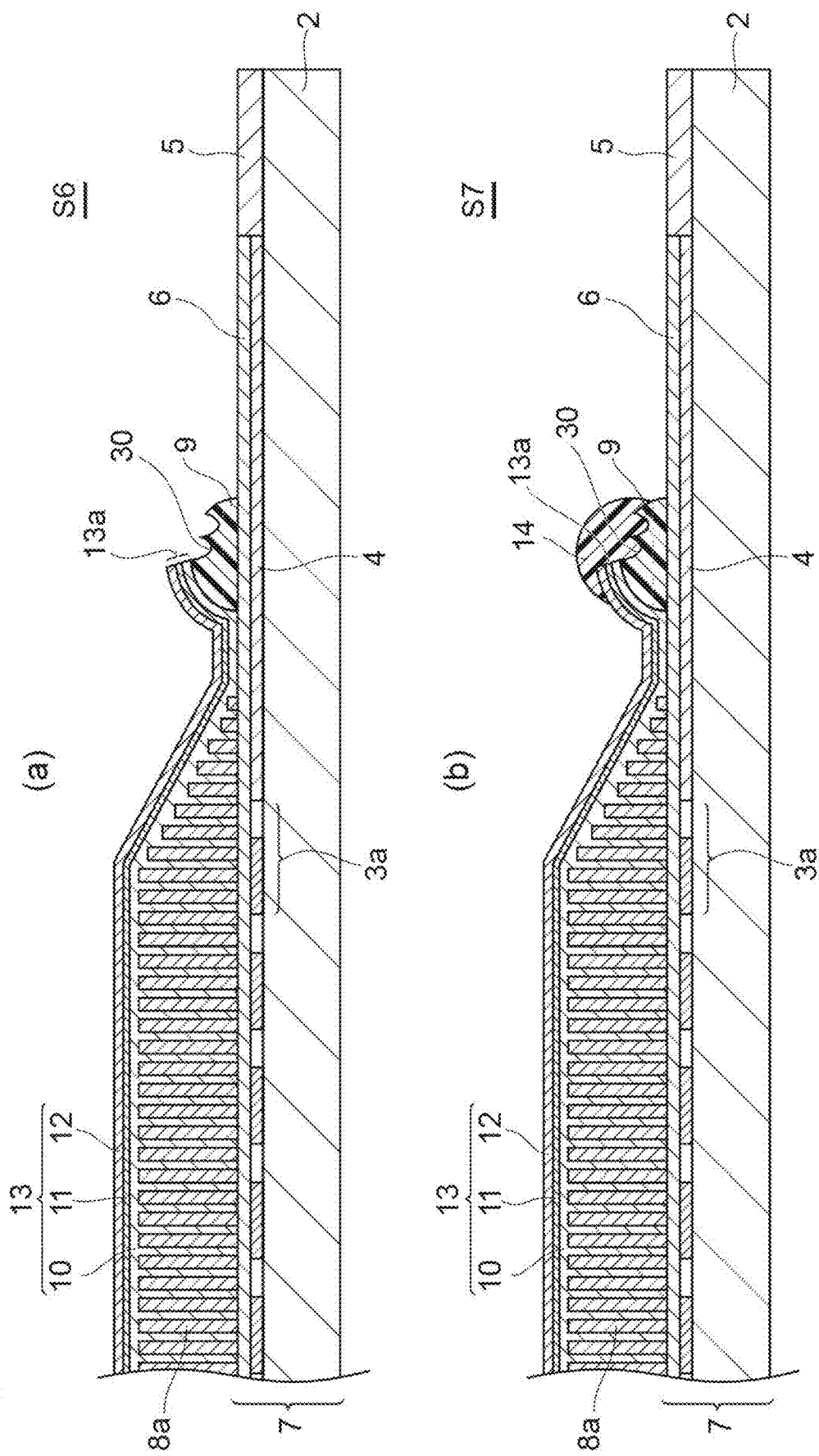
FIG. 17($a$) is a cross-sectional view illustrating a state where a part of a protective film is removed, and FIG. 17($b$) is a cross-sectional view illustrating a state where a coating resin is formed.

Then, the release line RL is defined (Step S5n: see FIG. 16). The release line RL is parallel to the first irradiation side portion R1a. The end point of the release line RL is set on the second reference line C2. In other words, the release line RL includes a part overlapping the first irradiation side portion R1a and a part overlapping the first irradiation corner portion R1b along the first reference line C1.

Next, the operation along the release line RL is performed (Step S5p). The speed of the laser beam head is, for example, 15000 mm/min. In other words, the speed of the laser beam head in the release line RL is faster than the speeds of the laser beam head in the first irradiation line R1, the second irradiation line R2, the third irradiation line R3, and the fourth irradiation line R4. As a result of this operation, the laser beam irradiation time per unit length is shortened. In other words, the irradiation energy given to the resin frame 9 gradually decreases. Further, in the operation along the release line RL, the distance from the resin frame 9 to the laser beam head is gradually increased. As a result of this operation, the focal position of the laser beam moves upward. In other words, the irradiation energy given to the resin frame 9 gradually decreases. As a result of these operations, a gradual decrease in groove depth can be achieved.

The protective film 13 is cut by executing Step S5 described above.

Subsequently, as illustrated in FIG. 17(a), the part outside the portion of the protective film 13 cut by the laser beam L is removed. As a result, the bonding pad 5 is exposed (Step S6). The part outside the cut portion includes a part on the side opposite to the incident surface. Subsequently, as illustrated in FIG. 17(b), coating with an uncured resin material is performed along the resin frame 9 (Step S7). The uncured resin material is provided so as to cover the outer edge 13a of the protective film 13 and the resin frame 9. The uncured resin material is, for example, an ultraviolet-curable acrylic resin or the like. Subsequently, the uncured resin material is irradiated with ultraviolet rays. As a result, the resin material is cured and the coating resin 14 is formed.

The resin material is supplied from a syringe needle to the top portion of the resin frame 9. In other words, the resin material is supplied to the highest position of the resin frame 9. In other words, the syringe needle is disposed such that the center line of the syringe needle overlaps the center line of the resin frame 9.

The resin material is supplied onto the resin frame 9 and flows toward the substrate 2 side along the surface of the resin frame 9. The destination position of the flow of the resin material on the surface of the resin frame 9 depends on the material properties of the resin material. Examples of the material properties include viscosity and thixotropy. High-viscosity resin materials are not easy to flow. In addition, thixotropy, which is viscosity changing with time, is a measure of the ease of shape retention. When a high-thixotropy material continues to undergo shear stress, the viscosity of the material decreases and the material becomes close to a liquid. On the other hand, a high-thixotropy material gradually increases in viscosity and becomes close to a solid when the material remains stationary. Both the viscosity and the thixotropy of the resin material used in the present embodiment are relatively high. Accordingly, it is relatively difficult for the resin material to flow along the surface of the resin frame 9 after supply to the surface.

For example, in a resin frame 109 of the comparative example that is illustrated in FIG. 18(a), a groove 130 is formed in the middle of the resin frame 109. Then, an uncured resin material 14S covers an overlapping part H1 on the surface of the protective film 13. The overlapping part H1 has an end portion including the outer edge 13a of the protective film 13. The outer edge 13a is an uneven surface as described above. Accordingly, deformation of the high-thixotropy resin material is hindered by the unevenness and it is difficult for the resin material to flow downward. As a result, it was difficult in some cases to sufficiently cover the outer edge 13a with the coating resin 14.

On the other hand, in the resin frame 9 of the present embodiment illustrated in FIG. 18(b), the groove 30 is formed on the outside of the resin frame 9. This outside is the bonding pad 5 side. In this configuration, the outer edge 13a of the protective film 13 is also formed from the outside (bonding pad 5 side). In other words, an overlapping part H2 of the protective film 13 formed on the resin frame 9 increases as compared with the comparative example. As a result, the resin material 14S is capable of covering a sufficient region including the outer edge 13a with the uncured resin material 14S supplied on the resin frame 9. Further, the scintillator layer 8 side of the resin material 14S is sufficiently separated from the outer edge 13a. As a result, the resin material 14S is unlikely to be affected by the unevenness of the outer edge 13a. Accordingly, the uncured resin material 14S is likely to flow downward and the overlapping region can be further expanded. In other words, the outer edge 13a can be sufficiently covered with the coating resin 14 by the position of the groove 30 being formed so as to be biased from the center of the resin frame 9.

The groove 30 of the embodiment has another advantageous effect in forming the coating resin 14. See FIG. 18(a) again. The resin frame 109 of the comparative example was formed by irradiating the same position twice with a laser beam. As a result, the depth of the groove 130 increases. In other words, the ratio between the opening width and the depth of the groove 130 is large. In other words, the groove 130 is deep and narrow. It is difficult for the high-viscosity and high-thixotropy resin material 14S to enter the groove 130. As a result, the entire groove 130 is not filled with the resin material 14S. Accordingly, a sealed cavity portion 130S may be formed at the bottom of the groove 130. In the presence of the sealed cavity portion 130S, the air in the cavity portion 130S expands when, for example, heat is applied to the substrate 2. This air expansion may adversely affect the protective film 13 and the scintillator layer 8.

On the other hand, as for the groove 30 of the embodiment illustrated in FIG. 18(b), the ratio between the opening width and the depth of the groove 30 is smaller than the ratio in the comparative example. This is because the same position in the resin frame 9 is not irradiated with a laser beam a plurality of times. With the groove 30, the entire groove 30 is satisfactorily filled even with the resin material 14S, which is high in viscosity and thixotropy. As a result, the cavity portion 130S is not formed. Accordingly, it is possible to eliminate the adverse effects on the protective film 13 and the scintillator layer 8 that may arise during heat treatment.

The protective film 13 comes into close contact with the photoelectric conversion element array 7 via the resin frame 9 even without the coating resin 14. However, by forming the coating resin 14, the protective film 13 including the first organic film 10 is sandwiched between the resin frame 9 and the coating resin 14. In other words, the protective film 13 is fixed. As a result, the close contact of the protective film 13 on the photoelectric conversion element array 7 is further improved. Accordingly, the scintillator 8a is sealed by the protective film 13. As a result, moisture infiltration into the scintillator 8a can be prevented in a reliable manner. In other words, it is possible to prevent a decline in element resolution attributable to the deterioration of the scintillator 8a resulting from the moisture absorption of the scintillator 8a.

<Action and Effect>

The radiation detector 1 includes the photoelectric conversion element array 7 having the light receiving portion 3 including the plurality of photoelectric conversion elements 3a arranged one-dimensionally or two-dimensionally and the plurality of bonding pads 5 electrically connected to the photoelectric conversion elements 3a and disposed outside the light receiving portion 3, the scintillator layer 8 laminated on the photoelectric conversion element array 7 so as to cover the light receiving portion 3 and converting radiation into light, the resin frame 9 formed on the photoelectric conversion element array 7 so as to pass between the scintillator layer 8 and the bonding pad 5 and surround the scintillator layer 8 apart from the scintillator layer 8 and the bonding pad 5 when viewed in the lamination direction A of the scintillator layer 8, and the protective film 13 covering the scintillator layer 8 and having the outer edge 13a positioned on the resin frame 9. The groove 30 continuous with the outer edge 13a of the protective film 13 is formed in the resin frame 9. The groove 30 has the overlapping region 31 including the first groove end portion 32 and the second groove end portion 33 partially overlapping in a direction intersecting with the extension direction of the groove 30.

The groove 30 of the resin frame 9 of the radiation detector 1 is continuous with the outer edge 13a of the protective film 13. Accordingly, the groove 30 is formed as the outer edge 13a of the protective film 13 is formed by laser beam irradiation. When the groove 30 is formed in the resin frame 9, the protective film 13 formed on the resin frame 9 is cut in a reliable manner. The groove 30 includes the overlapping region 31 including the first groove end portion 32 and the second groove end portion 33. By the first groove end portion 32 and the second groove end portion 33 overlapping in part, the depth of the groove 30 does not excessively increase in the overlapping region 31. As a result, it is possible to prevent a laser beam from reaching not only the protective film 13 but also the resin frame 9. In other words, the protective film 13 can be cut in a reliable manner. Further, the surface of the photoelectric conversion element array 7 provided with the resin frame 9 does not undergo damage attributable to laser beam irradiation. Accordingly, the occurrence of a defective product is suppressed and productivity can be improved.

The first groove end portion 32 and the second groove end portion 33 partially overlap in a direction intersecting with the extension direction of the groove 30. In other words, the first groove end portion 32 communicates with the second groove end portion 33 at the point where the first groove end portion 32 and the second groove end portion 33 partially overlap. Accordingly, on the resin frame 9, the protective film 13 can be reliably separated into the protective film 13 on the scintillator layer 8 side and the protective film 13 on the bonding pad 5 side. As a result, the protective film 13 on the bonding side can be removed without damage to the photoelectric conversion element array 7.

The radiation detector 1 further includes the coating resin 14 covering the outer edge 13a of the protective film 13. According to this configuration, the occurrence of peeling of the protective film 13 can be suppressed.

The coating resin 14 further covers the resin frame 9. The viscosity and the thixotropy of the coating resin 14 allow the coating resin 14 to stay on the resin frame 9 such that an edge portion 14e of the surface where the coating resin 14 and the resin frame 9 come into contact with each other is formed on the resin frame 9. According to this configuration, the coating resin 14 reaches neither the surface of the photoelectric conversion element array 7 positioned outside the resin frame 9 nor the bonding pad 5. Accordingly, each of the surface of the photoelectric conversion element array 7 and the bonding pad 5 can be kept clean.

The middle portion of the resin frame 9 is higher than both edge portions of the resin frame 9. The position of the groove 30 is biased to the bonding pad 5 side on the resin frame 9. According to this configuration, the coating resin 14 is capable of covering the outer edge 13a of the protective film 13 in a reliable manner.

The width of the resin frame 9 is 700 μm or more and 1000 μm or less. According to this configuration, the radiation detector 1 can be reduced in size.

The height of the resin frame 9 is 100 μm or more and 300 μm or less. According to this configuration, the radiation detector 1 can be reduced in size.

The photoelectric conversion element array 7 has a rectangular shape. The resin frame 9 has the first side portion 9a, the second side portion 9b, the third side portion 9c, and the fourth side portion 9d surrounding the scintillator layer 8. The first side portion 9a is provided with the overlapping region 31. According to this configuration, the occurrence of peeling of the protective film 13 can be further suppressed.

The method for manufacturing the radiation detector 1 has Step S2 of preparing the photoelectric conversion element array 7 having the light receiving portion 3 including the plurality of photoelectric conversion elements 3a arranged one-dimensionally or two-dimensionally and the plurality of bonding pads 5 electrically connected to the photoelectric conversion elements 3a and disposed outside the light receiving portion 3 and laminating the scintillator layer 8 converting radiation into light on the photoelectric conversion element array 7 so as to cover the light receiving portion 3, Step S3 of disposing the resin frame 9 on the photoelectric conversion element array 7 so as to surround the scintillator layer 8 when viewed in the lamination direction of the scintillator layer 8, Steps S4a, S4b, and S4c of forming the protective film 13 so as to cover the entire surface of the photoelectric conversion element array 7 on the side where the scintillator layer 8 is laminated and the surface of the resin frame 9, Step S5 of cutting the protective film 13 by performing laser beam irradiation along the resin frame 9, and Step S6 of removing the outside part of the protective film 13. In Step S5 of cutting the protective film 13, the outer edge 13a of the protective film 13 is formed by the protective film 13 being cut, the groove 30 continuous with the outer edge 13a of the protective film 13 is formed in the resin frame 9, and the laser beam irradiation is performed such that the groove 30 has the overlapping region 31 including the first groove end portion 32 and the second groove end portion 33 partially overlapping in a direction intersecting with the extension direction of the groove 30.

In the method for manufacturing the radiation detector 1, the outer edge 13a of the protective film 13 and the groove 30 of the resin frame 9 are formed in Step S5 of cutting the protective film 13. When the groove 30 is formed in the resin frame 9, the protective film 13 formed on the resin frame 9 is cut in a reliable manner. The groove 30 includes the overlapping region 31 including the first groove end portion 32 and the second groove end portion 33. By the first groove end portion 32 and the second groove end portion 33 overlapping in part, the depth of the groove 30 does not excessively increase in the overlapping region 31. As a result, it is possible to prevent a laser beam from penetrating not only the protective film 13 but also the resin frame 9. In other words, the protective film 13 can be cut in a reliable manner. In addition, the surface of the photoelectric conversion element array 7 provided with the resin frame 9 does not undergo damage attributable to laser beam irradiation. Accordingly, the occurrence of a defective product is suppressed and productivity can be improved.

In the method for manufacturing the radiation detector 1, the photoelectric conversion element array 7 has a rectangular shape. The resin frame 9 has the first side portion 9a, the second side portion 9b, the third side portion 9c, and the fourth side portion 9d surrounding the scintillator layer 8. In Step S5 of cutting the protective film 13, the first side portion 9a is provided with the overlapping region 31. According to this Step S5, the occurrence of peeling of the protective film 13 can be further suppressed.

In the method for manufacturing the radiation detector 1, Step S5 of cutting the protective film 13 includes Step S5s of setting at least one of the positions of the four corner portions configured by the first side portion 9a as a reference position and Step S5r of irradiating each first side portion 9a with a laser beam based on the reference position. According to these Steps S5s and S5r, the position where the laser beam irradiation is performed can be controlled with high accuracy.

In the method for manufacturing the radiation detector 1, the resin frame 9 is a panel protection portion. In Step S3 of disposing the resin frame 9, the resin frame 9 is disposed on the photoelectric conversion element array 7 so as to pass between the scintillator layer 8 and the bonding pad 5 and surround the scintillator layer 8 apart from the scintillator layer 8 and the bonding pad 5. According to this Step S3, the radiation detector 1 having the resin frame 9 can be manufactured.

In the method for manufacturing the radiation detector 1, the resin frame 9 is formed in Step S3 of disposing the resin frame 9 such that the middle portion of the resin frame 9 is higher than both edge portions of the resin frame 9. In Step S5 of cutting the protective film 13, laser beam irradiation is performed at a position biased to the bonding pad 5 side on the resin frame 9. According to these Steps S3 and S5, the coating resin 14 is capable of covering the outer edge 13a of the protective film 13 in a reliable manner.

The radiation detector of the present invention has been described in detail based on the first embodiment. However, the radiation detector of the present invention is not limited to the first embodiment. The present invention can be variously modified within the gist of the present invention. For example, the protective film 13 had a structure in which the inorganic film 11 was sandwiched between the first organic film 10 and the second organic film 12 made of polyparaxylylene. In other words, the material of the first organic film 10 was the same as the material of the second organic film 12. For example, the material of the first organic film 10 may be different from the material of the second organic film 12. In addition, the protective film 13 may lack the second organic film 12 when a material resistant to corrosion is used as the inorganic film 11. The light receiving portion 3 of the radiation detector 1 had the plurality of photoelectric conversion elements 3a arranged two-dimensionally. The light receiving portion 3 may have the plurality of photoelectric conversion elements 3a that are arranged one-dimensionally. The bonding pad 5 may be formed on two sides of the rectangular radiation detector 1. Further, the bonding pad 5 may be formed on three sides of the rectangular radiation detector 1. In addition, in the first embodiment, a method for performing laser processing by moving a laser beam head has been described. For example, laser beam irradiation may be performed while a stage where the radiation detector 1 is placed is moved.

<Second Embodiment>

A radiation detector 1A of the second embodiment and a method for manufacturing the radiation detector 1A will be described. In the radiation detector 1 of the first embodiment, the resin frame 9 is used as a panel protection portion. Specifically, the resin frame 9 is used as a member protecting the photoelectric conversion element array 7 from a laser beam in the step of cutting the protective film 13 in manufacturing the radiation detector 1. The radiation detector 1 includes the resin frame 9 as a component.

Figure 25:
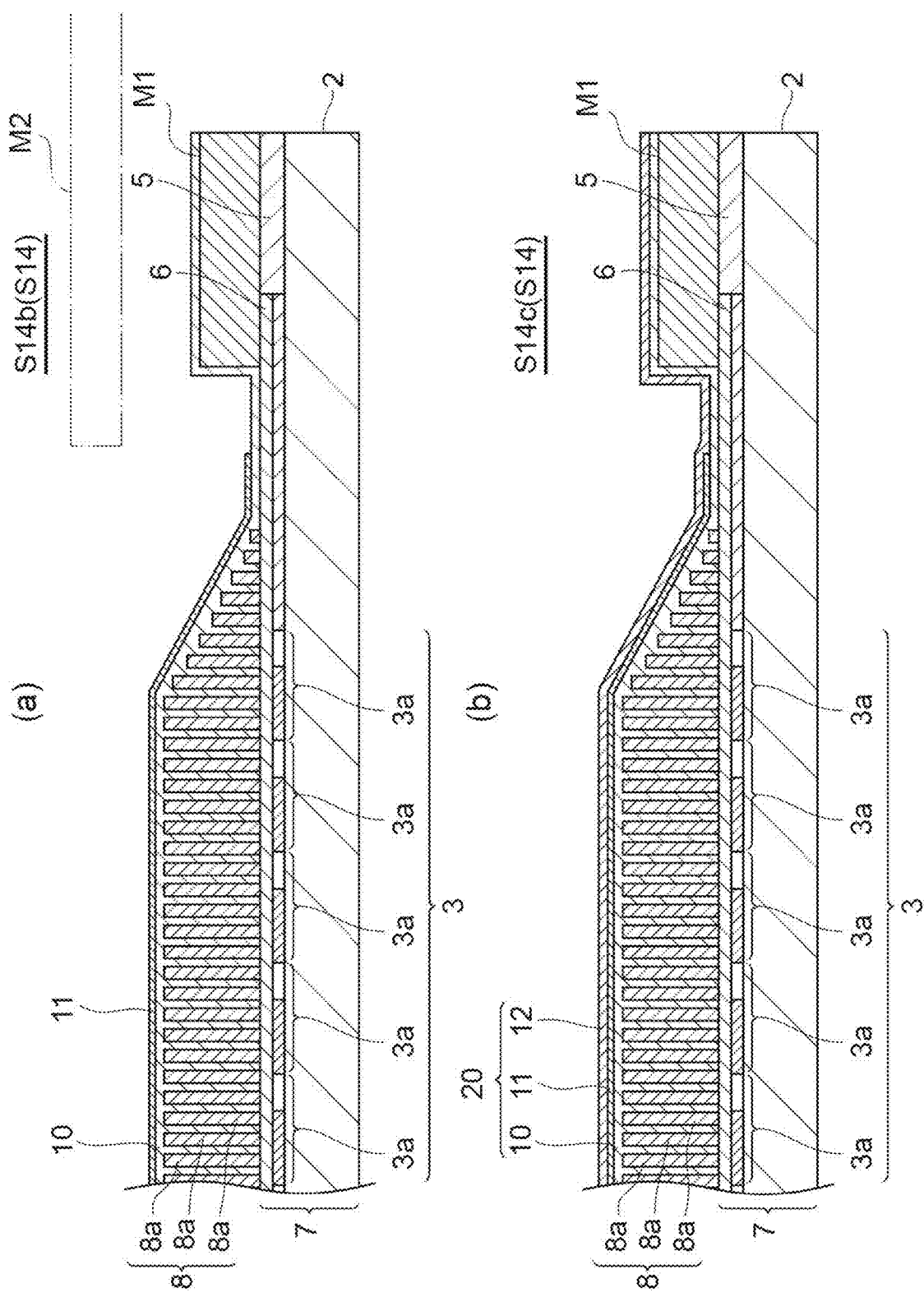
FIG. 25($a$) is a cross-sectional view illustrating a state where the inorganic film is formed, and FIG. 25($b$) is a cross-sectional view illustrating a state where the second organic film is formed.

In the radiation detector 1A of the second embodiment, a masking member M1 (see FIG. 25 and so on) is used as a member protecting the photoelectric conversion element array 7 from a laser beam in cutting the protective film 13. The masking member M1 is removed after Step S15 of cutting a protective film 20. The radiation detector 1A does not include the masking member M1 as a component.

Figure 19:
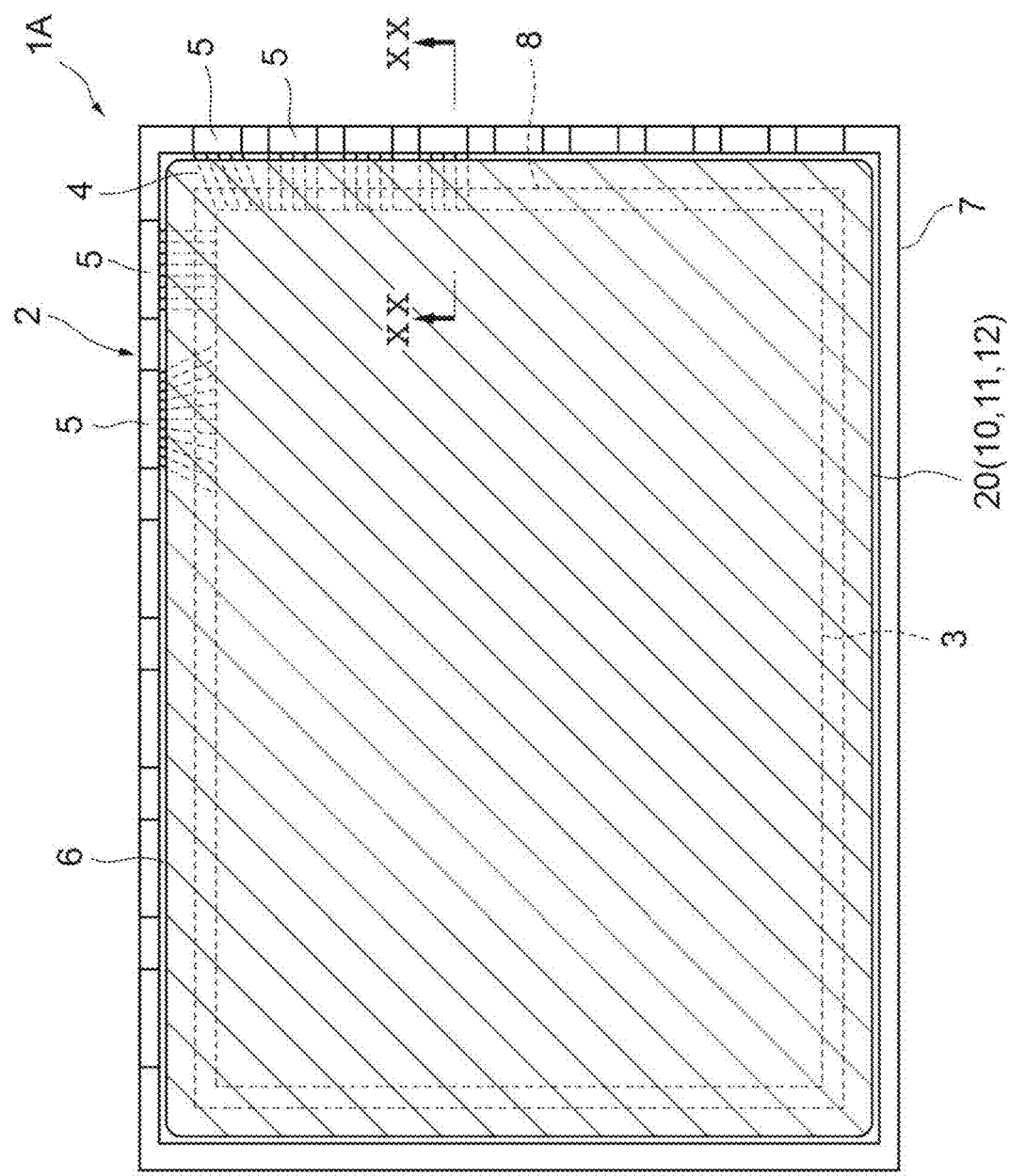
FIG. 19 is a plan view of a radiation detector of a second embodiment.
Figure 20:
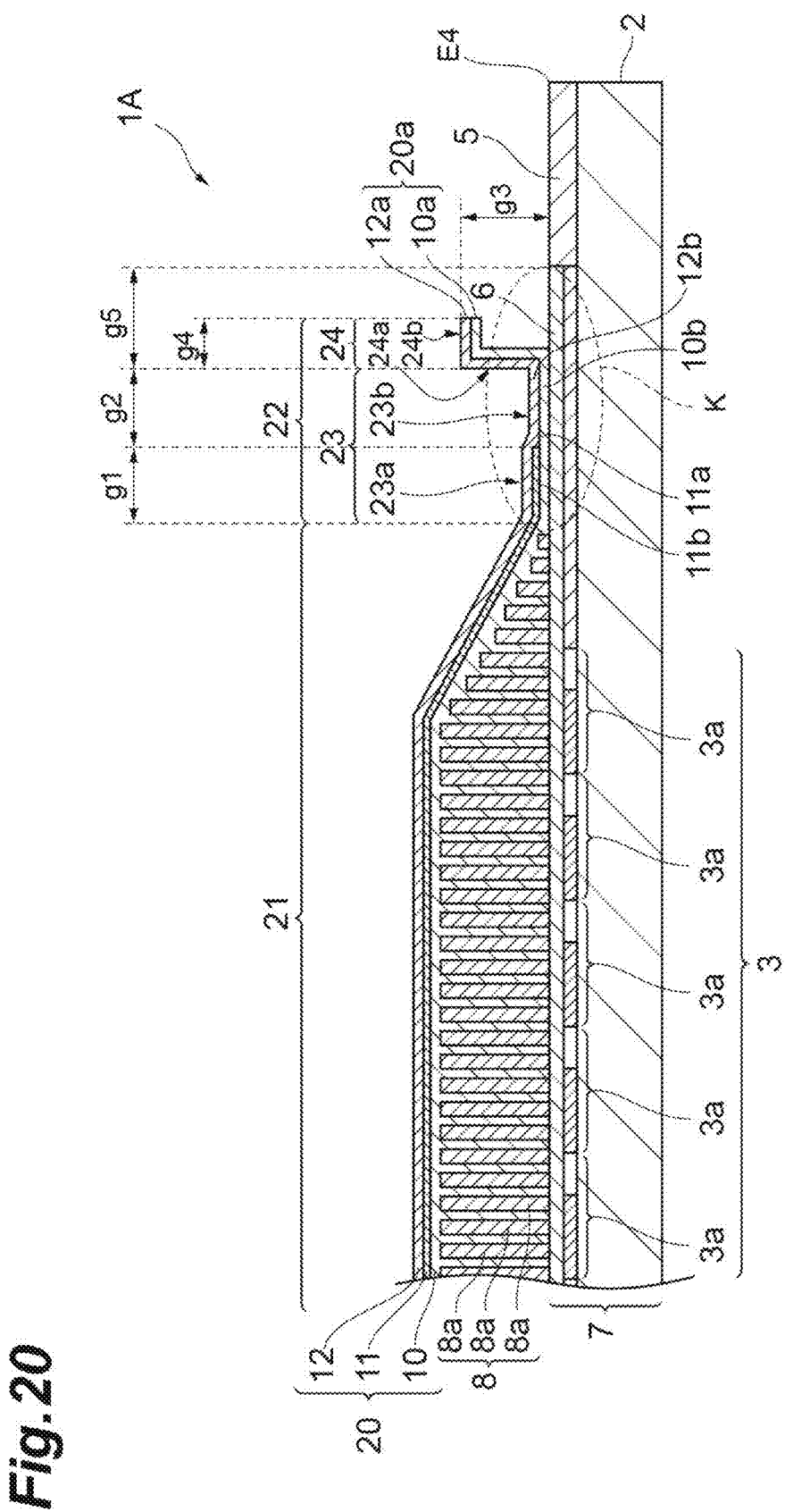
FIG. 20 is a cross-sectional view taken along line XX-XX of FIG. 19.

As illustrated in FIGS. 19 and 20, the radiation detector 1A includes the photoelectric conversion element array 7, the scintillator layer 8, and the protective film 20. The photoelectric conversion element array 7 and the scintillator layer 8 are the same as those of the first embodiment. Accordingly, detailed description of the photoelectric conversion element array 7 and the scintillator layer 8 will be omitted. Hereinafter, the protective film 20 will be described in detail.

The protective film 20 has a main body portion 21 and an outer edge portion 22. The main body portion 21 covers the scintillator layer 8. The first organic film 10 in the main body portion 21 is provided on the scintillator layer 8. The spaces between the plurality of scintillators 8a having the columnar structure are filled with the first organic film 10. The outer edge portion 22 is provided outside the main body portion 21. The outer edge portion 22 is continuous with the main body portion 21.

The outer edge portion 22 has a close contact portion 23 and an extending portion 24. The close contact portion 23 is in close contact with the photoelectric conversion element array 7 in a region K between the scintillator layer 8 and the bonding pad 5. For example, a part of the first organic film 10 that is on the scintillator layer 8 side in the close contact portion 23 has a surface in close contact with the photoelectric conversion element array 7. As a result, the close contact portion 23 comes into close contact with the photoelectric conversion element array 7. By enlarging the close contact surface, the close contact of the photoelectric conversion element array 7 with the close contact portion 23 is enhanced. The enlargement of the close contact surface is, in other words, increasing the sum of a length g1 and a length g2 of the close contact portion.

The close contact portion 23 has a first part 23a and a second part 23b. The first part 23a is positioned on the main body portion 21 side. The first part 23a has the first organic film 10, the inorganic film 11, and the second organic film 12. The first part 23a is a three-layer structure. The second part 23b is positioned on the side opposite to the main body portion 21 with the first part 23a interposed therebetween. The second part 23b has the first organic film 10 and the second organic film 12. The second part 23b is a two-layer structure. An outer edge end 11a of the inorganic film 11 is positioned inside an outer edge end 20a of the protective film 20. In other words, the outer edge end 11a of the inorganic film 11 is positioned on the scintillator layer 8 side. At the first part 23a, the inorganic film 11 is sandwiched between an outer edge portion 10b of the first organic film 10 and an outer edge portion 12b of the second organic film 12. The second part 23b is positioned outside an outer edge portion 11b of the inorganic film 11. In other words, the second part 23b is positioned closer to the bonding pad 5 side than the outer edge portion 11b of the inorganic film 11. The outer edge portion 10b of the first organic film 10 is joined to the outer edge portion 12b of the second organic film 12 at the second part 23b. The first organic film 10 and the second organic film 12 may be integrated when the first organic film 10 and the second organic film 12 are made of the same material. In the close contact portion 23, the outer edge portion 10b of the first organic film 10 and the outer edge portion 12b of the second organic film 12 wrap the outer edge portion 11b of the inorganic film 11 in cooperation with each other.

The extending portion 24 has a two-layer structure made of the first organic film 10 and the second organic film 12. The extending portion 24 extends in a self-supporting state from the close contact portion 23 to the side opposite to the photoelectric conversion element array 7. The extending portion 24 is positioned on the side of the protective film 20 that is closest to the outer edge end 20a. The outer edge end 20a of the protective film 20 is configured by an outer edge end 10a of the first organic film 10 and an outer edge end 12a of the second organic film 12. The extending portion 24 has a rising portion 24a and a piece portion 24b. The rising portion 24a extends in the normal direction of the surface of the photoelectric conversion element array 7 with the part of the close contact portion 23 that is on the side opposite to the main body portion 21 serving as a base end. Here, "self-supporting state" means a state where the rising portion 24a is upright without being held or supported by any member. Examples of the member include resin. The base end part of the rising portion 24a is connected to the close contact portion 23. The part of the rising portion 24a other than the base end part is not in contact with any element of the radiation detector 1A.

The rising portion 24a extends in a self-supporting state in the normal direction of the surface of the photoelectric conversion element array 7. In other words, the rising portion 24a is upright from the photoelectric conversion element array 7. The extension direction of the rising portion 24a is not limited thereto. The rising portion 24a may extend in a self-supporting state along a direction intersecting with the direction that is parallel to the surface of the photoelectric conversion element array 7. For example, the rising portion 24a may be inclined to the bonding pad 5 side with a state where the rising portion 24a is upright from the photoelectric conversion element array 7 used as a reference. The rising portion 24a may be inclined to the scintillator layer 8 side with a state where the rising portion 24a is upright from the photoelectric conversion element array 7 used as a reference. In addition, the shape of the rising portion 24a is not limited to a flat surface. The shape of the rising portion 24a may be, for example, a curved surface.

The piece portion 24b protrudes from the upper portion of the rising portion 24a toward the bonding pad 5 side. The direction in which the piece portion 24b protrudes is parallel to the surface of the photoelectric conversion element array 7. However, the direction in which the piece portion 24b protrudes is not limited to the direction parallel to the surface of the photoelectric conversion element array 7. The direction in which the piece portion 24b protrudes may be different from the direction in which the rising portion 24a extends. For example, the piece portion 24b may be inclined so as to gradually approach the photoelectric conversion element array 7 with a state where the piece portion 24b is parallel to the surface of the photoelectric conversion element array 7 used as a reference. The piece portion 24b may be inclined so as to be gradually separated from the photoelectric conversion element array 7. In addition, the shape of the piece portion 24b is not limited to a flat surface. The shape of the piece portion 24b may be, for example, a curved surface.

In FIG. 20, the length g1 and the length g2 indicate the length of the close contact portion 23. Specifically, the length g1 indicates the length of the first part 23a of the close contact portion 23. The length g2 indicates the length of the second part 23b of the close contact portion 23. The sum of the length g1 and the length g2 is, for example, approximately 1000 µm. Alternatively, the sum of the length g1 and the length g2 is, for example, 1000 µm or less. A length g3 is the height of the rising portion 24a. In other words, the length g3 is the height of the extending portion 24. The length g3 is, for example, 80 µm or more and 250 µm or less. A length g4 is the length of the piece portion 24b of the extending portion 24. The length g4 is, for example, approximately 300 µm. Alternatively, the length g4 is, for example, 300 µm or less. A length g5 is the distance from the boundary between the close contact portion 23 and the extending portion 24 to the bonding pad 5. The length g5 is longer than the length g4. For example, the length g5 is longer than the length g4 by approximately tens of micrometers to hundreds of micrometers. According to this configuration, the extending portion 24 does not interfere with the bonding pad 5.

Figure 21:
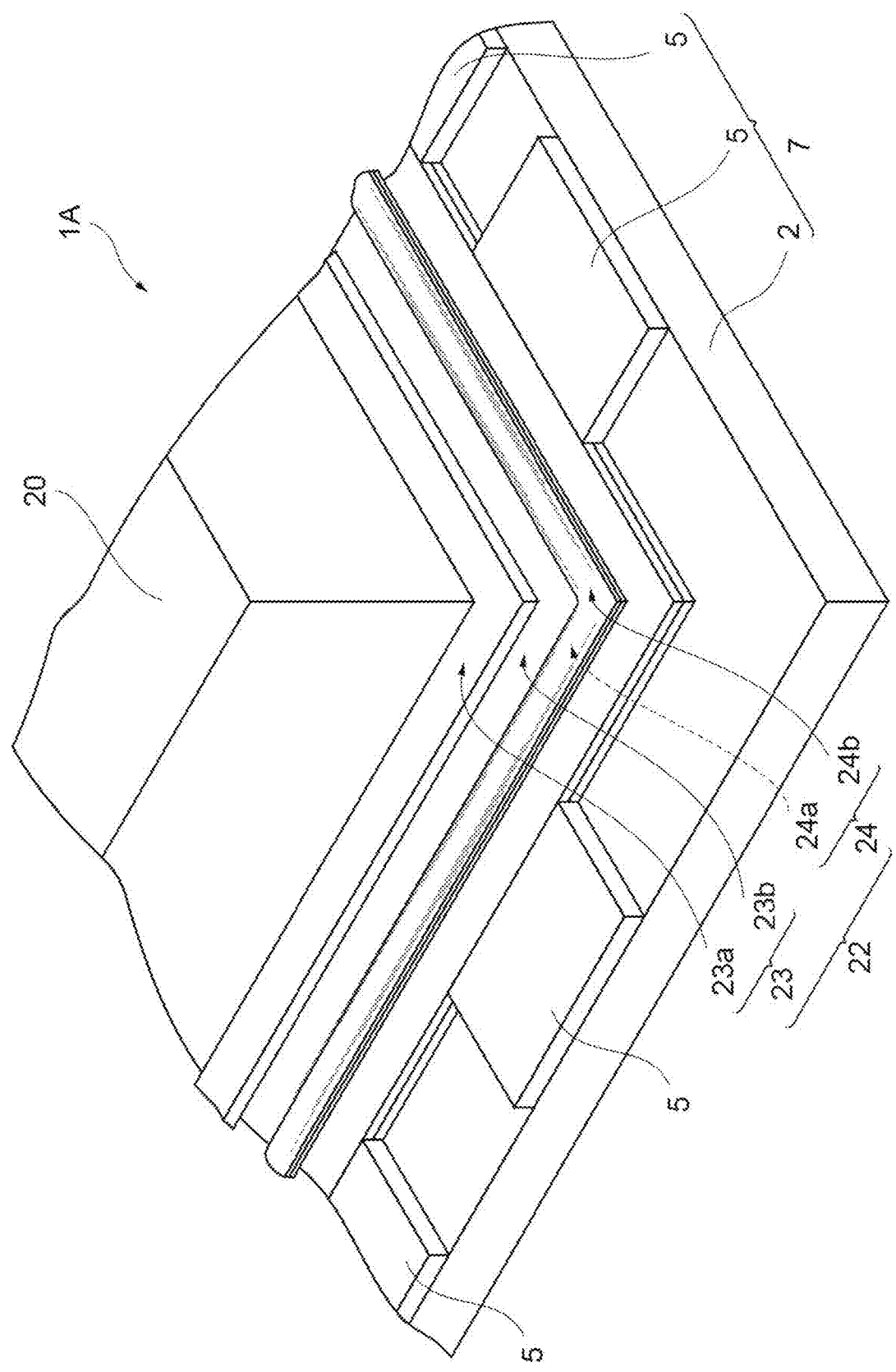
FIG. 21 is a first perspective view of the radiation detector of FIG. 19.
Figure 22:
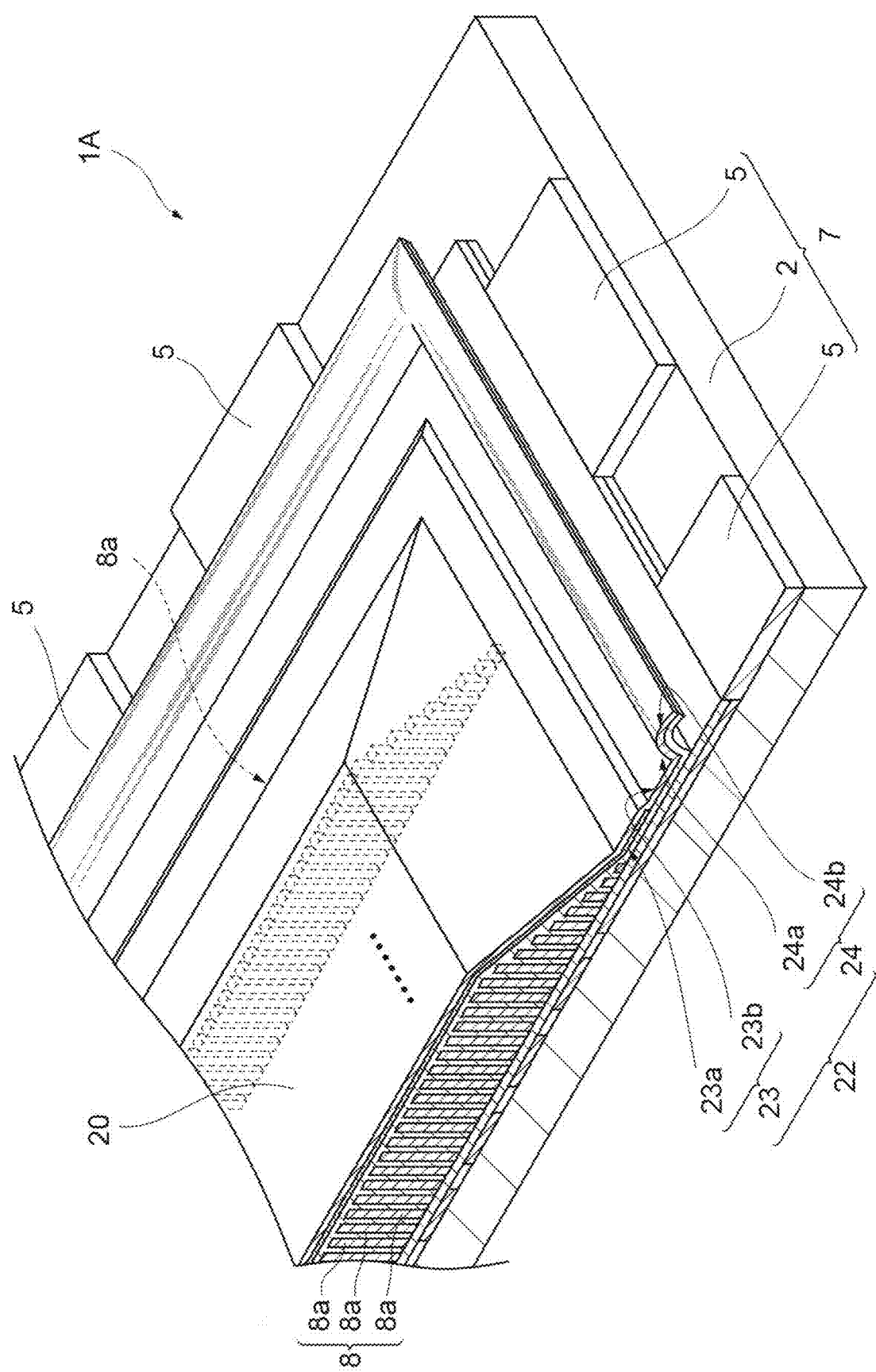
FIG. 22 is a second perspective view of the radiation detector of FIG. 19.

The external shape of the radiation detector 1A will be described. FIG. 21 is a perspective view schematically illustrating a corner part of the radiation detector 1A. FIG. 22 is a perspective view schematically illustrating the corner part of the radiation detector 1A viewed at an angle different from the angle in FIG. 21. It should be noted that a cross section of the scintillator layer 8 is illustrated in FIG. 22 such that the scintillator layer 8 covered with the protective film 20 is visible. In FIG. 22, the plurality of scintillators 8a having the columnar structure are indicated by dashed lines. As is apparent from the drawings including FIGS. 21 and 22, the outer edge portion 22 of the protective film 20 has the close contact portion 23 and the extending portion 24. The rising portion 24a is inclined to the bonding pad 5 side. It should be noted that the piece portion 24b may also be inclined to the bonding pad 5 side. In addition, the part where the rising portion 24a and the piece portion 24b are connected is not bent at a right angle. In other words, the part where the rising portion 24a and the piece portion 24b are connected may be bent smoothly.

<Action and Effect of Radiation Detector>

The action and effect of the radiation detector 1A will be described. In the radiation detector 1A, the outer edge portion 22 of the protective film 20 covering the scintillator layer 8 has the close contact portion 23 coining into close contact with the photoelectric conversion element array 7. With the close contact portion 23, it is possible to prevent moisture from entering toward the scintillator layer 8 from between the protective film 20 and the photoelectric conversion element array 7. Further, the outer edge portion 22 of the protective film 20 has the extending portion 24. The extending portion 24 extends in a self-supporting state along the direction opposite to the direction from the close contact portion 23 toward the photoelectric conversion element array 7. When the outer edge portion 22 of the protective film 20 does not have the extending portion 24, the outer edge end 20a of the protective film 20 is included in the close contact portion 23. In that case, it becomes difficult to ensure a close contact between the part of the close contact portion 23 where the outer edge end 20a of the protective film 20 is positioned and the photoelectric conversion element array 7 in particular. As a result, moisture is likely to intrude into the scintillator layer 8 from between the close contact portion 23 and the photoelectric conversion element array 7.

On the other hand, the outer edge portion 22 of the protective film 20 in the radiation detector 1A has the extending portion 24. The outer edge end 20a of the protective film 20 is not included in the close contact portion 23. In other words, a close contact between the close contact portion 23 and the photoelectric conversion element array 7 can be ensured sufficiently. As a result, the moisture resistance of the scintillator layer 8 can be improved as compared with a case where the extending portion 24 is not provided. Accordingly, the moisture resistance of the scintillator layer 8 can be maintained even without holding the outer edge portion of the protective film 20 with a resin member (resin frame 9) as in the first embodiment. Further, the region K between the scintillator layer 8 and the bonding pad 5 can be narrowed since it is not necessary to provide the resin member supporting the outer edge portion of the protective film 20. For example, when the width of the resin frame 9 is approximately 900 µm, the region K can be reduced by the length that corresponds to the width of the resin frame 9. Accordingly, the radiation detector 1A is capable of ensuring the moisture resistance of the scintillator layer 8 and suppressing enlargement of the region K between the scintillator layer 8 and the bonding pad 5. In other words, the radiation detector 1A is capable of reducing the region K. As a result, the length of the signal line 4 electrically connecting the light receiving portion 3 to the bonding pad 5 can be reduced. Accordingly, electric signal transmission can be expedited. In addition, an increase in noise can be suppressed since the signal line 4 is short.

The protective film 20 has the inorganic film 11, the first organic film 10, and the second organic film 12. The first organic film 10 is disposed on the scintillator layer 8 side with respect to the inorganic film 11. The second organic film 12 is disposed on the side opposite to the scintillator layer 8 with respect to the inorganic film 11. By the protective film 20 including the inorganic film 11, it is possible to prevent the light generated in the scintillator layer 8 from leaking to the outside. In other words, it is possible to prevent the light generated in the scintillator layer 8 from leaking to a part other than the light receiving portion 3. As a result, the sensitivity of the radiation detector 1A is improved. The first organic film 10 and the second organic film 12 are provided on both sides of the inorganic film 11. According to this configuration, the first organic film 10 and the second organic film 12 are also capable of protecting the inorganic film 11.

The outer edge end 11a of the inorganic film 11 is positioned inside the outer edge end 20a of the protective film 20. The outer edge end 20a of the protective film 20 is configured by the outer edge end 10a of the first organic film 10 and the outer edge end 12a of the second organic film 12. The outer edge portion 10b of the first organic film 10 is joined to the outer edge portion 12b of the second organic film 12 outside the outer edge end 11a of the inorganic film 11. The outer edge portion 10b of the first organic film 10 and the outer edge portion 12b of the second organic film 12 cover the outer edge portion 11b of the inorganic film 11. The outer edge portion 11b of the inorganic film 11 is sealed by the outer edge portion 10b of the first organic film 10 and the outer edge portion 12b of the second organic film 12 even when, for example, the close contact between the inorganic film 11 and the first organic film 10 or the close contact between the inorganic film 11 and the second organic film 12 is not satisfactory. Accordingly, a close contact of the second organic film 12 with the first organic film 10 can be ensured.

The inorganic film 11 is a metal film made of aluminum or silver. Accordingly, the inorganic film 11 can be satisfactory in terms of light reflectivity.

The height of the extending portion 24 is 80 µm or more and 250 µm or less. Accordingly, the moisture resistance of the scintillator layer 8 can be ensured more reliably.

The extending portion 24 has the rising portion 24a and the piece portion 24b. The piece portion 24b protrudes from the upper portion of the rising portion 24a toward the bonding pad 5. The extending portion 24 has not only the rising portion 24a but also the piece portion 24b. Accordingly, the outer edge end 20a of the protective film 20 can be at a sufficient distance from the close contact portion 23. As a result, a close contact of the photoelectric conversion element array 7 with the close contact portion 23 can be ensured more reliably. Even in this case, the length of the piece portion 24b is, for example, approximately 300 μm. Alternatively, the length of the piece portion 24b is, for example, 300 μm or less. Accordingly, the region K between the scintillator layer 8 and the bonding pad 5 can be reduced.

When a conductive member such as a wire is bonded to the bonding pad 5 in a wiring process or the like, foreign matter or the like may fly from the bonding part toward the scintillator layer 8 side. In that case, the extending portion 24 functions as a protective wall protecting the scintillator layer 8 from the foreign matter or the like. As a result, contamination of the scintillator layer 8 during bonding can be prevented.

The photoelectric conversion element array 7 may be expensive. It is conceivable to reuse the photoelectric conversion element array 7 when the radiation detector 1A is substandard in terms of quality or the like as a result of inspection in the manufacturing process. In that case, the scintillator layer 8 that is new is provided on the photoelectric conversion element array 7 after the scintillator layer 8 provided on the photoelectric conversion element array 7 is removed. Removal of the protective film 20 is required for that purpose. According to the radiation detector 1A of the present embodiment, the outer edge portion 22 of the protective film 20 has the extending portion 24. During peeling of the protective film 20 from the photoelectric conversion element array 7, for example, the extending portion 24 can be used as the starting point of the peeling, examples of which include gripping and pulling up the extending portion 24. Accordingly, with the extending portion 24, the protective film 20 can be removed with relative ease.

<Method for Manufacturing Radiation Detector>

Figure 23:
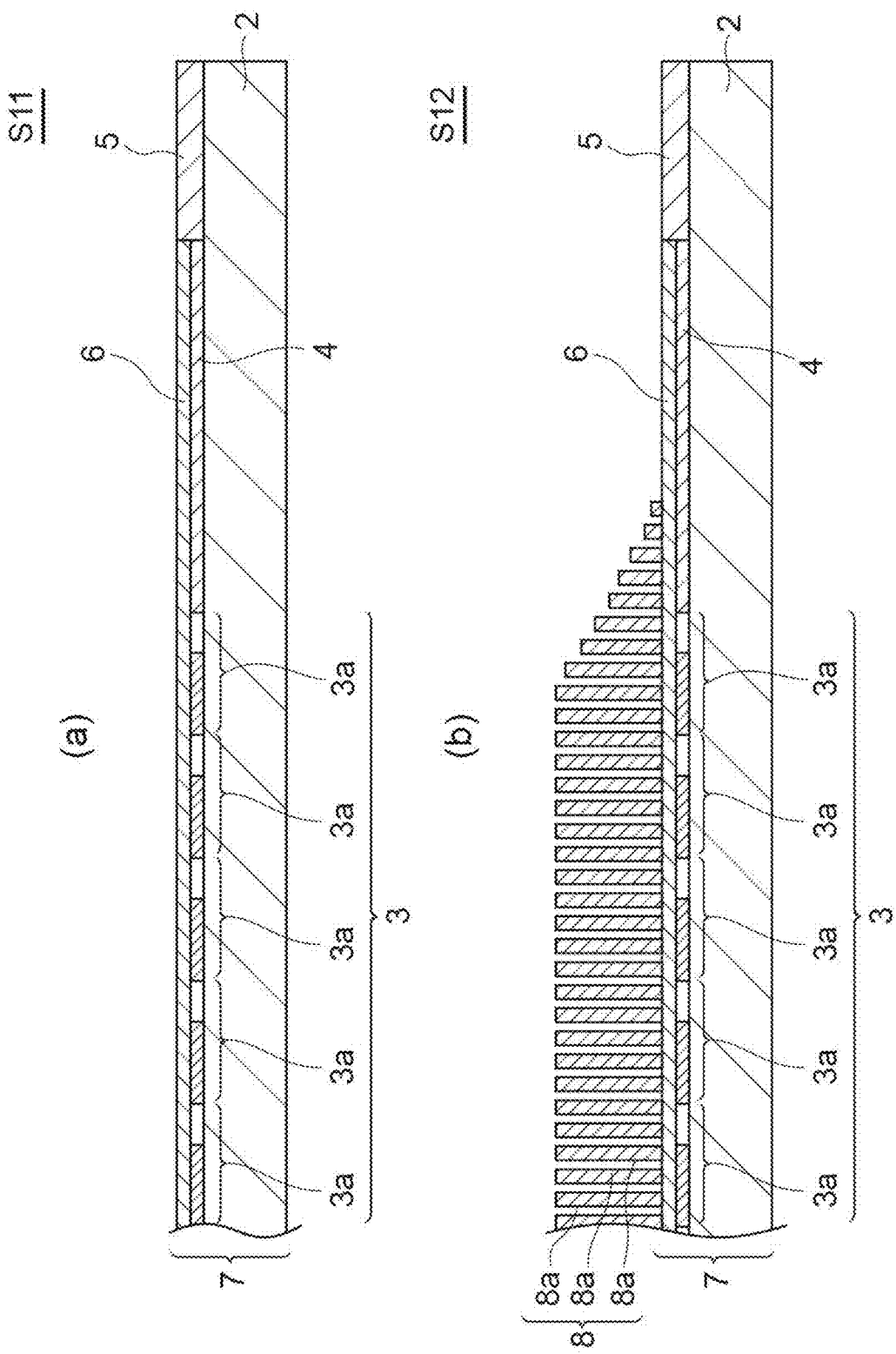
FIG. 23($a$) is a cross-sectional view illustrating a state where a scintillator layer is yet to be formed, and FIG. 23($b$) is a cross-sectional view illustrating a state where the scintillator layer is formed.

Next, each step of the method for manufacturing the radiation detector 1A will be described with reference to FIGS. 23 to 28. First, the photoelectric conversion element array 7 is prepared as illustrated in FIG. 23(a) (Step S11). Next, as illustrated in FIG. 23(b), the scintillator layer 8 is provided on the photoelectric conversion element array 7 so as to cover the light receiving portion 3 (Step S12).

Next, as illustrated in FIG. 24(a), the masking member M1 is provided on the photoelectric conversion element array 7 so as to cover the bonding pads 5 (Step S13). The masking member M1 is, for example, a UV-curable masking tape. Hereinafter, the UV-curable masking tape will be simply referred to as "UV tape". The plurality of bonding pads 5 are disposed along the outer edge side of the substrate 2. Accordingly, first, the longitudinal direction of the UV tape is matched with the direction in which the bonding pads 5 are disposed. Next, the adhesive surface of the UV tape is attached to the photoelectric conversion element array 7 such that the UV tape covers the bonding pads 5. The thickness of the UV tape may be, for example, approximately 110 μm. In addition, the thickness of the UV tape may be 110 μm or less. A plurality of the UV tapes may be used in layers so that the thickness of the masking member M1 is adjusted.

The protective film 20 is provided on the photoelectric conversion element array 7 so as to cover the scintillator layer 8, the region K, and the masking member M1 (Step S14). Specifically, first, the first organic film 10 is formed as illustrated in FIG. 24(b) (Step S14a). For example, the entire surface of the substrate 2 is coated with polyparaxylylene or the like by a CVD method. Next, the inorganic film 11 is formed on the first organic film 10 as illustrated in FIG. 25(a) (Step S14b). For example, an aluminum film is laminated on the inorganic film 11 by an evaporation method. Here, the bonding pad 5 may not be covered with the inorganic film 11. In that case, the aluminum film may be evaporated after the bonding pad 5 is masked by means of a masking member M2. A UV tape or the like may be used for the masking member M2. Subsequently, the second organic film 12 is formed as illustrated in FIG. 25(b) (Step S14c). For example, the entire surface of the substrate 2 is recoated with polyparaxylylene or the like by a CVD method.

Figure 26:
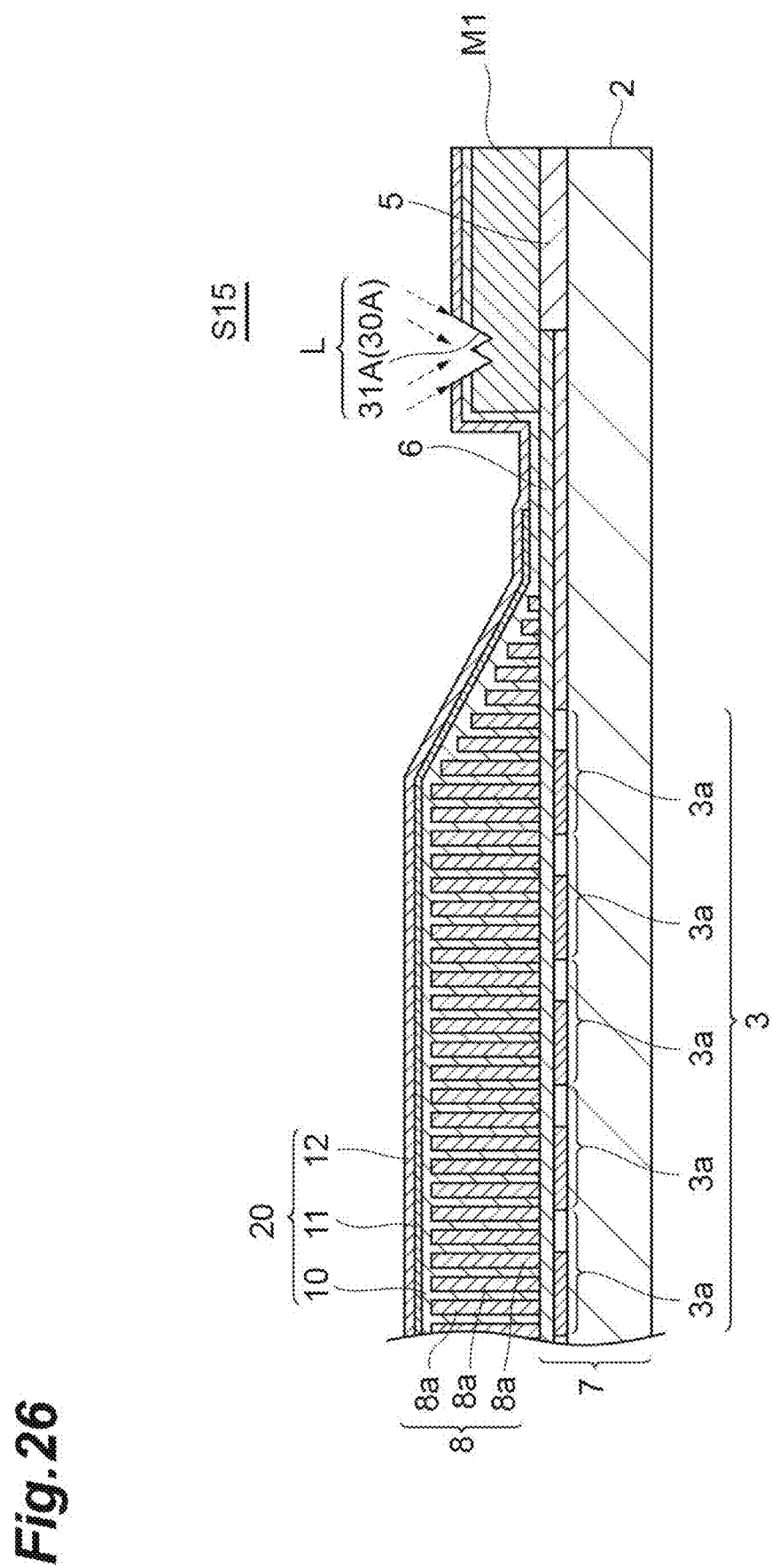
FIG. 26 is a cross-sectional view illustrating laser beam processing.

Subsequently, as illustrated in FIG. 26, the protective film 20 is cut on the masking member M1 by irradiation with the laser beam L (Step S15). For example, a laser beam head (not illustrated) performing irradiation with the laser beam L is moved with respect to a stage (not illustrated) where the substrate 2 is placed. As a result, scanning with the laser beam L is performed along the edge portion of the masking member M1 that is on the scintillator layer 8 side.

Figure 27:
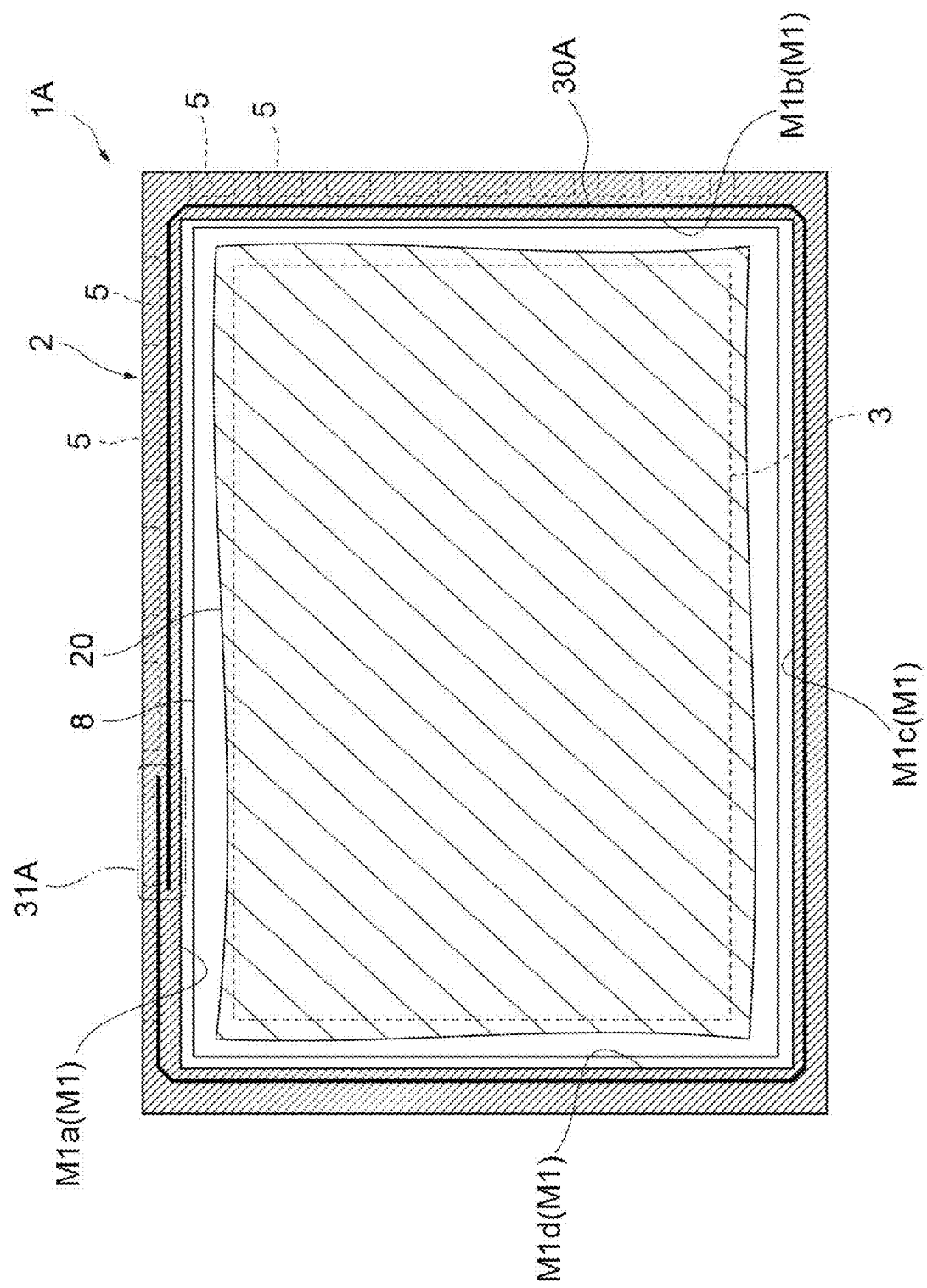
FIG. 27 is a plan view illustrating the resin frame of FIG. 19 and the groove provided in the resin frame.
Figure 28:
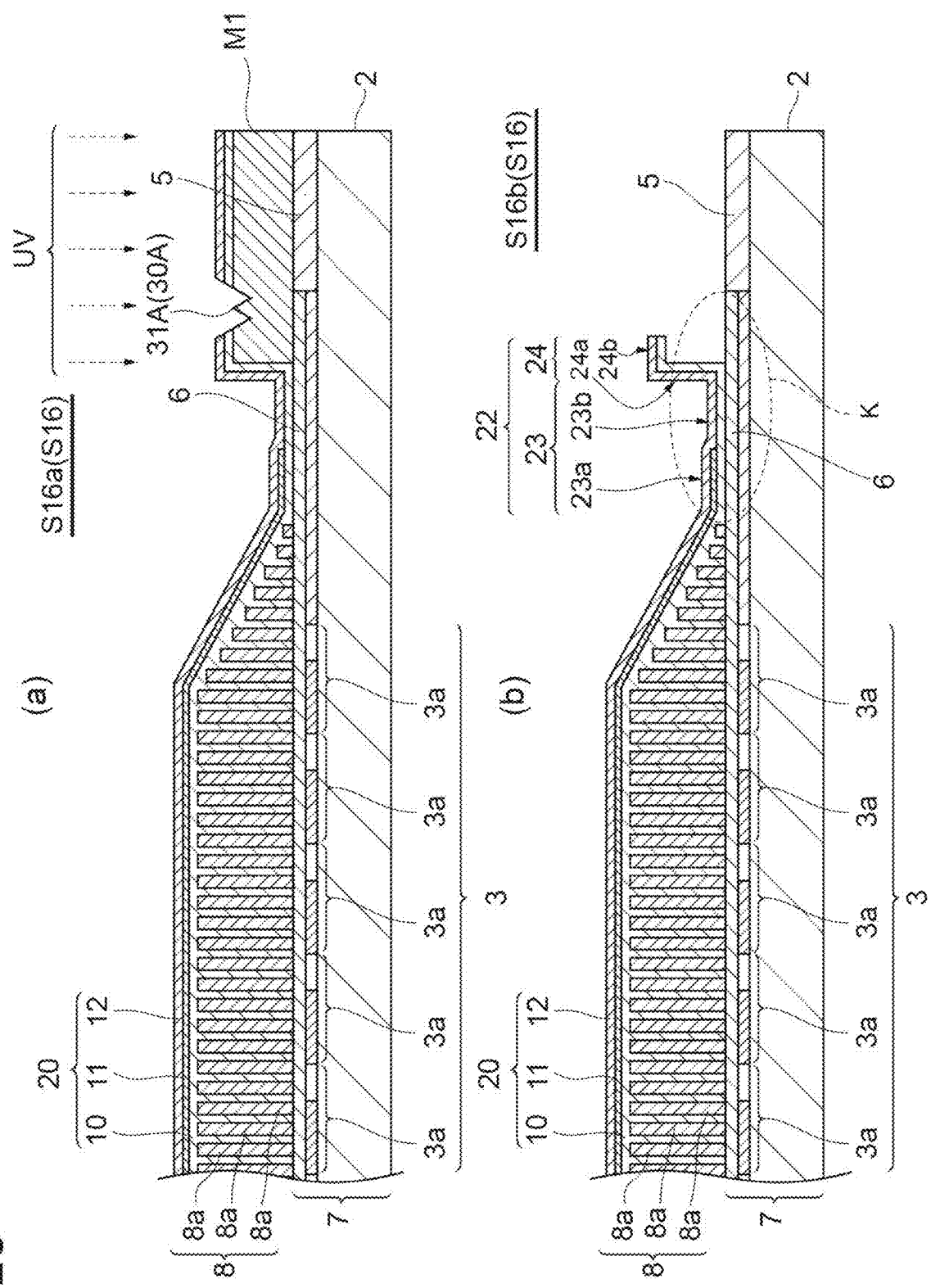
FIG. 28($a$) is a cross-sectional view illustrating masking member removal processing, and FIG. 28($b$) is a cross-sectional view illustrating a state where the masking member is removed.

In other words, the masking member M1 has a first side portion M1a, a second side portion M1b, a third side portion M1c, and a fourth side portion M1d as illustrated in FIG. 27. Subsequently, irradiation with the laser beam L is performed such that a groove 30A having an overlapping region 31A is formed in the first side portion M1a of the masking member M1. The specific step may be the same as Step S7 of the first embodiment.

The masking member M1 is removed (Step S16). Specifically, the masking member M1 is removed after the adhesive force of the adhesive surface of the masking member M1, which is a UV tape, is reduced. First, irradiation with ultraviolet rays is performed toward the masking member M1 as illustrated in FIG. 28(a) (Step S16a). The ultraviolet rays are transmitted through the protective film 20 and reach the masking member M1. The masking member M1 loses the adhesive force of the adhesive surface by being irradiated with the ultraviolet rays. Then, the masking member M1 is removed as illustrated in FIG. 28(b) (Step S16b). The part of the cut protective film 20 covering the masking member M1 is removed together with the masking member M1. As a result, the bonding pad 5 is exposed.

<Action and Effect>

In the method for manufacturing the radiation detector 1A, the masking member M1 is a panel protection portion. In Step S13 of disposing the masking member M1, the masking member M1 is disposed on the photoelectric conversion element array 7 so as to cover the region K between the scintillator layer 8 and the bonding pad 5 and the bonding pad 5. In Step S14 of forming the protective film 20, the protective film 20 is formed on the entire surface of the photoelectric conversion element array 7 on the side where the scintillator layer 8 is laminated and the surface of the masking member M1. According to this Step S14, the radiation detector 1A without the resin frame 9 can be manufactured. In other words, the distance between the scintillator layer 8 and the bonding pad 5 can be reduced. Accordingly, the radiation detector 1A can be further reduced in size.

The method for manufacturing the radiation detector 1A further includes Step S16b of removing the masking member M1 after Step S16a of removing the outside part of the protective film 20. According to these Steps S16a and S16b, the radiation detector 1A without the resin frame 9 can be manufactured in a suitable manner.

Figure 29:
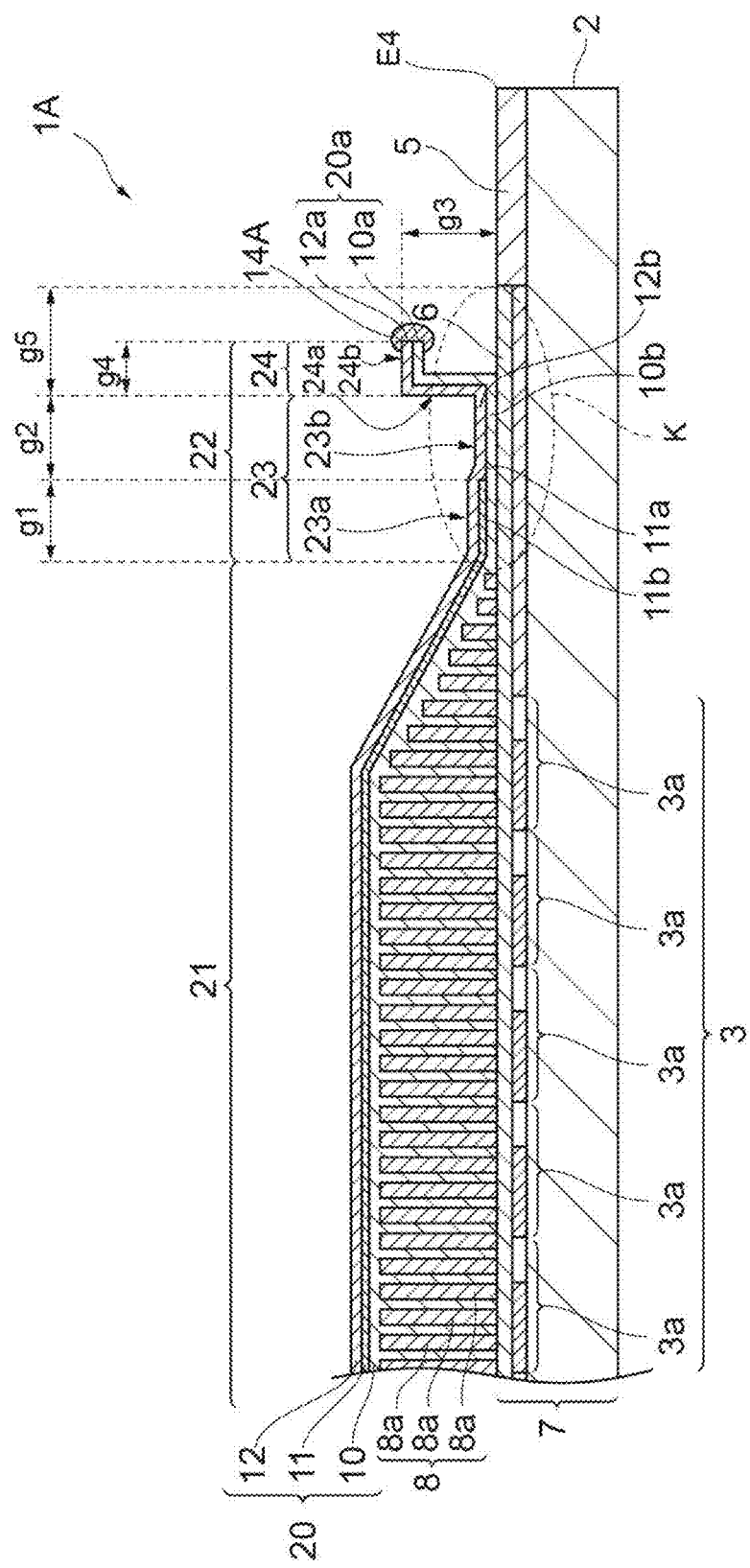
FIG. 29 is a cross-sectional view illustrating a radiation detector according to a modification example of the second embodiment.

As illustrated in FIG. 29, the method for manufacturing the radiation detector 1A may further include a step of forming a coating resin 14A covering the outer edge end 20a of the protective film 20 after Step S16a of removing the outside part of the protective film 20. According to this step, the occurrence of peeling of the outer edge end 20a of the protective film 20 can be further suppressed.

According to the method for manufacturing the radiation detector 1A, the bonding pad 5 is covered with the masking member M1. In addition, the scintillator layer 8, the region between the scintillator layer 8 and the bonding pad 5, and the masking member M1 are covered with the protective film 20. As a result, the protective film 20 has the close contact portion 23 coining into close contact with the photoelectric conversion element array 7 in the region K between the scintillator layer 8 and the bonding pad 5. In addition, a step attributable to the thickness of the masking member M1 is generated between an end surface of the masking member M1 and the photoelectric conversion element array 7. The protective film 20 is formed along the step. As a result, the protective film 20 has the extending portion 24 extending from the close contact portion 23 to the side opposite to the photoelectric conversion element array 7. Further, irradiation with the laser beam L is performed along the edge portion of the masking member M1 that is on the scintillator layer 8 side. As a result, the protective film 20 is cut on the masking member M1. Then, the masking member M1 is removed. As a result, the bonding pad 5 is exposed. Further, the extending portion 24 is self-supporting without contact with the masking member M1. In addition, the extending portion 24 has the rising portion 24a and the piece portion 24b. The rising portion 24a is formed along a step attributable to the edge of the masking member M1. The piece portion 24b is formed between the rising portion 24a and the edge portion of the masking member M1 irradiated with the laser.

The radiation detector 1A has the close contact portion 23 and the extending portion 24. The close contact portion 23 comes into close contact with the photoelectric conversion element array 7 in the region K between the scintillator layer 8 and the bonding pad 5. The extending portion 24 extends in a self-supporting state from the close contact portion 23 to the side opposite to the photoelectric conversion element array 7. Further, the extending portion 24 includes the rising portion 24a and the piece portion 24b. With these structures, the moisture resistance of the scintillator layer 8 can be maintained. Further, the region K between the scintillator layer 8 and the bonding pad 5 can be narrowed.

Here, it is also conceivable that the bonding pad 5 may be damaged as a result of irradiation with the laser beam L. However, in the method for manufacturing the radiation detector 1A, the bonding pad 5 is covered with the masking member M1 when the protective film 20 is cut. At this time, the masking member M1 serves as an absorption layer absorbing the laser beam L. Accordingly, it is possible to prevent the bonding pad 5 from being damaged by being irradiated with the laser beam L.

In the method for manufacturing the radiation detector 1A, the protective film 20 is cut by irradiation with the laser beam L (Step S15). According to Step S15, the close contact portion 23 and the extending portion 24 can be accurately molded in the outer edge portion 22 of the protective film 20. Even when the bonding pads 5 are disposed at predetermined intervals along a plurality of sides (for example, two to four sides) instead of one side of the outer edge of the substrate 2, scanning with the laser beam L may be performed for each side. Accordingly, the close contact portion 23 and the extending portion 24 can be easily molded in the outer edge portion 22.

Although the second embodiment has been described, the present invention is not limited to the second embodiment. For example, the outer edge end 11a of the inorganic film 11 may configure the outer edge end 20a of the protective film 20 together with the outer edge end 10a of the first organic film 10 and the outer edge end 12a of the second organic film 12.

The inorganic film 11 may be a resin film containing a white pigment. Examples of the white pigment include alumina, titanium oxide, zirconium oxide, and yttrium oxide. When a resin film containing a white pigment is the inorganic film 11, a metal film (for example, aluminum) and a third protective film (the same type of material as the first and second organic films) are further laminated in this order after the second organic film 12 is formed. Aluminum may be employed for the metal film. In addition, the same type of material as the first organic film may be employed for the third protective film. Further, the same type of material as the second organic film may be employed for the third protective film. According to these steps, moisture resistance comparable to that of a metallic reflective film can be obtained even with a resinous reflective film poor in moisture resistance. Further, the optical output that is obtained can be higher than that of a metallic reflective film. Even in this manner, the inorganic film 11 having light reflectivity can be realized.

<Third Embodiment>

Suppressed in the first embodiment is the formation of an excessively deep groove in the resin frame 9 attributable to a laser beam. Similarly suppressed in the second embodiment is the formation of an excessively deep groove in the masking member M1 attributable to a laser beam. The excessively deep grooves are attributable to the resin frame 9 and the masking member M1 being irradiated with excessive energy. Repeated laser beam irradiation at the same position of an irradiated body such as the resin frame 9 and the masking member M1 is one of the factors that result in the irradiation with the excessive energy. In this regard, a method for scanning line shifting has been presented in each of the first and second embodiments such that laser beam irradiation is not repeated at the same position.

Hereinafter, a method different from those of the first and second embodiments will be described. An example in which a method different from those of the first and second embodiments is applied to the manufacturing of the radiation detector 1 of the first embodiment will be described in the following description. It should be noted that the method of a third embodiment can also be applied to the manufacturing of the radiation detector 1A of the second embodiment.

In the laser beam irradiation for cutting the protective film 13 (Step S5), irradiation with excessive energy may result from a factor different from repeated laser beam irradiation at the same position of the irradiated body.

FIGS. 30(a) and 30(b) illustrate a concept of laser beam control. FIG. 30(a) is a time history of the energy that is received by the irradiated body. FIG. 30(b) is a time history of the speed of the laser beam head.

A cutting threshold is defined here. The cutting threshold is a value. The irradiated body is cut when irradiated with energy that is equal to or greater than this value. It should be noted that "cutting" in this specification means the formation of a void in the irradiated body and the void penetrates the irradiated body from the surface that is subject to laser beam irradiation to the surface that is the back with respect to the surface subject to the laser beam irradiation. Accordingly, the term of "cutting" does not pertain to a case where a bottom is provided without penetration from the surface subject to the laser beam irradiation to the back surface.

The cutting threshold is determined in accordance with the type of a material, the thickness of an object, and so on. To exemplify the radiation detector 1 of the first embodiment, a cutting threshold Q1 related to the protective film 13 and a cutting threshold Q2 related to the resin frame 9 are set as illustrated in FIG. 30(a). The cutting threshold Q2 related to the resin frame 9 is larger than the cutting threshold Q1 related to the protective film 13. In Step S5 of cutting the protective film 13, the protective film 13 is cut and the resin frame 9 is not cut. Then, in FIG. 30(a), the energy (Qs) of the laser beam to be emitted may be between the cutting threshold Q2 related to the resin frame 9 and the cutting threshold Q1 related to the protective film 13.

The time at which the energy of the laser beam rises from zero (non-irradiation) to a predetermined level on the surface of the irradiated body when the laser beam irradiation is initiated (t1 in FIG. 30(a)) is much shorter than the time when the laser beam head reaches a predetermined movement speed from a movement speed of zero (t1 to t3 in FIG. 30(b)).

Then, the energy (Q3 to Qs) of the laser beam that the irradiated body receives per unit time (length) in the acceleration period (t1 to t3) from the zero movement speed to the predetermined laser beam head movement speed is different from the energy (Qs) of the laser beam that the irradiated body receives per unit time (length) in the steady period (t3 to t4) when the laser beam head moves at a predetermined speed. Specifically, the movement speed (Vs) of the laser beam head in the steady period (t3 to t4) exceeds the movement speed (0 to Vs) of the laser beam head in the acceleration period (t1 to t3). Accordingly, the energy (Q3 to Qs) of the laser beam that the irradiated body receives in the acceleration period (t1 to t3) exceeds the energy (Qs) of the laser beam that the irradiated body receives in the steady period (t3 to t4). Accordingly, assuming that the laser beam head is too slow with respect to the energy of the laser beam in the acceleration period (t1 to t3), the irradiated body may be irradiated with excessive energy. Assuming that this energy exceeds the energy (Q2) at which the resin frame 9 is cut, the photoelectric conversion element array 7 under the resin frame 9 may be damaged.

Such a phenomenon may also occur when the laser beam irradiation is stopped. In this regard, the mode of laser beam irradiation is controlled when the irradiation is started and when the irradiation is ended such that the energy received by the irradiated body does not become excessive.

Figure 31:
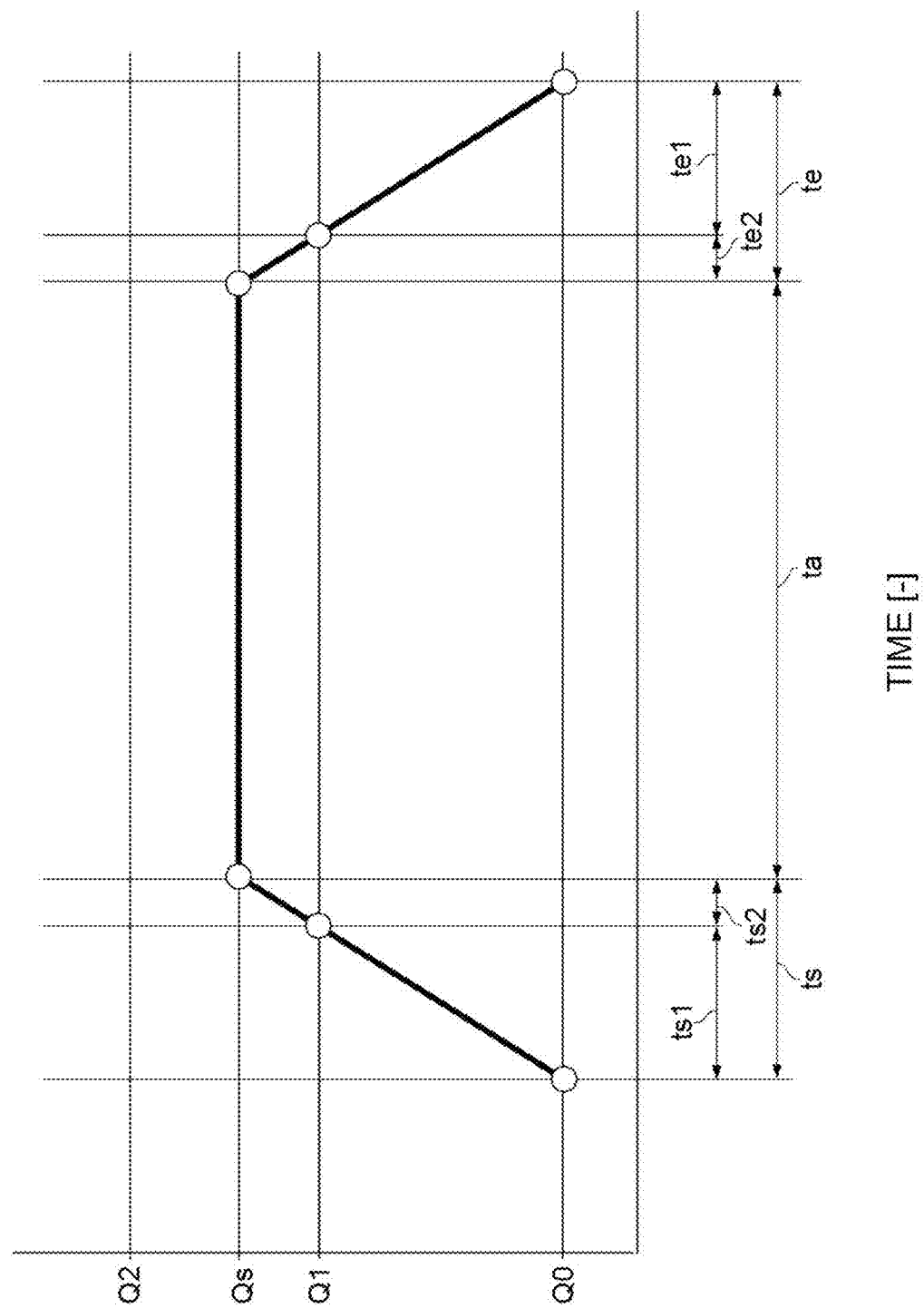
FIG. 31 is a graph schematically showing a time history of the energy received by the irradiated body.

For example, the history of the energy that the irradiated body receives per unit length (time) from the start to the end of the laser beam irradiation (hereinafter, referred to as "unit energy") is set as illustrated in FIG. 31. The energy history includes a period ta when the unit energy is maintained, a period is when the unit energy is increased, and a period to when the unit energy is decreased.

The period ta when the unit energy is maintained is when the groove 30 that is planned is formed. To exemplify the first embodiment, the period ta corresponds to a period when the first irradiation line R1, the second irradiation line R2, the third irradiation line R3, and the fourth irradiation line R4 illustrated in FIG. 12 are formed. Accordingly, the steady value Qs, which is the energy in the period ta, exceeds the cutting threshold Q1 of the protective film 13. Further, the cutting threshold Q2 of the resin frame 9 exceeds the steady value Qs.

The period ts when the unit energy is increased corresponds to the period of the pre-irradiation line RS. The period ts includes a section ts1 and a section ts2. The section ts1 is a section for increasing the unit energy from a value (Q0) smaller than the cutting threshold Q1 to the cutting threshold Q1 of the protective film 13. The section ts2 is a section for increasing the unit energy from the cutting threshold Q1 of the protective film 13 to the steady value Qs. The depth of the groove 30 formed in the period ts when the unit energy is increased gradually increases along the direction of laser beam scanning. For example, the section ts2 may correspond to the formation of the first groove end portion 32 illustrated in FIG. 5.

The period te when the unit energy is decreased corresponds to the period of the post-irradiation line RE. The period te includes a section te2 and a section te1. The section te2 is a section for decreasing the unit energy from the steady value Qs to the cutting threshold Q1 of the protective film 13. The section te1 is a section for decreasing the unit energy from the cutting threshold Q1 of the protective film 13 to the value (Q0) smaller than the cutting threshold Q1. The depth of a groove formed in the period te when the unit energy is decreased gradually decreases along the direction of laser beam scanning. For example, the section te2 may correspond to the formation of the second groove end portion 33 illustrated in FIG. 5.

The history of the unit energy illustrated in FIG. 31 can be realized by one selected from several control variables. In addition, the history of the unit energy can be realized by combining a plurality of control variables.

Examples of the control variables include the movement speed of the laser beam head, the irradiation energy of the laser beam, and the focal position of the laser beam.

FIG. 32(a) is an example of the history of the movement speed of the laser beam head for realizing the history of the unit energy of FIG. 31. In the period ts, the speed is reduced from V0 to Vs with the passage of time. In the period ta, the speed is maintained at Vs. In the period te, the speed is increased from Vs to V0 with the passage of time.

FIG. 32(b) is an example of the history of the irradiation energy of the laser beam for realizing the history of the unit energy of FIG. 31. In the period ts, the energy is increased from Q0 to Qs with the passage of time. In the period ta, the energy is maintained at Qs. In the period te, the energy is reduced from Qs to Q0 with the passage of time.

FIG. 32(c) is an example of the history of the focal position of the laser beam for realizing the history of the unit energy of FIG. 31. In the period ts, the focal position is brought closer to the surface of the irradiated body with the passage of time (P0 to Ps). In the period ta, the focal position is maintained on the surface of the irradiated body (Ps). In the period te, the focal position is moved away from the surface of the irradiated body with the passage of time (Ps to P0).

According to the above laser beam control mode, it is possible to more reliably prevent the laser beam from reaching the resin frame as well as the scintillator protective film. In other words, the scintillator protective film is cut in a reliable manner and the surface of the photodetection panel provided with the resin frame is not damaged by laser beam irradiation. Accordingly, the occurrence of a defective product is suppressed and productivity can be improved.

<Fourth Embodiment>

The problem shown in the third embodiment can also be solved by a control mode different from the control mode shown in the third embodiment. The problem described at the beginning of the third embodiment is on the premise that the initiation of the laser beam irradiation is simultaneous with the initiation of the laser beam head movement. By, for example, shifting the timing of the head movement initiation with respect to the timing of the irradiation initiation, it is possible to prevent the irradiated body from being irradiated with excessive energy.

Figure 33:
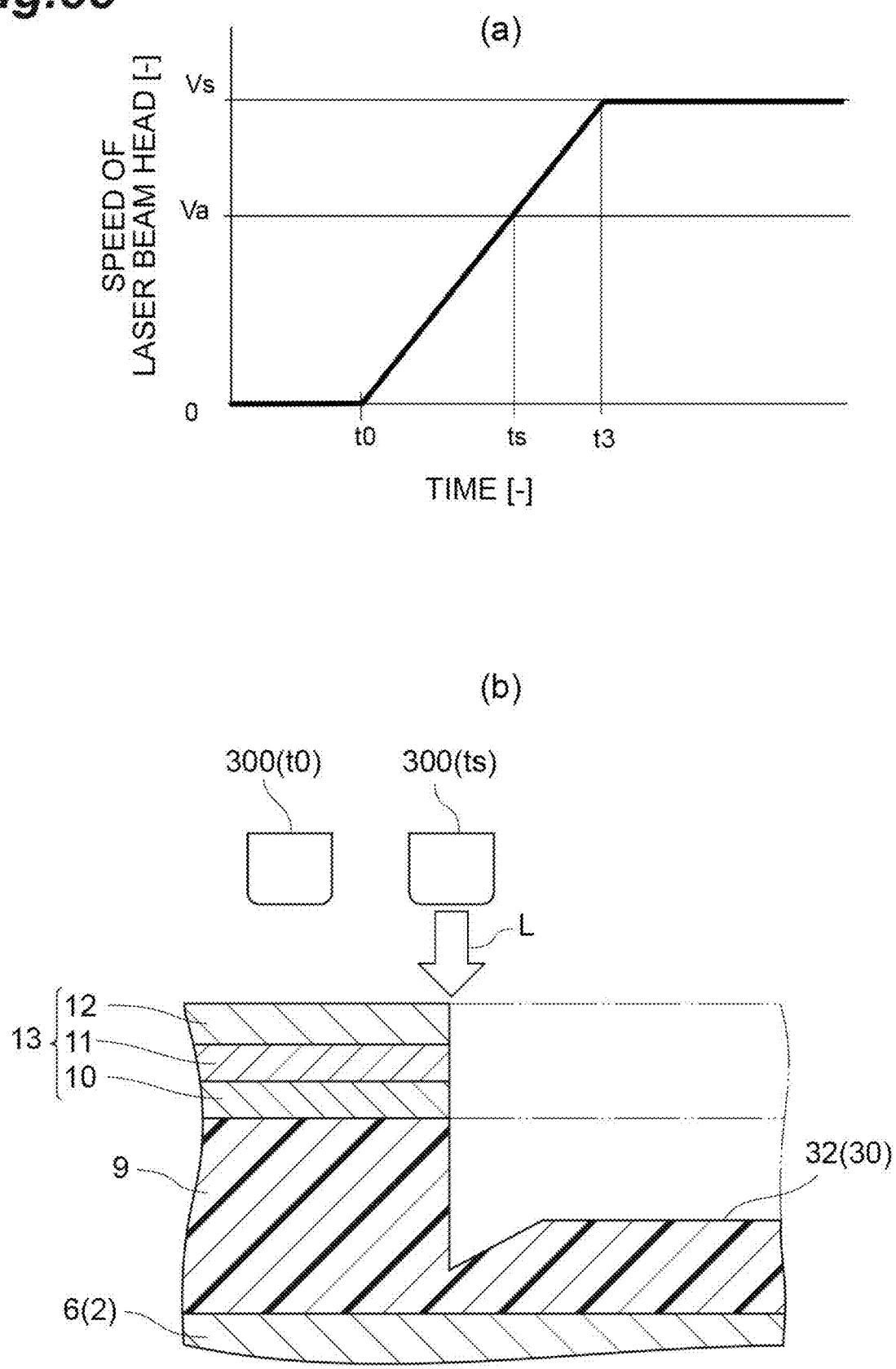
FIG. 33($a$) is a graph showing an example of the time history of the speed of the laser beam head, and FIG. 33($b$) is a diagram illustrating the positional relationship between the laser beam head and a protective film and schematically illustrating the positional relationship between the laser beam head and the resin frame.

For example, the operation at the irradiation initiation is as follows. First, the movement of the laser beam head is started (t0 in FIG. 33(a)). At this time, no laser beam irradiation is started. The speed of the laser beam head increases with the passage of time (t0 to t1). Then, the laser beam irradiation is started when the speed of the laser beam head reaches a predetermined value (Va). This predetermined value may be the steady speed (Vs). Alternatively, the value may be larger than the speed threshold (V1) that is illustrated in FIG. 30(b) and smaller than the steady speed (Vs). In other words, the timing (ts) when the laser beam irradiation is started is set to be preceded by the timing (t0) when the movement of the laser beam head is started.

In addition, when the laser beam irradiation is ended, the timing when the irradiation is stopped is set to precede the timing when the movement of the laser beam head is stopped. For example, the laser beam irradiation may be stopped when the speed of the laser beam head is the steady speed (Vs). In the period when the speed of the laser beam head is reduced, the laser beam irradiation may be stopped in a period when the speed allows irradiation with the unit energy that is below the cutting threshold Q1 of the resin frame 9. In addition, as described in the third embodiment, the energy per unit length decreases as the speed of the laser beam head increases. Accordingly, the laser beam irradiation may be stopped during an increase in laser beam head speed.

According to the above laser beam control mode, it is possible to more reliably prevent the laser beam from reaching the resin frame as well as the scintillator protective film. In other words, the scintillator protective film is cut in a reliable manner and the surface of the photodetection panel provided with the resin frame is not damaged by laser beam irradiation. Accordingly, the occurrence of a defective product is suppressed and productivity can be improved.

It should be noted that the method shown in the first embodiment may be combined only with the method shown in the third embodiment in Step S5 of cutting the protective film 13. In addition, the method shown in the first embodiment may be combined only with the method shown in the fourth embodiment. Further, the method shown in the first embodiment may be combined with the method shown in the fourth embodiment in addition to the method shown in the third embodiment.

REFERENCE SIGNS LIST 1, 1A: radiation detector, 2: substrate, 3: light receiving portion, 3a: photoelectric conversion element, 4: signal line, 5: bonding pad, 6: passivation film, 7: photoelectric conversion element array, 8: scintillator layer, 8a: scintillator, 8b: peripheral edge portion, 9: resin frame, 10: first organic film, 11: inorganic film (metal film), 12: second organic film, 13: protective film, 13a: outer edge of protective film 13, 14: coating resin, 30: groove, D1: first distance, D2: second distance, d, d1, d3: height, d2: width, E1: inner edge of resin frame 9, E2: outer edge of resin frame 9, E3: outer edge of scintillator layer 8, E4: outer edge of photoelectric conversion element array 7, M1: masking member.

The invention claimed is:

1. A radiation detector comprising:
a photodetection panel having a light receiving portion including a plurality of photoelectric conversion elements arranged one-dimensionally or two-dimensionally and a plurality of bonding pads electrically connected to the photoelectric conversion elements and disposed outside the light receiving portion;
a scintillator layer laminated on the photodetection panel so as to cover the light receiving portion and converting radiation into light;
a resin frame formed on the photodetection panel so as to pass between the scintillator layer and the bonding pad and surround the scintillator layer apart from the scintillator layer and the bonding pad when viewed in a lamination direction of the scintillator layer; and
a scintillator protective film covering the scintillator layer and having an outer edge positioned on the resin frame, wherein
a groove continuous with the outer edge of the scintillator protective film is formed in the resin frame, and
the groove has an overlapping region including a first groove end portion and a second groove end portion partially overlapping in a direction intersecting with an extension direction of the groove.

2. The radiation detector according to claim 1, further comprising a coating resin covering the outer edge of the scintillator protective film.

3. The radiation detector according to claim 2, wherein
the coating resin further covers the resin frame, and
the coating resin has a material property allowing the coating resin to stay on the resin frame such that an edge portion of a contact surface between the coating resin and the resin frame is formed on the resin frame.

4. The radiation detector according to claim 2, wherein
a middle portion of the resin frame is higher than both edge portions of the resin frame, and
a position of the groove is biased to the bonding pad side on the resin frame.

5. The radiation detector according to claim 1, wherein a width of the resin frame is 700 μm or more and 1000 μm or less.

6. The radiation detector according to claim 1, wherein a height of the resin frame is 100 μm or more and 300 μm or less.

7. The radiation detector according to claim 1, wherein
the photodetection panel has a rectangular shape,
the resin frame has four side portions surrounding the scintillator layer, and
the overlapping region is provided in any of the four side portions.

8. A radiation detector manufacturing method comprising:
a step of preparing a photodetection panel having a light receiving portion including a plurality of photoelectric conversion elements arranged one-dimensionally or two-dimensionally and a plurality of bonding pads electrically connected to the photoelectric conversion elements and disposed outside the light receiving portion and laminating a scintillator layer converting radiation into light on the photodetection panel so as to cover the light receiving portion;
a step of disposing a panel protection portion on the photodetection panel so as to surround the scintillator layer when viewed in a lamination direction of the scintillator layer;

a step of forming a scintillator protective film so as to cover an entire surface of the photodetection panel on a side where the scintillator layer is laminated and a surface of the panel protection portion;

a step of cutting the scintillator protective film by performing irradiation with a laser beam along the panel protection portion; and a step of removing an outside part of the scintillator protective film, wherein, in the step of cutting the scintillator protective film, an outer edge of the scintillator protective film is formed by the scintillator protective film being cut, a groove continuous with the outer edge of the scintillator protective film is formed in the panel protection portion, and the laser beam irradiation is performed such that the groove has an overlapping region including a first groove end portion and a second groove end portion partially overlapping in a direction intersecting with an extension direction of the groove.

9. The radiation detector manufacturing method according to claim 8, wherein the photodetection panel has a rectangular shape, the panel protection portion has four side portions surrounding the scintillator layer, and the overlapping region is provided in any of the four side portions in the step of cutting the scintillator protective film.

10. The radiation detector manufacturing method according to claim 9, wherein the step of cutting the scintillator protective film includes:

a step of setting at least one of positions of four corner portions configured by the four side portions as a reference position; and a step of irradiating each of the four side portions with the laser beam based on the reference position.

11. The radiation detector manufacturing method according to claim 8, wherein the panel protection portion is a resin frame, and in the step of disposing the panel protection portion, the resin frame is disposed on the photodetection panel so as to pass between the scintillator layer and the bonding pad and surround the scintillator layer apart from the scintillator layer and the bonding pad.

12. The radiation detector manufacturing method according to claim 11, wherein in the step of disposing the panel protection portion, the resin frame is formed such that a middle portion of the resin frame is higher than both edge portions of the resin frame, and in the step of cutting the scintillator protective film, the laser beam irradiation is performed at a position biased to the bonding pad side on the resin frame.

13. The radiation detector manufacturing method according to claim 8, wherein the panel protection portion is a masking member, in the step of disposing the panel protection portion, the masking member is disposed on the photodetection panel so as to cover a region between the scintillator layer and the bonding pad and the bonding pad, and in the step of forming the scintillator protective film, the scintillator protective film is formed on the entire surface of the photodetection panel on the side where the scintillator layer is laminated and a surface of the masking member.

14. The radiation detector manufacturing method according to claim 13, further comprising a step of removing the masking member after the step of removing the outside part of the scintillator protective film.

15. The radiation detector manufacturing method according to claim 13, further comprising a step of forming a coating resin covering the outer edge of the scintillator protective film after the step of removing the outside part of the scintillator protective film.

* * * * *